(12) United States Patent
Taylor et al.

(10) Patent No.: US 6,853,014 B2
(45) Date of Patent: Feb. 8, 2005

(54) OPTOELECTRONIC CIRCUIT EMPLOYING A HETEROJUNCTION THYRISTOR DEVICE THAT PERFORMS HIGH SPEED SAMPLING

(75) Inventors: Geoff W. Taylor, Storrs-Mansfield, CT (US); Jianhong Cai, Nashua, NH (US)

(73) Assignees: The University of Connecticut, Farmington, CT (US); Opel, Inc., West Warwick, RI (US)

( * ) Notice: Subject to any disclaimer, the term of this patent is extended or adjusted under 35 U.S.C. 154(b) by 65 days.

(21) Appl. No.: 10/323,390

(22) Filed: Dec. 19, 2002

(65) Prior Publication Data

US 2004/0079963 A1 Apr. 29, 2004

Related U.S. Application Data

(63) Continuation-in-part of application No. 10/280,892, filed on Oct. 25, 2002.

(51) Int. Cl.[7] .............................................. H01L 31/072
(52) U.S. Cl. ........................ 257/183; 257/113; 257/115; 257/463; 257/464; 372/45.1; 357/17
(58) Field of Search .......................... 372/45.1; 357/17; 257/113, 115, 463, 464

(56) References Cited

U.S. PATENT DOCUMENTS

| | | | |
|---|---|---|---|
| 3,919,656 A | 11/1975 | Sokal et al. | 330/51 |
| 4,424,525 A | 1/1984 | Mimura | 357/23 |
| 4,658,403 A | 4/1987 | Takiguchi et al. | 372/96 |
| 4,683,484 A | 7/1987 | Derkits, Jr. | 357/16 |
| 4,806,997 A * | 2/1989 | Simmons et al. | 327/512 |

(List continued on next page.)

OTHER PUBLICATIONS

*10–Gb/s High–Speed Monolithically Integrated Photoreceiver Using InGaAs p–I–n PD and Planar Doped InAlAs/InGaAs HEMT's* by Y. Akahori et al., IEEE Photonics Technology Letters, vol. 4, No. 7, Jul. 1992.

(List continued on next page.)

*Primary Examiner*—David Nelms
*Assistant Examiner*—Mai-Huong Tran
(74) *Attorney, Agent, or Firm*—Gordon & Jacobson, PC

(57) ABSTRACT

An optoelectronic circuit employing a heterojunction thyristor device that is configured as an optically-controlled (or electrically-controlled) sampling/switching device. First and second channel regions are disposed between the anode terminal and the cathode terminal of the device, and an electrical input terminal and an electrical output terminal are coupled to opposite ends of the first channel region. At least one control signal is supplied to the device. When the control signal corresponds to a predetermined ON condition, sufficient charge is stored in the second channel region to cause the heterojunction thyristor device to operate in an ON state whereby current flows between the anode terminal and the cathode terminal and the electrical input terminal is electrically coupled to the electrical output terminal. When the control signal corresponds to a predetermined OFF condition, the heterojunction thyristor device operates in an OFF state whereby current does not flow between the anode terminal and the cathode terminal and the electrical input terminal is electrically isolated from the electrical output terminal. The control signal can be an optical sampling clock, a digital optical signal encoding bits of information, the combination of a digital optical signal and an optical sampling clock (which defines sampling periods that overlap the bits of information in the digital optical signal), or an electrical sampling clock.

24 Claims, 40 Drawing Sheets

U.S. PATENT DOCUMENTS

| | | | |
|---|---|---|---|
| 4,814,774 A | 3/1989 | Herczfeld | 342/372 |
| 4,827,320 A | 5/1989 | Morkoc et al. | 357/22 |
| 4,829,272 A | 5/1989 | Kameya | 333/139 |
| 4,899,200 A | 2/1990 | Shur et al. | 357/30 |
| 4,949,350 A | 8/1990 | Jewell et al. | 372/45 |
| 5,010,374 A | 4/1991 | Cooke et al. | 357/16 |
| 5,105,248 A | 4/1992 | Burke et al. | 357/24 |
| 5,202,896 A | 4/1993 | Taylor | 372/50 |
| 5,204,871 A * | 4/1993 | Larkins | 372/45 |
| 5,337,328 A | 8/1994 | Lang et al. | 372/45 |
| 5,386,128 A | 1/1995 | Fossum et al. | 257/183.1 |
| 5,422,501 A | 6/1995 | Bayraktaroglu | 257/195 |
| 5,436,759 A | 7/1995 | Dijaili et al. | 359/333 |
| 5,652,439 A * | 7/1997 | Kuijk et al. | 257/113 |
| 5,698,900 A | 12/1997 | Bozada et al. | 257/744 |
| 6,031,243 A | 2/2000 | Taylor | 257/13 |
| 6,043,519 A | 3/2000 | Shealy et al. | 257/195 |
| 2002/0067877 A1 | 6/2002 | Braun et al. | |

OTHER PUBLICATIONS

*10–Gbit/s InP–Based High–Performance Monolithic Photoreceivers Consisting of p–i–n Photodiodes and HEMT's* by Kiyoto Takahata et al., IEICE Trans. Electron., vol. E83–C, No. 6, Jun. 2000.

*10 Ghz Bandwidth Monolithic p–i–n Modulation–Doped Field Effect Transistor Photoreceiver* by N.K. Dutta et al., Appl. Phys. Lett., vol. 63, No. 15, Oct. 11, 1993.

*20 Gbit/s Long Wavelength Monolithic Integrated Photoreceiver Grown on GaAs* by V. Hurm et al., Electronic Letters, vol. 33, No. 7, Mar. 27, 1997.

*Heterojunction Field–Effect Transistor (HFET)* by G.W. Taylor et al., Electronics Letters, vol. 22, No. 15, pp. 784–786, Jul. 17, 1986.

*High Temperature Annealing of Modulation Doped GaAs/ AlGaAs Heterostructures for FET Applications* by H. Lee et al., 1983 IEEE/Cornell Conf. On High–Speed Semiconductor Devices & Ckts, 8/83.

*Monolithic Integrated Optoelectronic Circuits* by M. Berroth et al., 0–7803–2442–0–8/95 IEEE, 1995.

*Physical Layer Solution for Very Short Reach Applications Utilizing Parallel Optics* by Steve Ahart, Agilent Technologies, ONIDS 2002.

*Parallel Optics: the Solution for High–Speed Interconnects* downloaded from www.paralleloptics.org, Dec. 2000, updated Apr., May., Jul., Sep., Nov. 2001 and Jan., Apr. and Jul. 2002.

*Submicrometre Gate Length Scaling of Inversion Channel Heterojunction Field Effect Transistor* by P.A. Kiely et al., Electronics Letters., vol. 30, No. 6, Mar. 17, 1994.

*Theoretical and Experimental Results for the Inversion Channel Heterostructure Field Effect Transistor* by G.W. Taylor et al., IEE Proceedings–G, vol. 140, No. 6, Dec. 1993.

* cited by examiner

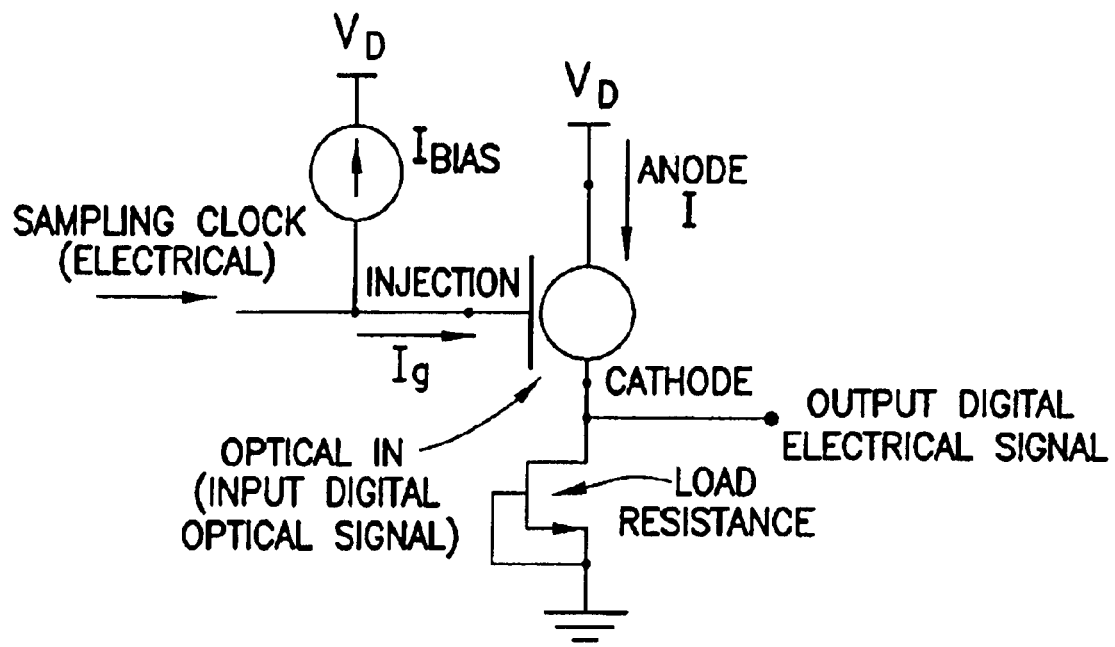
FIG.2B1
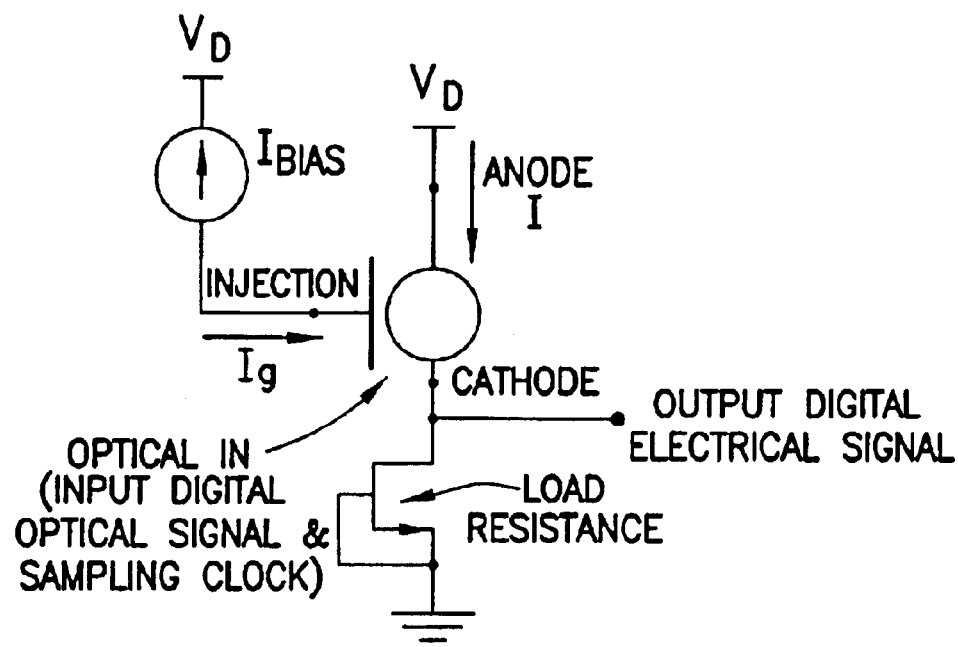
FIG.2B2

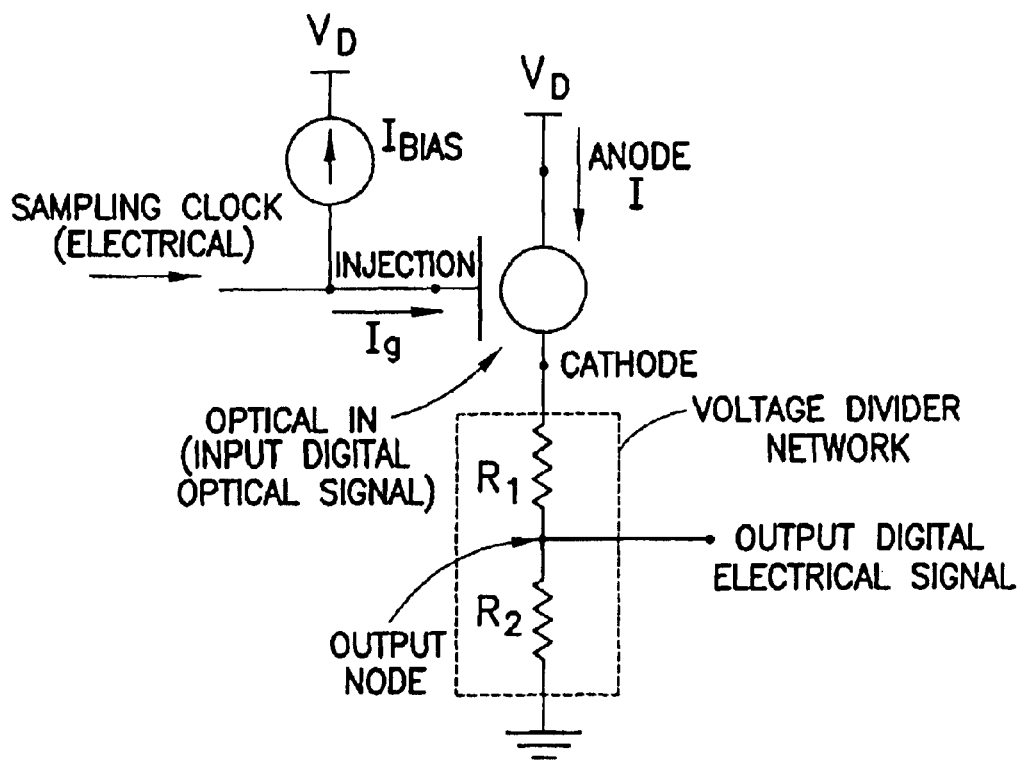
FIG.2B3
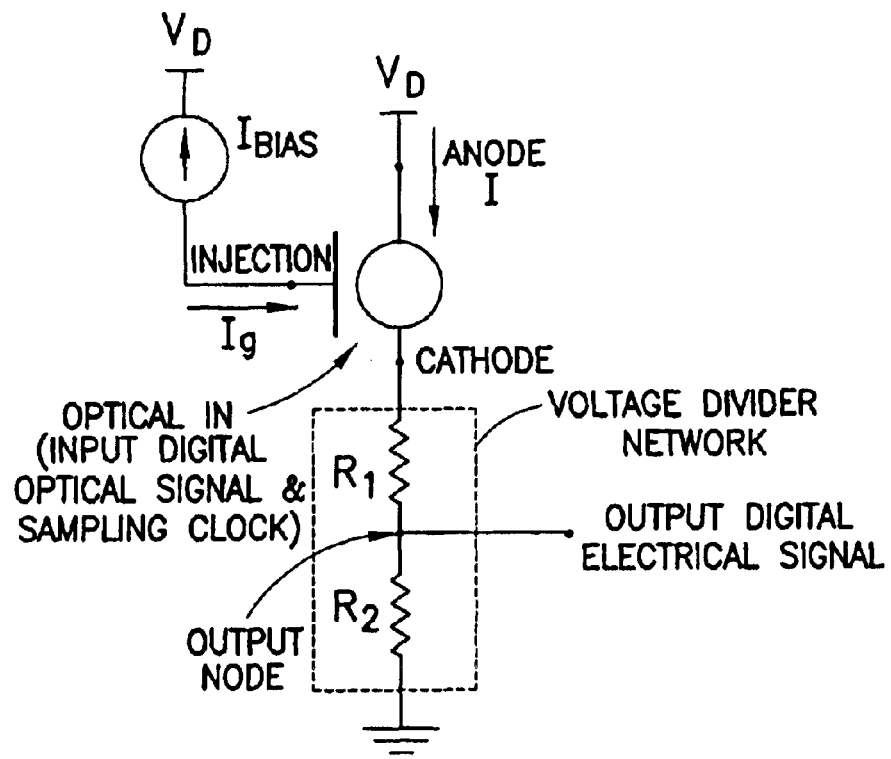
FIG.2B4

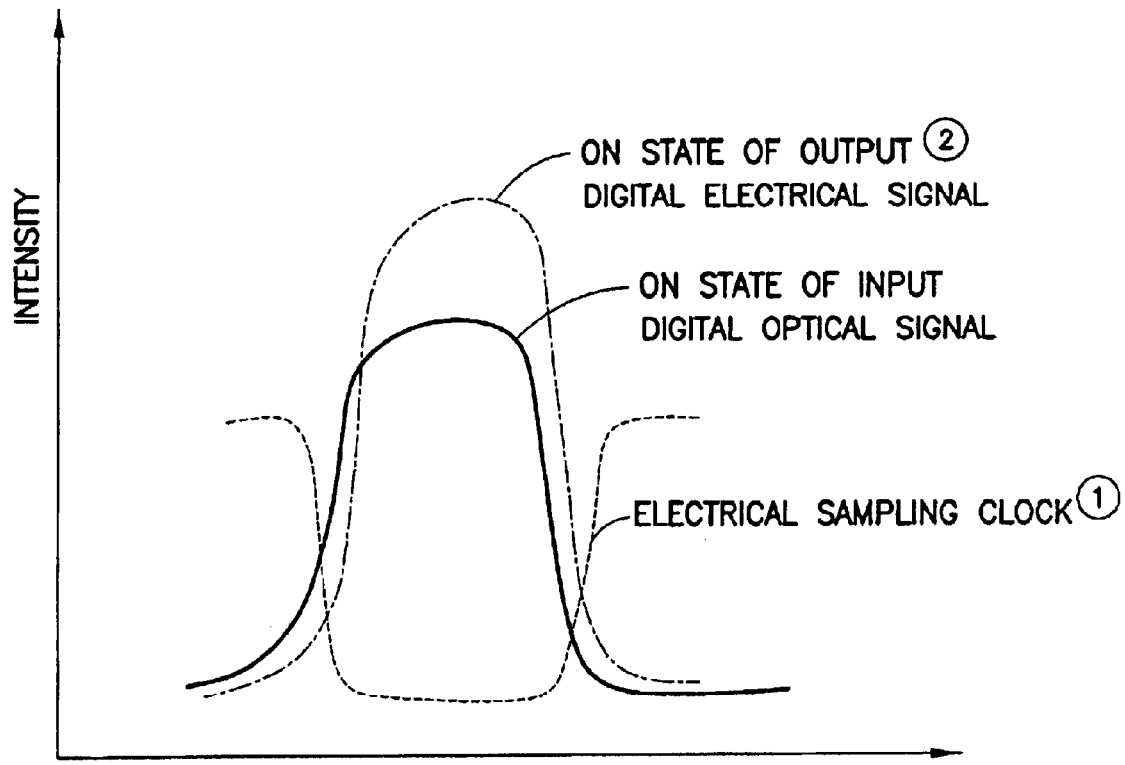
① ELECTRICAL SAMPLING CLOCK DEFINES A SAMPLING PERIOD THAT OVERLAPS THE ON PULSE OF THE INPUT DIGITAL OPTICAL SIGNAL
② OUTPUT DIGITAL ELECTRICAL SIGNAL IS PRODUCED AT THE CATHODE TERMINAL OF THE DEVICE
FIG.2D1

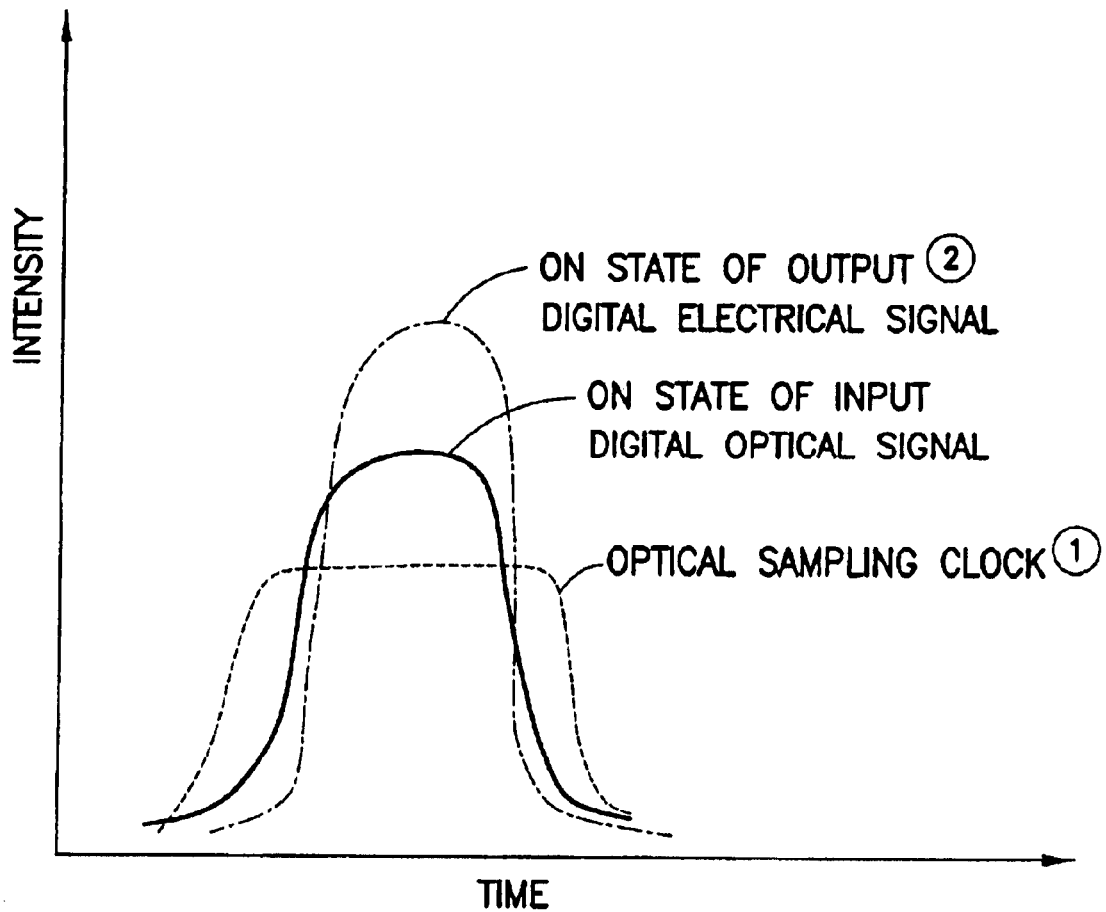
① OPTICAL SAMPLING CLOCK DEFINES A SAMPLING PERIOD THAT OVERLAPS THE ON PULSE OF THE INPUT DIGITAL OPTICAL SIGNAL
② OUTPUT DIGITAL ELECTRICAL SIGNAL IS PRODUCED AT THE CATHODE TERMINAL OF THE DEVICE
FIG.2D2

| | MATERIAL | DOPE TYPE | TYPICAL DOPE LEVEL | TYPICAL LAYER THICKNESS(Å) | LAYER IDENTIFIER |
|---|---|---|---|---|---|
| 30 { | InGaAs | P+ | 1E20 | 25 | 165b |
| | GaAs | P+ | 1E20 | 75 | 165a |
| 28 { | Al(.7)Ga(.3)As | P | 1E17 | 700 | 164b |
| | Al(.7)Ga(.3)As | P+ | 1E19 | 10 | 164a |
| | Al(.15)Ga(.85)As | P+ | 3.5E18 | 25 | 163d |
| 26 { | Al(.15)Ga(.85)As | UD | | 300 | 163c |
| | Al(.15)Ga(.85)As | N+ | 3.5E18 | 80 | 163b |
| | Al(.15)Ga(.85)As | UD | | 30 | 163a |
| | GaAs | UD | | 15 | 162 |
| 24 { | In(.20)Ga(.80)AsN QW/GaAs QW } x3 | UD | | 60 | 161 |
| | GaAs BARRIER | UD | | 100 | 160b |
| | GaAs | UD | | 150 | 160a |
| 22 { | Al(.15)Ga(.85)As | UD | | 5000 | 159 |
| | GaAs BARRIER | UD | | 100 | 158 |
| | In(.20)Ga(.80)AsN QW/GaAs QW } x3 | UD | | 60 | 157 |
| 20 { | GaAs | UD | | 15 | 156 |
| | Al(.15)Ga(.85)As | UD | | 30 | 155d |
| | Al(.15)Ga(.85)As | P+ | 3.5E18 | 80 | 155c |
| 18 { | Al(.15)Ga(.85)As | UD | | 300 | 155b |
| 16 { | Al(.15)Ga(.85)As | N | 3.5E18 | 80 | 155a |
| | Al(.7)Ga(.3)As | N | 1E17 | 700 | 154 |
| 14 { | GaAs | N+ | 3.5E18 | 2200 | 153 |
| | AlAs | UD | | 1701 | 151 |
| 12 { | GaAs } x7 | UD | | 696 | 152 |
| | AlAs | UD | | 1701 | 151 |
| 10 { | GaAs SUBSTRATE | SI | | | 149 |

FIG.3A

| LAYER MATERIAL | LAYER DOPING TYPE | TYPICAL DOPING CONCENTRATION (atoms/cm$^{-3}$) | TYPICAL LAYER THICKNESS(Å) | LAYER# | |
|---|---|---|---|---|---|
| InGaAs | P+ | 1E20 | 25 | 165b | } 30 |
| GaAs | P+ | 1E20 | 75 | 165a | |
| GaAs | P | 1-5E17 | 300 | 164 | } 28 |
| AlAs | P+ | 3.5E18 | >20,<300 | 168b | |
| GaAs | und | und | >6,<20 | 168a | } 26 |
| Al.15Ga.85As | und | und | 200-300 | 163c | |
| Al.15Ga.85As | N+ | 3.5E18 | 80 | 163b | |
| Al.15Ga.85As | und | und | 20-30 | 163a | |
| GaAs | und | und | 15 | 162 | |
| In.15Ga.85AsN | und | und | 60 | 161 | } 24 |
| GaAs | und | und | 100 | 160b | |
| GaAs | und | und | 100-250 | 160a | |
| Al.15Ga.85As | und | und | 5000 | 159 | } 22 |
| GaAs | und | und | 250-500 | 167 | |
| GaAs | und | und | 100 | 158 | |
| In.15Ga.85AsN | und | und | 60 | 157 | |
| GaAs | und | und | 15 | 156 | } 20 |
| Al.15Ga.85As | und | und | 30 | 155d | |
| Al.15Ga.85As | P+ | 3.5E18 | 80 | 155c | |
| Al.15Ga.85As | und | und | 200-300 | 155b | } 18 |
| GaAs | und | und | >6,<20 | 166b | |
| AlAs | N+ | 3.5E18 | >30,<200 | 166a | } 16 |
| GaAs | N+ | 3.5E18 | 1000-2000 | 153 | } 14 |
| AlAs | und | und | 1701 | 151 | |
| GaAs | und | und | 696 | 152 | } 12 |
| AlAs | und | und | 1701 | 151 | |
| GaAs SUBSTRATE | | SI | | 149 | } 10 |

FIG.3D

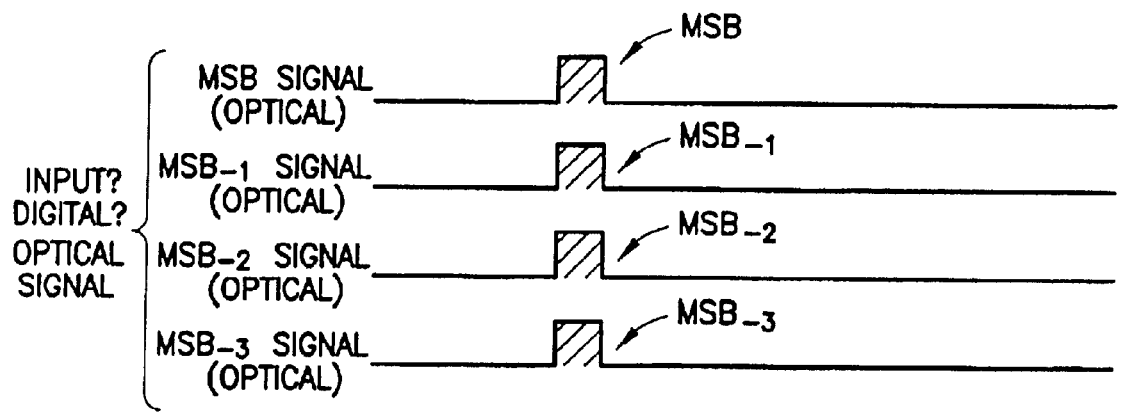
FIG.4B(i)
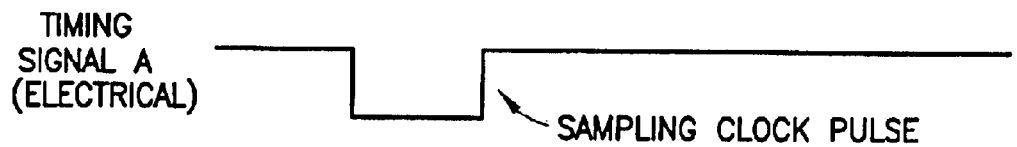
FIG.4B(ii)
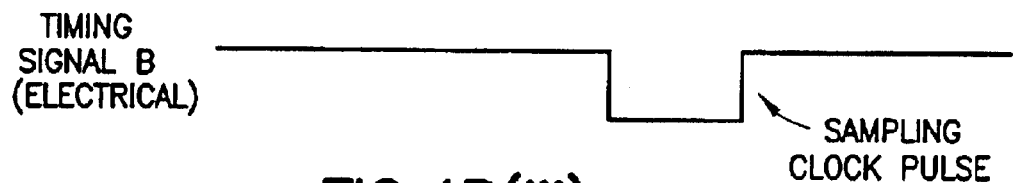
FIG.4B(iii)

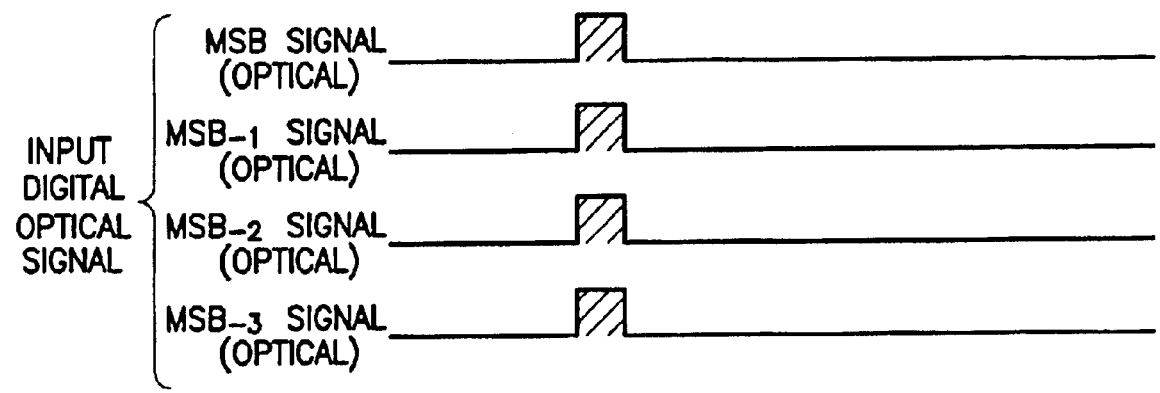
FIG.5B(i)
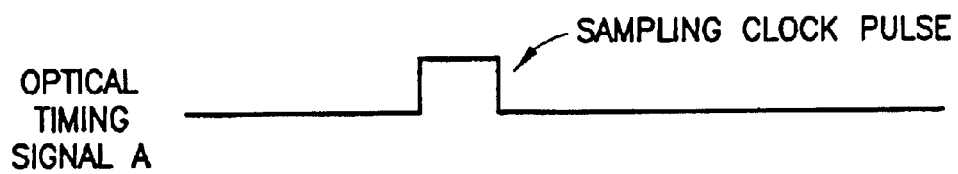
FIG.5B(ii)
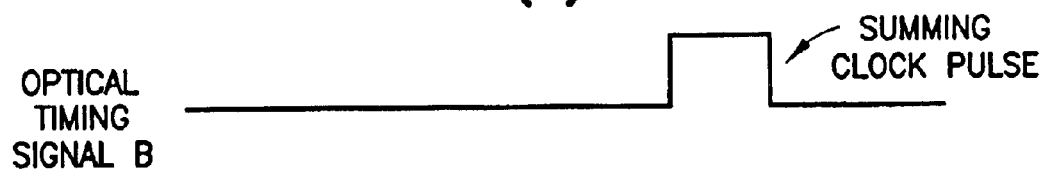
FIG.5B(iii)

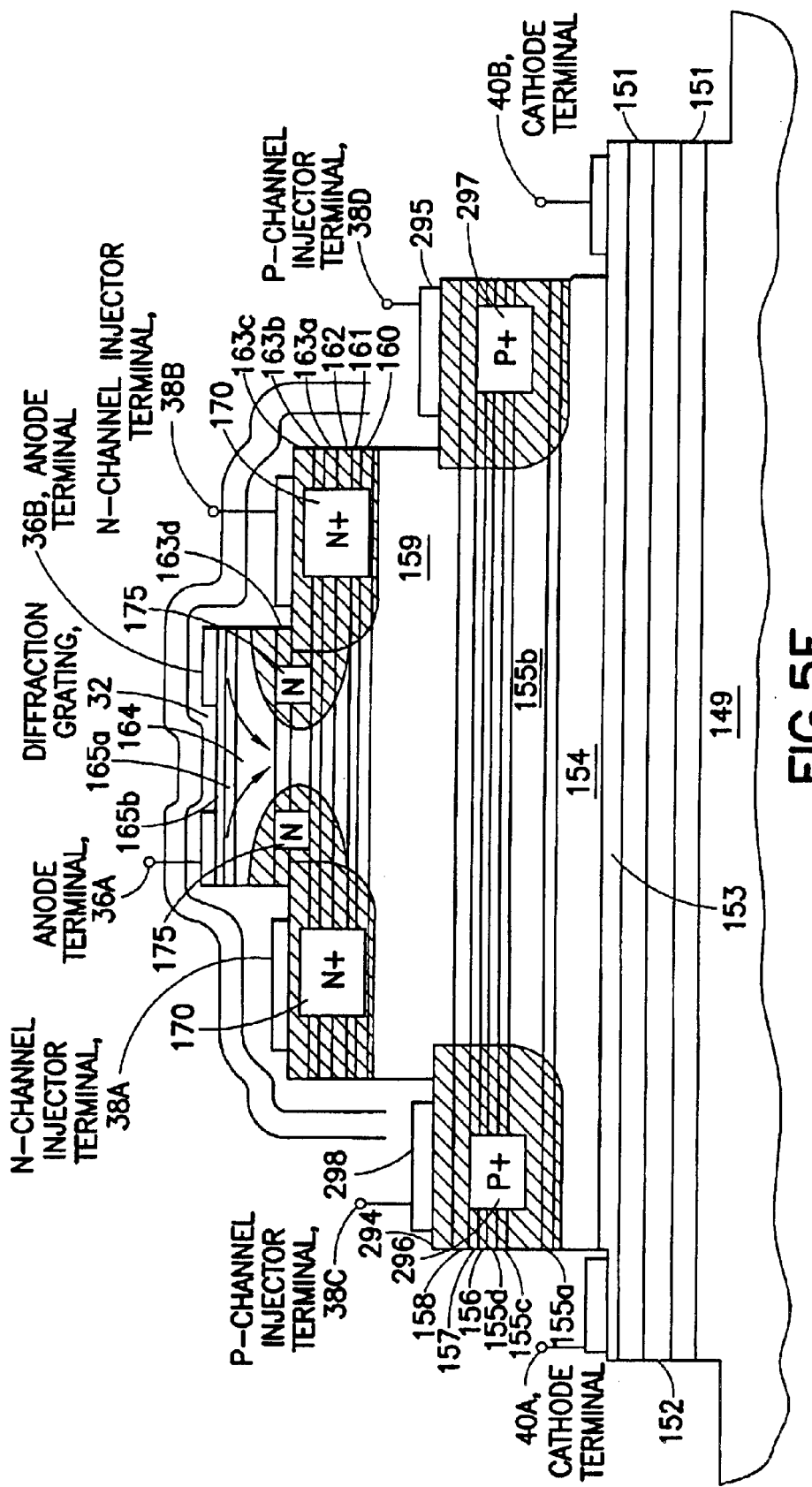

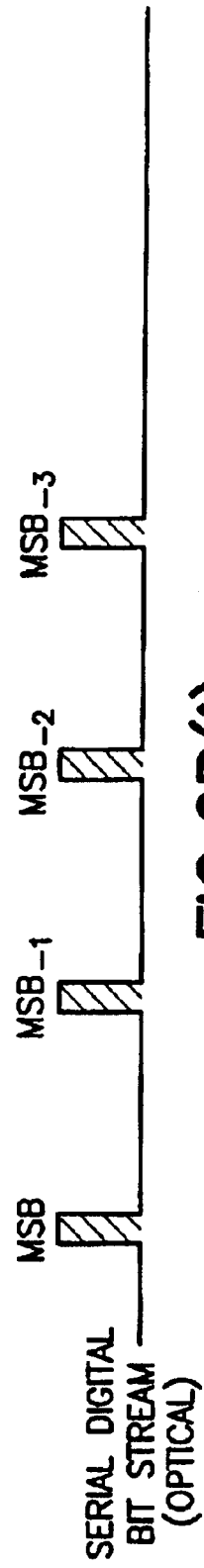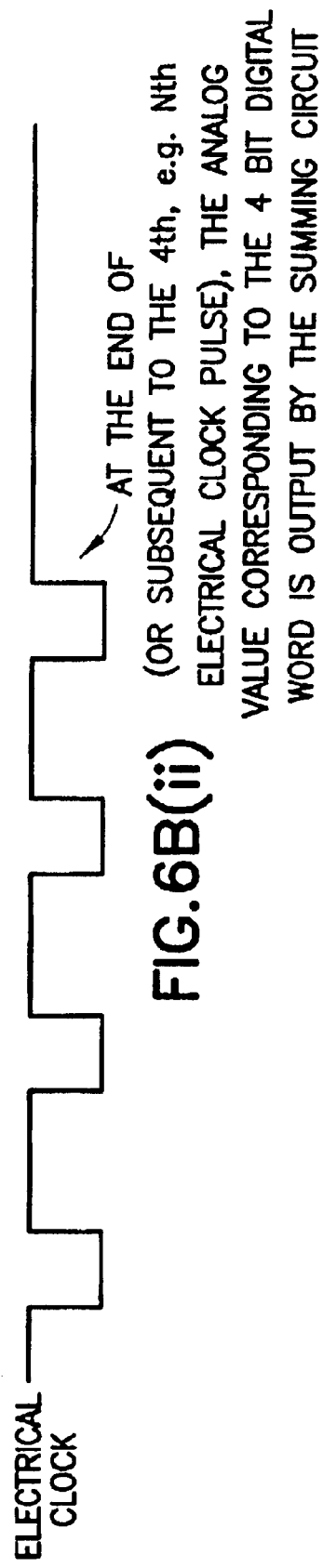

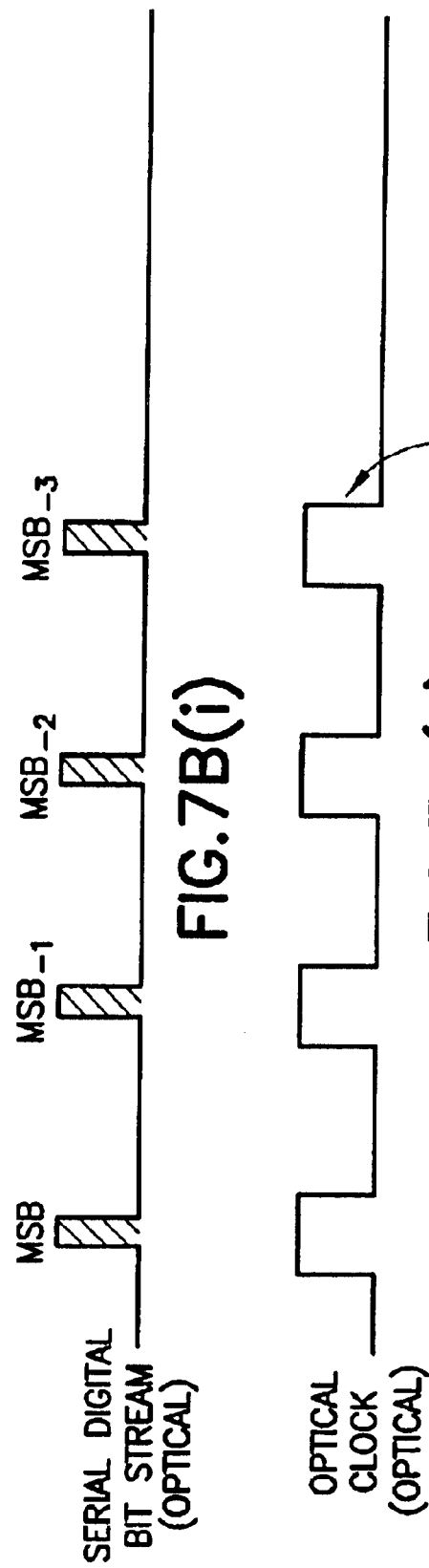

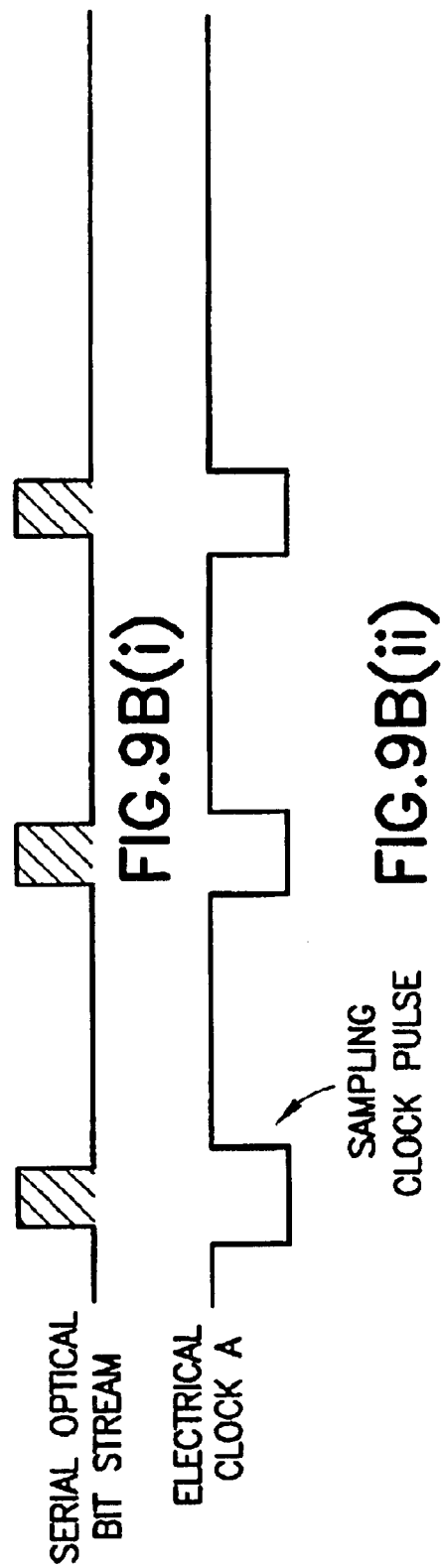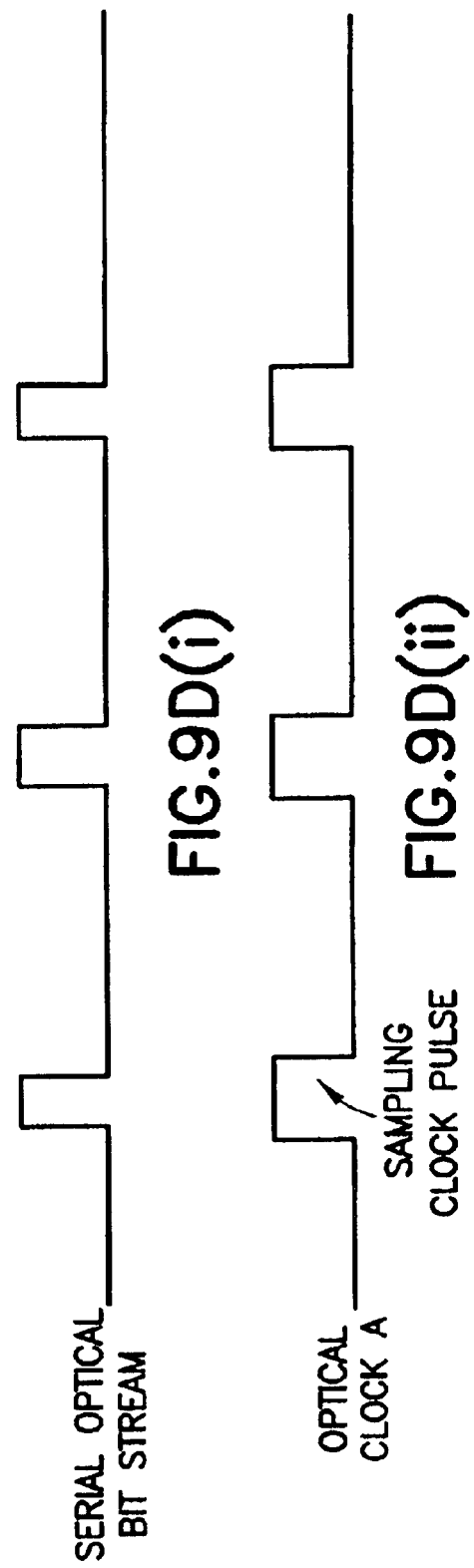

OPTOELECTRONIC CIRCUIT EMPLOYING A HETEROJUNCTION THYRISTOR DEVICE THAT PERFORMS HIGH SPEED SAMPLING

CROSS-REFERENCE TO RELATED APPLICATION

This application is a continuation-in-part of U.S. application Ser. No. 10/280,892, filed Oct. 25, 2002, entitled "Optoelectronic Device Employing At Least One Semiconductor Heterojunction Thyristor For Producing Variable Electrical/Optical Delay," commonly assigned to assignee of the present invention, and herein incorporated by reference in its entirety.

BACKGROUND OF THE INVENTION

1. Field of the Invention

This invention relates broadly to the field of optoelectronics devices, and, more particularly to optoelectronic circuits that convert optical signals into electrical signals and/or perform high speed signal sampling operations.

2. State of the Art

Optical networks provide the advantages of increased speed and transmission capacity for carrying voice and data. In optical networks, optical signals (e.g., light waves) are used to carry the information over the network. This information is provided by a source typically in electrical form and converted into an optical signal for transmission over the network.

In order to carry voice, the sound waves of the spoken voice are typically converted into an analog electrical signal which is converted into a digital electrical signal consisting of bits of information, wherein each bit is either a logic level '1' (the amplitude of the digital electrical signal is high/ON) or logic level '0' (the amplitude of the digital electrical signal is low/OFF). Data is typically stored in digital form as bits of information, and thus analog-to-digital conversion is not necessary.

Once the digital electrical signal has been obtained, it is converted to a digital optical signal by an electrical-to-optical converter, which modulates a laser light source in response to the digital electrical signal. The digital optical signal consists of bits of information, wherein each bit is either a logic level '1' (the light intensity level of the digital optical signal is high/ON) or a logic level '0' (the light intensity level of the digital optical signal is low/OFF). The digital optical signal is then transmitted over a medium (such as a light guide optical fiber).

An optical-to-electrical converter receives the digital optical signal produced by the laser source and transmitted over the medium, and generates a digital electrical signal corresponding to the digital optical signal. The digital electrical signal may be converted back to a digital optical signal for transmission over the optical network (such as the case where the optical-to-electrical converter is part of switch/router that operates in the electric domain on digital electrical signals). Alternatively, the digital electrical signal may be converted to an analog electrical signal (such as the case for voice applications where the analog electrical signal is converted back into sound waves that can be interpreted by the person receiving the phone call). Moreover, the digital electrical signal may be transformed for communication over a data communication link (such as the case for data applications where the digital electrical signal is transformed (e.g. packetized) for communication over a data communication link, such as a Gigabit Ethernet link).

FIG. 1A is a prior art functional block diagram illustrating a typical optical-to-electrical converter including a photodetector 110 (which may be one or more avalanche photodiodes or one or more PIN photodiodes) that converts the light level of the received digital optical signal to a signal current. The photodetector 110 delivers the extracted current to a transimpedance amplifier (TIA) 111, which first converts the current to a voltage. This single-ended voltage is amplified by the TIA and typically converted to a differential signal. A post amplifier 112 is provided, which in most cases is configured as a limiting amplifier that delivers a certain output-voltage swing whose maximum is independent of the input signal strength. A data recovery circuit 113 performs amplitude-level analysis on the signal output by post amplifier 112 to recover the serial digital data signal (in electrical form) from the received optical signal. Demultiplexing circuit 114 performs a serial-to-parallel conversion on the serial digital data stream generated by the data recovery circuit 113 to generate a multi-bit digital signal (electrical) representing a sequence of bits in the received digital optical signal.

The mechanism of FIG. 1A that converts the digital optical signal to a digital electrical signal (the photodetector 110, TIA 111, post amplifier 112 and data recovery circuit 113) is costly to design and manufacture because of the complex nature of the TIA 111, post amplifier 112 and data recovery circuit 113, and because of difficulties in integrating one or more of these components with the photodetector 110.

Thus, there is a great need in the art for an optoelectronic circuit that converts a digital optical signal to a digital electrical signal in a manner that has lower cost and improved ease of integration, and that is suitable for high speed applications.

The limitations of FIG. 1A are also present in parallel optical data links that have been developed to provide for increased aggregate data rates. As shown in prior art FIG. 1B, a parallel optical data link consists of a transmit module 120 coupled to a receive module 122 with a multi-fiber connector 124. The transmit module typically employs an array 126 of vertical-cavity-surface-emitting lasers (VCSELs) and a multi-channel laser driver integrated circuit 128 for driving the array of lasers to produced a plurality of synchronous optical bit streams that are transmitted over the multi-fiber connector 124. The receive module 122 includes a photodetector array 130 (typically realized with P-I-N diodes) that receives the synchronous optical bit streams and cooperate with an integrated circuit 132 that provides a corresponding array of low noise transimpedance amplifiers, limiting amplifiers, and data recovery circuits to produce a plurality of electrical bit streams corresponding thereto. The plurality of electrical bit streams are provided to one or more integrated circuits 134 that map parallel bits encoded in the plurality of electrical bit streams into a predetermined data format (such as a SONET frame). Although such a parallel optical data link provides cost savings based upon array-integration of electronic and optoelectronic components in both the transmit module and the receive module, it suffers from the same limitations of the approach of FIG. 1A. The complex nature of the TIA, post amplifier and data recovery circuit in the receive module 122 leads to increased design costs and manufacture costs of the receive module 122, and also leads to difficulties in integrating one or more of these components with the photodetector array as part of the receive module 122.

Thus, there is a great need in the art for an optoelectronic circuit that converts a plurality of synchronous optical bit streams to electrical bit streams in a manner that has lower cost and improved ease of integration, and that is suitable for use in high speed applications (such as the receive module of a parallel optical data link).

For high frequency applications, optoelectronic integrated circuits that convert an optical signal to an electric signal have been reported. For example, Dutta et al., "10 GHz bandwidth monolithic p-i-n modulation-doped field effect transistor photoreceiver," Appl. Phys. Lett., Vol. 63, No. 15, October 1993, pp. 2115–2116, describes the use an InGaAs PIN photodiode for the conversion of incident photons to electrons followed by an amplifier circuit based on a modulation-doped field effect transistor. And Akahori et al., "10-GB/s High-Speed Monolithically Integrated Photoreceiver Using InGaAs p-i-n PD and Planar Doped InAlAs/ InGaAs HEMT's," IEEE Photonics Technology Letters, Vol. 4, No. 7, July 1992, pp. 754–756 describes the use of an InGaAs PIN photodiode for the conversion of incident photons to electrons followed by an amplifier circuit based on planar doped InAlAs/InGaAs HEMT devices. And Hurm. et. al., "20 Gbit/s long wavelength monolithic integrated photoreceiver grown on GaAs," Electronics Letters, Vol. 33, No. 7, 1997, pp. 624–626, describes the use an MSM photodiode for the conversion of incident photons to electrons followed by an amplifier circuit based on an AlGaAs/ GaAs HEMT transistor. However, these prior art mechanisms require substantially different epitaxial growth structures to realize the components of the optoelectronic integrated circuit, and thus are costly to design and manufacture.

As described above, digital optical signals may be used to carry analog information (such as voice). In such applications, it is necessary that the optical bits encoded in the digital optical signal be converted into an analog electrical signal for subsequent processing. Prior art FIG. 1C is a functional block diagram illustrating a typical mechanism for performing such conversion operations. Similar to FIG. 1A, a photodetector 110 converts the light level of the received digital optical signal to a signal current. The photodetector 110 delivers the extracted current to a transimpedance amplifier (TIA) 111, which first converts the current to a voltage. This single-ended voltage is amplified by the TIA and typically converted to a differential signal. A post amplifier 112 is provided, which in most cases is configured as a limiting amplifier that delivers a certain output-voltage swing whose maximum is independent of the input signal strength. A data recovery circuit 113 performs amplitude-level analysis on the signal output by post amplifier 112 to recover the serial digital data signal (in electrical form) from the received optical signal. Demultiplexing circuit 114 performs a serial-to-parallel conversion on the serial digital data stream generated by the data recovery circuit 113 to generate a multi-bit digital signal (electrical) representing a sequence of bits in the received digital optical signal. The multi-bit digital signal produced by the demultiplexing circuit 114 is provided to a digital-to-analog converter 115 that converts the multi-bit digital signal to a corresponding analog electrical signal. This approach suffers from the same limitations of the approach of FIG. 1A, wherein the complex nature of the TIA, post amplifier and data recovery circuit leads to increased design costs and manufacture costs. In addition, the large number of complex components that make up the signal processing chain (from photodetector 110 to the digital-to-analog converter 115) are costly to design and manufacture.

Thus, there is a great need in the art for an optoelectronic circuit that converts a digital optical signal to an analog electrical signal in a manner that has lower cost and improved ease of integration, and that is suitable for high speed applications.

Similarly, a parallel optical data link may be used to carry analog information (such as voice). In such applications, it is necessary that the optical bits encoded in the digital optical signals be converted into an analog electrical signal for subsequent processing. This approach suffers from the same limitations of the approach of FIGS. 1A and 1B, wherein the complex nature of the TIA, post amplifier and data recovery circuit leads to increased design costs and manufacture costs. In addition, the large number of complex components that make up the signal processing chain (from photodetector to the digital-to-analog converter) are costly to design and manufacture.

Thus, there is a great need in the art for an optoelectronic circuit that converts parallel optical bit streams to an analog electrical signal in a manner that has lower cost and improved ease of integration and that is suitable for high speed applications.

In addition, digital-to-analog converters (and other signal processing circuitry such as analog-to-digital converters, switched-capacitance filters/amplifiers, and switched-capacitance waveform generators) typically employ electrically-controlled transistors as on-off switches to perform signal sampling operations. Due to parasitic capacitance and intrinsic capacitances between the input and output nodes of the sampling transistor, feedthrough charge that collects on the sampled signal increases to an intolerable level at high frequencies. Therefore, the electronic sampling technique becomes limited in sensitivity at high sampling rates.

Thus, there is a great need in the art for improved signal sampling mechanisms that are suitable for high sampling rates and avoid the limitations (including feedthrough charge) of the prior art transistor-based sampling mechanisms.

SUMMARY OF THE INVENTION

It is therefore an object of the invention to provide an improved optoelectronic circuit that converts a digital optical signal to a digital electrical signal in a manner that avoids the limitations of the prior art.

It is another object of the invention to provide an improved optoelectronic circuit that converts a digital optical signal to a digital electrical signal in a manner that has lower cost and improved ease of integration.

It is another object of the invention to provide an improved optoelectronic circuit that converts a digital optical signal to a digital electrical signal in a manner that is suitable for high speed applications.

It is another object of the invention to provide an improved optoelectronic circuit that converts a digital optical signal to a digital electrical signal in a manner that affords ease of integration with a broad range of devices (such as FET transistors, bipolar transistors, lasers, optical modulators, and waveguide devices).

It is a further object of the invention to provide an improved optoelectronic circuit that utilizes a heterojunction thyristor device that is adapted to receive a digital optical signal and convert the digital optical signal to a digital electrical signal.

It is an additional object of the invention to provide a plurality of such optoelectronic circuits to convert a plurality of synchronous optical bit streams to electrical bit streams in a manner that is suitable for high speed applications, such as in the receive module of a parallel optical data link.

It is an additional object of the invention to provide an improved optoelectronic circuit that converts a parallel digital optical signal (that synchronously encodes a plurality of bits of information) to an analog electrical signal in a manner that avoids the limitations of the prior art.

It is another object of the invention to provide an improved optoelectronic circuit that converts a parallel digital optical signal to an analog electrical signal in a manner that has lower cost and improved ease of integration.

It is another object of the invention to provide an improved optoelectronic circuit that converts a parallel digital optical signal to an analog electrical signal in a manner that is suitable for high speed applications.

It is another object of the invention to provide an improved optoelectronic circuit that converts a parallel digital optical signal to an analog electrical signal in a manner that affords ease of integration with a broad range of devices (such as FET transistors, bipolar transistors, lasers, optical modulators, and waveguide devices).

It is a further object of the invention to provide an improved optoelectronic circuit that utilizes a plurality of heterojunction thyristor devices to convert a parallel digital optical signal to an analog electrical signal.

It is an additional object of the invention to provide an improved optoelectronic circuit that converts a serial digital optical signal (that serially encodes a plurality of bits of information) to an analog electrical signal in a manner that avoids the limitations of the prior art.

It is another object of the invention to provide an improved optoelectronic circuit that converts a serial digital optical signal to an analog electrical signal in a manner that has lower cost and improved ease of integration.

It is another object of the invention to provide an improved optoelectronic circuit that converts a serial digital optical signal to an analog electrical signal in a manner that is suitable for high speed applications.

It is another object of the invention to provide an improved optoelectronic circuit that converts a serial digital optical signal to an analog electrical signal in a manner that affords ease of integration with a broad range of devices (such as FET transistors, bipolar transistors, lasers, optical modulators, and waveguide devices).

It is a further object of the invention to provide an improved optoelectronic circuit that utilizes at least one heterojunction thyristor device to convert a serial digital optical signal to an analog electrical signal.

It is an additional object of the invention to provide an improved optoelectronic circuit that provides optically-controlled (or electrically-controlled) signal sampling in a manner that avoids the limitations of the prior art.

It is another object of the invention to provide an improved optoelectronic circuit that provides optically-controlled (or electrically-controlled) signal sampling in a manner that has lower cost and improved ease of integration.

It is another object of the invention to provide an improved optoelectronic circuit that provides optically-controlled (or electrically-controlled) signal sampling in a manner that is suitable for high speed applications.

It is another object of the invention to provide an improved optoelectronic circuit that provides optically-controlled (or electrically-controlled) signal sampling in a manner that affords ease of integration with a broad range of devices (such as FET transistors, bipolar transistors, lasers, optical modulators, and waveguide devices).

It is a further object of the invention to provide an improved optoelectronic circuit that utilizes a heterojunction thyristor device to perform optically-controlled (or electrically-controlled) signal sampling.

In accordance with the objects of present invention, a heterojunction thyristor device is configured to convert an input digital optical signal to an output digital electrical signal. The input digital optical signal encodes bits of information (each bit representing an OFF logic level or ON logic level) and is part of the Optical IN signal that is resonantly absorbed by the device. A sampling clock defines sampling periods that overlap the bits (e.g., ON/OFF pulse durations) in the input digital optical signal. The sampling clock can be in the form of electrical pulses supplied to the n-channel injector terminal(s) and/or p-channel injector terminals of the heterojunction thyristor device. Alternatively, the sampling clock can be in the form of optical pulses that are part of the Optical IN signal that is resonantly absorbed by the device. The heterojunction thyristor device operates in an OFF state and an ON state. In the OFF state, current does not flow between an anode terminal and a cathode terminal of the device; while in the ON state, current flows between the anode terminal and the cathode terminal. To provide optical-to-electrical conversion of the digital bit stream, the heterojunction thyristor device switches from its OFF state to its ON state in the event that, during a given sampling period, the light intensity level of the input digital optical signal corresponds to the ON logic level; however, it does not switch into the ON state (and remains in the OFF state) in the event that, during the given sampling period, the light intensity level of the digital optical signal corresponds to the OFF logic level.

When using electrical sampling pulses as the sampling clock, these sampling pulses can be in the form of downward running electrical pulses (e.g., pulses wherein the relative voltage between the start of the pulse and the peak of the pulse is less than zero) supplied to the n-channel injector terminal(s) of the heterojunction thyristor device, and/or in the form of upward running electrical pulses (e.g., pulses wherein the relative voltage between the start of the pulse and the peak of the pulse is greater than zero) supplied to the p-channel injector terminal(s) of the heterojunction thyristor device.

The voltage level (e.g., magnitude) of the ON state of the output digital electrical signal produced by the heterojunction thyristor device can be adjusted by a voltage divider network coupled between the cathode terminal of the device and ground potential.

A plurality of such heterojunction thyristor devices may be configured to convert a plurality of synchronous digital optical signals to corresponding digital electrical signals for use in high speed applications, such as a receive module in a parallel optical data link.

In another aspect of the present invention, a plurality of heterojunction thyristor devices are configured to convert a digital word encoded by a parallel digital optical signal (e.g., a plurality of synchronous optical bits) to an output analog electrical signal whose magnitude corresponds to the digital word. Each heterojunction thyristor device is configured to convert an optical bit in the digital word to a corresponding digital electrical signal. The voltage levels (e.g., magnitudes) of the ON state of the digital electrical signals produced by the heterojunction thyristor devices are varied by voltage divider networks coupled between the cathode terminal of the devices and ground potential. In this manner, the voltage divider networks produce electrical signals whose magnitude corresponds to the contribution of each optical bit in the digital word. The electrical signals produced by the voltage divider networks is summed by a summing network to generate the output analog electrical signal corresponding to the digital word.

Preferably, the summing network includes a chain of two-port adding nodes and sample/hold circuits arranged as pairs, each corresponding to a different voltage divider network. In this configuration, the output electrical signal generated by a given voltage divider network is supplied to an input node of the two-port adding node of the corresponding pair.

In another aspect of the present invention, a heterojunction thyristor device is configured as an optically-controlled (or electrically-controlled) sampling/switching device. In this configuration, first and second channel regions are disposed between the anode terminal and the cathode terminal of the device, and an electrical input terminal and an electrical output terminal are coupled to opposite ends of the first channel region. At least one optical control signal (or an electrical control signal) is supplied to the device. When the light intensity level of the at least one optical control signal (or magnitude of the electrical control signal) corresponds to a predetermined ON condition, sufficient charge is stored in the second channel region to cause the heterojunction thyristor device to operate in an ON state whereby current flows between the anode terminal and the cathode terminal and the electrical input terminal is electrically coupled to the electrical output terminal. When the light intensity level of the at least one optical control signal (or magnitude of the electrical control signal) corresponds to a predetermined OFF condition, the heterojunction thyristor device operates in an OFF state whereby current does not flow between the anode terminal and the cathode terminal and the electrical input terminal is electrically isolated from the electrical output terminal.

The optical control signal can be an optical sampling clock, a digital optical signal encoding bits of information, or the combination of a digital optical signal and an optical sampling clock (which defines sampling periods that overlap the bits of information in the digital optical signal). The electrical control signal can be an electrical sampling clock injected into the second channel of the device that operates alone to supply charge that induces ON state operation. Alternatively, in addition to the optical control signal(s), an electrical sampling clock can be injected into the second channel of the device to contribute to the supply of charge therein that induces ON state operation (when the light intensity level of the optical control signal corresponds to the predetermined ON condition).

Importantly, such optically-controlled (or electrically-controlled) sampling/switching devices are suitable for use as sample and hold circuitry in the photonic digital-to-analog converters described herein, and in a wide variety of signal processing applications, such as analog-to-digital converters, switched-capacitor filters, and switched-capacitor waveform shaping circuits.

In another aspect of the present invention, a plurality of heterojunction thyristor devices are configured to convert a digital word encoded by a parallel digital optical signal (e.g., a plurality of synchronous optical bits) to an output analog electrical signal whose magnitude corresponds to the digital word. Each heterojunction thyristor device is configured as a sampling device to convert an optical bit in the digital word to a corresponding digital electrical signal. The voltage levels (e.g., magnitudes) of the ON state of the digital electrical signals produced by the heterojunction thyristor devices are provided by reference voltage sources operably coupled to the input terminals of the heterojunction thyristor devices. In this manner, the heterojunction thyristor devices and corresponding voltage reference sources produce electrical signals whose magnitude corresponds to the contribution of each optical bit in the digital word. These electrical signals are summed by a summing circuit, which is preferably implemented by another heterojunction-thyristor-based sampling device, to generate the output analog electrical signal corresponding to the digital word.

In another aspect of the present invention, a heterojunction thyristor device configured for optically-controlled sampling/switching is used as the basis for converting a digital word encoded by a serial digital optical data signal (e.g., serial optical bit stream) into a corresponding analog electrical signal. In this configuration, a voltage reference is operably coupled to the electrical input terminal of the heterojunction thyristor device. The voltage reference cooperates with the heterojunction thyristor device to sequentially generate at its electrical output terminal a voltage signal representing the contribution of each bit of the digital word encoded in the serial digital optical data signal. A summing network is operably coupled to the electrical output terminal of the device. The summing network sequentially sums the voltage signal over the sequence of bits to produce an analog electrical signal corresponding to the digital word for output therefrom.

Preferably, the summing network includes an adding node, sample and hold circuit, and a feedback path between the sample and hold circuit and the adding node. In addition, the voltage reference preferably supplies a voltage level corresponding to the maximum voltage level of the analog electrical signal divided by $2^{(N-1)}$, where N is the number of bits in said digital word, and the feedback path comprises an amplifier that amplifies the output of the sample and hold circuit by a factor of 2.

According to other embodiments of the present invention, monolithic optoelectronic integrated circuits that include one or more heterojunction thyristor devices as described herein are integrated with electronic devices (such as transistors) and/or optical devices (such as waveguide devices).

Additional objects and advantages of the invention will become apparent to those skilled in the art upon reference to the detailed description taken in conjunction with the provided figures.

BRIEF DESCRIPTION OF THE DRAWINGS

FIG. 2B1 is a pictorial illustration of a heterojunction thyristor device that is used to convert an input digital optical signal to an output digital electrical signal in accordance with the present invention; in this configuration, the input digital optical signal is part of the Optical IN signal that is resonantly absorbed by the device, and a sampling clock (electrical) is supplied to the injector terminal of the device.

FIG. 2B2 is a pictorial illustration of a heterojunction thyristor device that is used to convert an input digital optical signal to an output digital electrical signal in accordance with the present invention; in this configuration, the input digital optical signal and a sampling clock (optical) are part of the Optical IN signal that is resonantly absorbed by the device.

FIG. 2B3 is a pictorial illustration of a heterojunction thyristor device that is used to convert an input digital optical signal to an output digital electrical signal in accordance with the present invention; a voltage divider network is used to adjust magnitude of the ON state of the digital electrical signal; in this configuration, the input digital optical signal is part of the Optical IN signal that is resonantly absorbed by the device, and a sampling clock (electrical) is supplied to the injector terminal of the device.

FIG. 2B4 is a pictorial illustration of a heterojunction thyristor device that is used to convert an input digital optical signal to an output digital electrical signal in accordance with the present invention; a voltage divider network is used to adjust magnitude of the ON state of the digital electrical signal; in this configuration, the input digital optical signal and a sampling clock (optical) are part of the Optical IN signal that is resonantly absorbed by the device.

FIG. 2D1 is a graph depicting the operation of the heterojunction thyristor device in converting an input digital optical signal (in the ON state) to a corresponding output digital electrical signal (in the ON state) during a sampling period defined by an electrical sampling clock supplied to the injector terminal of the device; conversely, when the input digital optical signal is in the OFF state, the heterojunction thyristor remains in its NON-CONDUCTING/OFF state and produces an output digital electrical signal in the OFF state during the corresponding sampling period defined by the electrical sampling clock.

FIG. 2D2 is a graph depicting the operation of the heterojunction thyristor device in converting an input digital optical signal (in the ON state) to a corresponding output digital electrical signal (in the ON state) during a sampling period defined by an optical sampling clock; conversely, when the input digital optical signal is in the OFF state, the heterojunction thyristor remains in its NON-CONDUCTING/OFF state and produces an output digital electrical signal in the OFF state during the corresponding sampling period defined by the optical sampling clock.

FIG. 3A is a schematic showing an exemplary layer structure made with group III–V material in accordance with the present invention, and from which devices of the present invention can be made.

FIG. 3D is a schematic showing an alternate layer structure made with group III–V material in accordance with the present invention, and from which devices of the present invention can be made.

FIGS. 4B(i), 4B(ii), and 4B(iii) is a timing diagram illustrating the encoding of a 4-bit digital word by 4 input digital optical signals and associated electrical timing signals relative thereto; FIG. 4B(i) is a signal diagram that illustrates the encoding of a 4-bit digital word by 4 input digital optical signals supplied to the heterojunction thyristor devices of FIG. 4A; FIG. 4B(ii) is a signal diagram that illustrates an electrical timing signal A supplied to the injector terminals of the heterojunction thyristor devices of FIG. 4A; and FIG. 4B(iii) is a signal diagram that illustrates an electrical timing signal B supplied to the summing network of FIG. 4A.

FIGS. 5B(i), 5B(ii), and 5B(iii) is a timing diagram illustrating the encoding of a 4-bit digital word by 4 input digital optical signals and associated optical timing signals relative thereto; FIG. 5B(i) is a signal diagram that illustrates the encoding of a 4-bit digital word by the input digital optical signals supplied to the heterojunction thyristor devices of FIG. 5A; FIG. 5B(ii) is a signal diagram that illustrates an optical timing signal A supplied to the heterojunction thyristor devices of FIG. 5A for resonant absorption therein; and FIG. 5B(iii) is a signal diagram that illustrates an optical timing signal B supplied to the summing network of FIG. 5A.

FIG. 5F is a cross-sectional schematic view showing the generalized construction of an exemplary heterojunction thyristor device formed from the layer structure of FIG. 3A, which is readily configured in accordance with FIGS. 4C–4E or 5C–5E to perform sampling operations.

FIGS. 6B(i) and 6B(ii) is a timing diagram illustrating the serial encoding of a 4-bit digital word by the input digital optical signal and associated electrical clock signal relative thereto; FIG. 6B(i) is a signal diagram that illustrates the serial encoding of a 4-bit digital word by the input digital optical signal supplied to the heterojunction thyristor device of FIG. 6A; and FIG. 6B(ii) is a signal diagram that illustrates the electrical clock signal supplied to the injector terminal of the first heterojunction thyristor device and supplied to the summing network of FIG. 6A.

FIGS. 7B(i) and 7B(ii) is a timing diagram illustrating the serial encoding of a 4-bit digital word by the input digital optical signal and associated optical clock signal relative thereto; FIG. 7B(i) is a signal diagram that illustrates the serial encoding of a 4-bit digital word by the input digital optical signal supplied to the heterojunction thyristor device of FIG. 7A; and FIG. 7B(ii) is a signal diagram that illustrates the optical clock signal supplied to the first heterojunction thyristor device and supplied to the summing network of FIG. 7A.

FIGS. 9B(i) and 9B(ii) is a timing diagram illustrating the serial encoding of a 4-bit digital word by the input digital optical signal and associated electrical timing signals relative thereto; FIG. 9B(i) is a signal diagram that illustrates the serial encoding of bits in the digital optical signal supplied to the heterojunction thyristor device of FIG. 9A; and FIG. 9B(ii) is a signal diagram that illustrates the electrical timing signal A supplied to the injector terminal of the heterojunction thyristor device of FIG. 9A.

FIGS. 9D(i) and 9D(ii) is a timing diagram illustrating the serial encoding of a 4-bit digital word by the input digital optical signal and associated optical timing signals relative thereto; FIG. 9D(i) is a signal diagram that illustrates the serial encoding of bits in the digital optical signal supplied to the heterojunction thyristor device of FIG. 9C; and FIG. 9D(ii) is a signal diagram that illustrates the optical clock signal A supplied to the heterojunction thyristor device of FIG. 9C.

DETAILED DESCRIPTION OF THE PREFERRED EMBODIMENTS

Figure 1A:
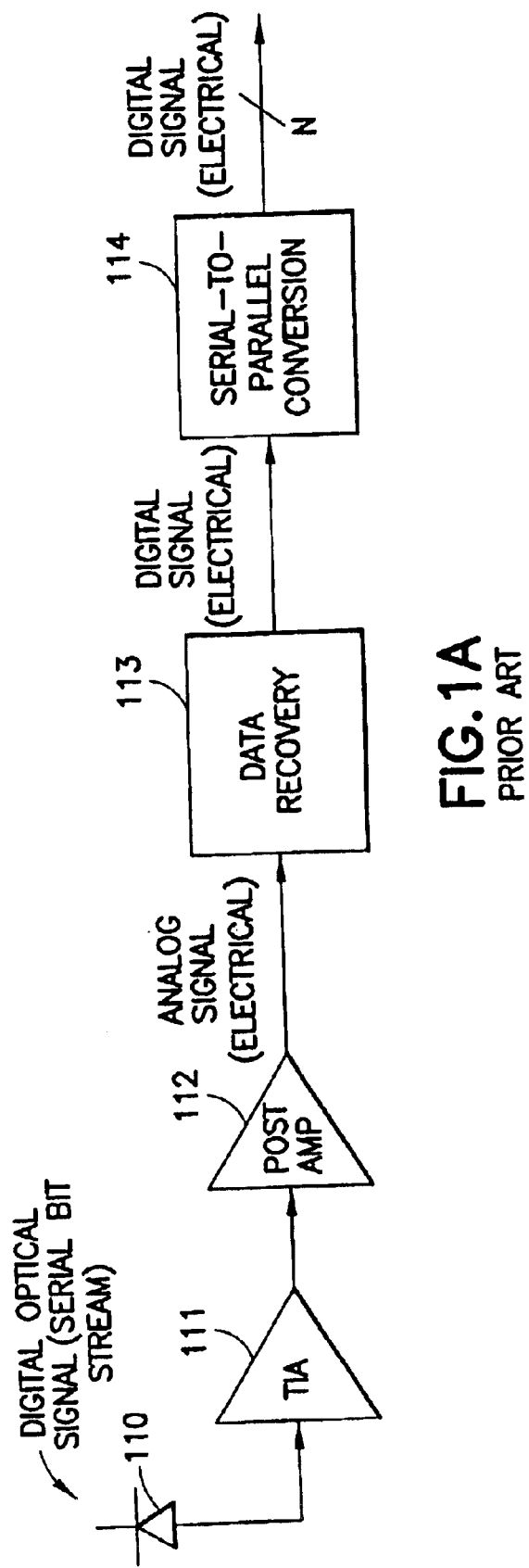
FIG. 1A is a functional block diagram illustrating a prior art mechanism that converts a digital optical signal to a digital electrical signal.

Modulation-doped quantum well heterojunction transistors—including well known Pseudomorphic Pulsed Doped High Electron Mobility Transistors (Pulsed Doped PHEMT), which are sometimes referred to as Pulsed Doped Modulation Doped Field Effect Transistors (Pulsed Doped MODFET) or Pulsed Doped Two Dimensional Gas Field Effect Transistors (Pulsed Doped TEGFET)—have become well recognized for their superior low noise and high frequency performance and are now in demand in many high frequency applications (e.g., front end amplifier in wireless communications systems and in Monolithic Microwave and Millimeterwave IC (MMIC) designs). GaAs/InGaAs/$Al_xGa_{1-x}As$ or InP/InGaAs/InAlAs is the III–V material system of choice for these devices because of the ability to grow high optical/electrical quality epitaxial layers by molecular beam epitaxy (MBE). Alternatively, strained silicon heterostructures employing silicon-germanium (SiGe) layers have been used to produce such devices.

U.S. Pat. No. 4,827,320 to Morkoc et al. discloses a pseudomorphic HEMT (PHEMT) structure that employs a layer of strained InGaAs (undoped) between a GaAs substrate and a layer of undoped AlGaAs to form a quantum well defined by the strained InGaAs layer. A layer of n+ doped AlGaAs is formed on the undoped AlGaAs layer. A layer of n+ GaAs is formed on the layer of n+ doped AlGaAs. The layer of n+ GaAs facilitates an ohmic contact to source/drain electrodes. A gate electrode of aluminum is recessed below the layer of n+ GaAs and a portion of the n+ AlGaAs layer by wet chemical etch and evaporation of aluminum.

The PHEMT structure has been very successful in producing microwave transistors that operate well into the multi-gigahertz regime, initially being used extensively in military systems and now finding their way into commercial products, particularly in the area of cellular communications. In recent years, there has been a growing interest in combining the PHEMT with optical capability because of the difficulty in propagating very high frequency signals to and from the integrated circuit by coaxial lines. Combining electronic with optoelectronic components monolithically gives rise to the concept of the optoelectronic integrated circuit (OEIC). However, there are serious problems encountered because of the dissimilar nature of the structures of the FET, the pn junction laser, PIN diode, etc.

To achieve this goal, inversion channel heterojunction structures created from a single epitaxial growth have been used to realize a range of optoelectronic devices including lasers, detectors and field effect transistors (FETs). An exemplary inversion channel heterojunction structure is described in Taylor and Kiely, "Theoretical and Experimental Results for the Inversion Channel Heterostructure Field Effect Transistors", IEE Proceedings-G, Vol. 140, No. 6, December 1993. In this structure, for the region between the modulation doping layer and the gate of the semiconductor surface, the doping of this region is substantially p type in order to provide a low resistance ohmic contact for the gate of the FET. However, the high p-type doping of this region creates many problems, including:

i) the effects of free carrier absorption makes formation of a vertical cavity laser difficult;

ii) forming depletion-type FETs by implanting n-type dopant is difficult; this difficulty stems from the difficulty in controlling the dopant density in the bulk region; more specifically, compensating a large p density with a large n density to obtain a lower p density is difficult to control in a bulk region (but much easier in a delta doped region);

iii) controlling the threshold voltage of an enhancement type FET is difficult because the input capacitance is a function of doping which is harder to control than layer thickness; and iv) producing effective current funneling for inducing lasing is difficult; more specifically, it is very desirable to create a pn junction by N type implantation to steer the current in this structure since this would be compatible with the overall approach to building the FET devices; the heavy p doping bulk layers makes it difficult to create junction isolation that has low leakage.

The present invention builds upon novel device structures utilizing modulation-doped quantum well heterojunctions that do not suffer from the problems associated with the prior art PHEMT devices. Such novel device structures are described in detail in U.S. Pat. No. 6,031,243; U.S. patent application Ser. No. 09/556,285 filed on Apr. 24, 2000; U.S. patent application Ser. No. 09/798,316 filed on Mar. 2, 2001; U.S. patent application Ser. No. 08/949,504 filed on Oct. 14, 1997, U.S. patent application Ser. No. 10/200,967 filed on Jul. 23, 2002; U.S. application Ser. No. 09/710,217 filed on Nov. 10, 2000; U.S. patent application Ser. No. 60/376,238 filed on Apr. 26, 2002; U.S. patent application Ser. No. 10/280,892 filed on Oct. 25, 2002; each of these references herein incorporated by reference in its entirety.

Figure 2A:
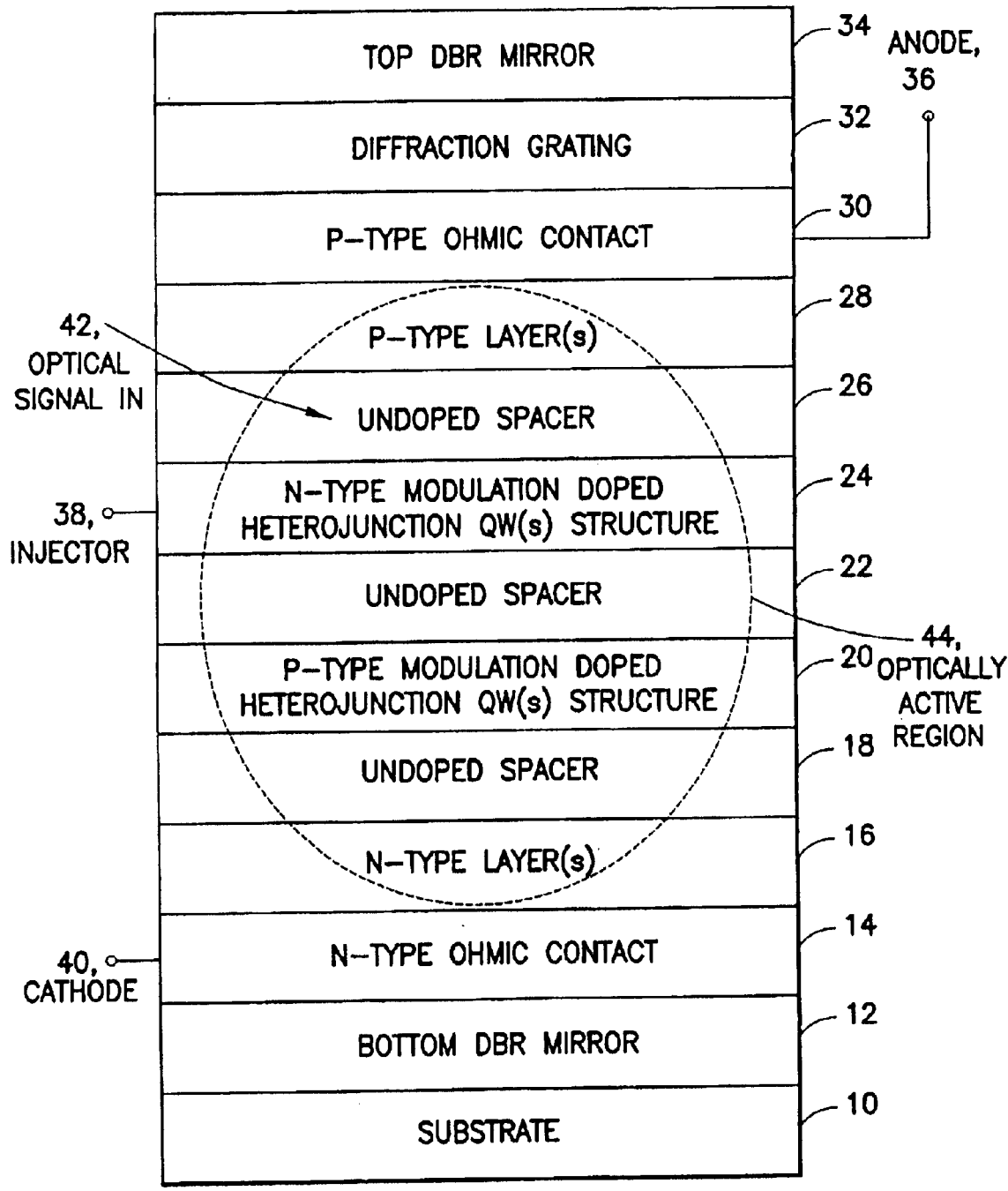
FIG. 2A is a cross-sectional schematic showing a layer structure in accordance with the present invention, and from which devices of the present invention can be made.

The general structure of the heterojunction thyristor device is illustrated in the cross-section of FIG. 2A. In addition, the general structure of FIG. 2A can be configured to operate as a field effect transistor, bipolar transistor, and as a passive waveguide such that these devices can be integrated to form a monolithic optoelectronic integrated circuit as described herein.

Turning now to FIG. 2A, the heterojunction thyristor device 1 of the present invention includes a bottom dielectric distributed bragg reflector (DBR) mirror 12 formed on substrate 10. The bottom DBR mirror 12 typically is formed by depositing pairs of semiconductor or dielectric materials with different refractive indices. When two materials with different refractive indices are placed together to form a junction, light will be reflected at the junction. The amount of light reflected at one such boundary is not necessarily large. However, if multiple junctions/layer pairs are stacked periodically with each layer having a quarter-wave (¼n) optical thickness, the reflections from each of the boundaries will be added in phase to produce a large amount of reflected light (e.g., a large reflection coefficient) at the particular center wavelength $l_D$. Deposited upon the bottom DBR mirror 12 is the active device structure which consists of two HFET devices. The first of these is a p-channel HFET 11 (comprising layers 14,16,18,20 and 22) which has a p-type modulation doped quantum well and is positioned with the gate terminal on the lower side (i.e. on the mirror as just described) and the collector terminal on the upper side. The second of these is an n-channel HFET 13 (comprising layers 22,24,26,28,30) which has an n-type modulation doped quantum well and is positioned with the gate terminal on the top side and the collector terminal on the lower side which is the collector of the p-channel device. Therefore a non-inverted N-channel device is stacked upon an inverted p-channel device to form the active device structure.

The active device layer structure begins with n-type ohmic contact layer(s) 14 which enables the formation of ohmic contacts thereto. As shown, ohmic contact layer 14 is operably coupled to cathode terminal 40 of the heterojunction thyristor device (which corresponds to the gate electrode of the p-channel HFET device). Deposited on layer 14 is one or more n-type layers 16 and an undoped spacer layer 18 which serve electrically as part of the P-channel HFET gate and optically as lower waveguide cladding layers. Deposited on layer 18 is a p-type modulation doped heterojunction structure 20 that defines one or more quantum wells (which may be formed from strained or unstrained heterojunction materials). Deposited on p-type modulation doped heterojunction structure 20 is an undoped spacer layer 22, which forms the collector of the P-channel HFET device. All of the layers grown thus far form the P-channel HFET device with the gate ohmic contact on the bottom.

Undoped spacer layer 22 also forms the collector region of the N-channel HFET device. Deposited on layer 22 is a n-type modulation doped heterojunction structure 24 that defines one or more quantum wells (which may be formed from strained or unstrained heterojunction materials). Deposited on the n-type modulation doped heterojunction structure 24 is an undoped spacer layer 26 and one or more p-type layers 28 which serve electrically as part of the n-channel HFET gate and optically as upper waveguide cladding layers. Preferably, the p-type layers 28 include two sheets of planar doping of highly doped p-material separated by a lightly doped layer of p-material. These p-type layers are separated from the N-type modulation doped quantum well (QW) heterostructure 24 by undoped spacer material 26. In this configuration, the top charge sheet achieves low gate contact resistance and the bottom charge sheet defines the capacitance of the n-channel HFET with respect to the N-type modulation doped QW heterostructure 24. Deposited on p-type layer(s) 28 is a p-type ohmic contact layer(s) 30 which enables the formation of ohmic contacts thereto. As shown, ohmic contact layer(s) 30 is operably coupled to the anode terminal 36 of the heterojunction thyristor device (which corresponds to the gate electrode of the n-channel HFET device).

The injector terminal 38 of the heterojunction thyristor device (which is analogous to the gate terminal of conventional thyristor devices) preferably is operably coupled to the QW channel(s) realized in the N-type modulation doped QW(s) heterostructure 24 as shown in FIG. 2A. Alternatively, the injector terminal of the heterojunction thyristor device may be operably coupled to the QW channel(s) realized in the P-type modulation doped QW(s) heterostructure 20. In such a configuration, the polarity of the control signals applied to the injector terminal 38 are reversed, and the bias current is configured to move charge from the QW channel(s) realized in the P-type modulation doped QW(s) heterostructure 24 to ground potential.

As another alternative, a first injector terminal may be operably coupled to the QW channel(s) realized in the N-type modulation doped QW(s) heterostructure 24 while a second injector terminal is operably coupled to the P-type modulation doped QW(s) heterostructure 20. In such a configuration, the polarity of the control signals applied to the second injector terminal are reversed, and the bias current is configured to move charge from the QW channel(s) realized in the P-type modulation doped QW(s) heterostructure 20 to ground potential.

To form a resonant cavity device where light is input into the device laterally (i.e., from a direction normal to the cross section of FIG. 2A), a diffraction grating and top DBR mirror are formed over the active device structure described above. In this configuration, the diffraction grating performs the function of diffracting incident light that is propagating in the lateral direction into the vertical cavity mode, where it is absorbed resonantly in the vertical cavity. Alternatively, light may enter the resonant vertical cavity through an optical aperture (not shown) in the top surface of the device. In this case, the diffraction grating is omitted, the top DBR mirror defines a cavity for the vertical absorption of light, and the device operates as a vertical cavity detector. In either configuration, the distance between the top DBR mirror and bottom DBR mirror preferably represents an integral number of ¼ wavelengths at the designated wavelength. This distance is controlled by adjusting the thickness of one or more of the layers therebetween to enable this condition. These configurations define an optically active region 44 that encompasses the QW channel(s) of structures 24 and 20. The optical signal IN 42 (which propagates in the vertical direction, or which propagates in the lateral direction and is diffracted from the lateral direction into a vertical propagation direction by diffraction grating 32) is resonantly absorbed in region 44. Such absorption results in the generation of electron-hole pairs in the QW channel(s) thereby causing charge to build up therein, which may be sufficient to induce a change in current flowing through the device from the anode terminal 36 to the cathode terminal 40.

The operation of the heterojunction thyristor device can also be controlled by injection of electrical energy (e.g., an electrical input pulse signal) into the QW channel(s) of structure 24 (and/or the QW channel(s) of structure 20). Such injection contributes to the generation of electron-hole pairs in the QW channel(s) thereby causing charge to build up therein.

Figure 1B:
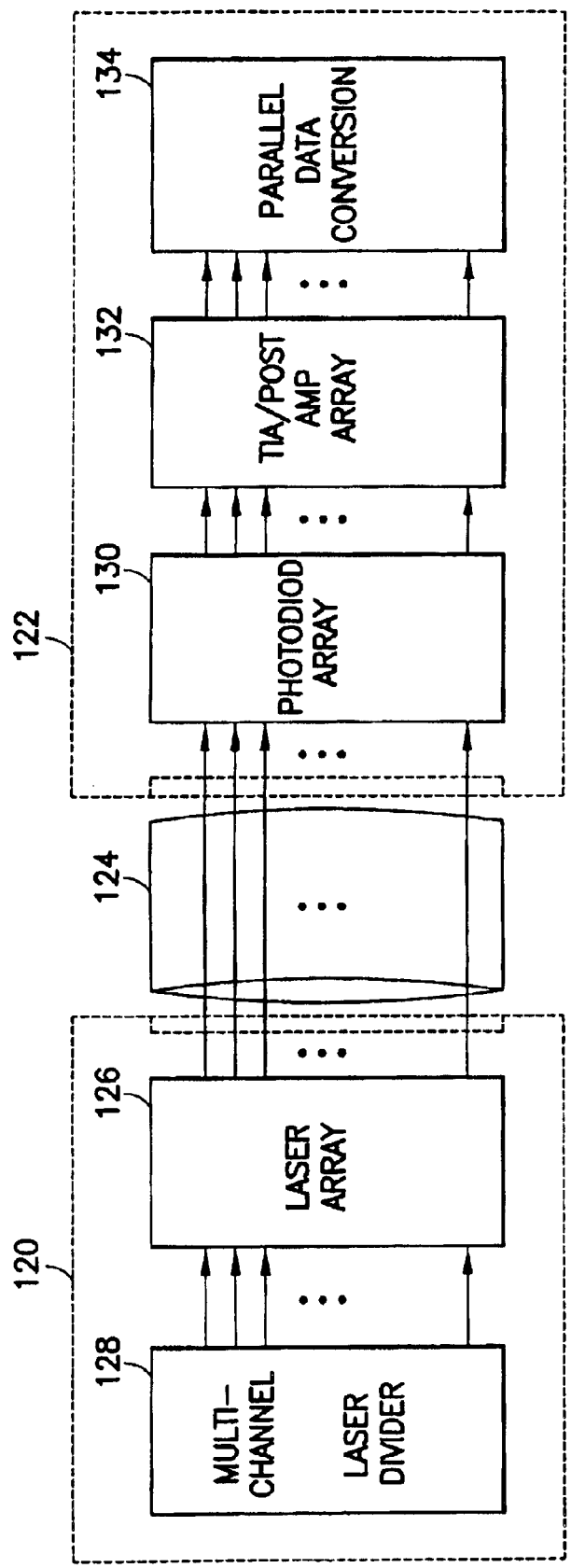
FIG. 1B is a functional block diagram illustrating a prior art parallel optical data link.
Figure 1C:
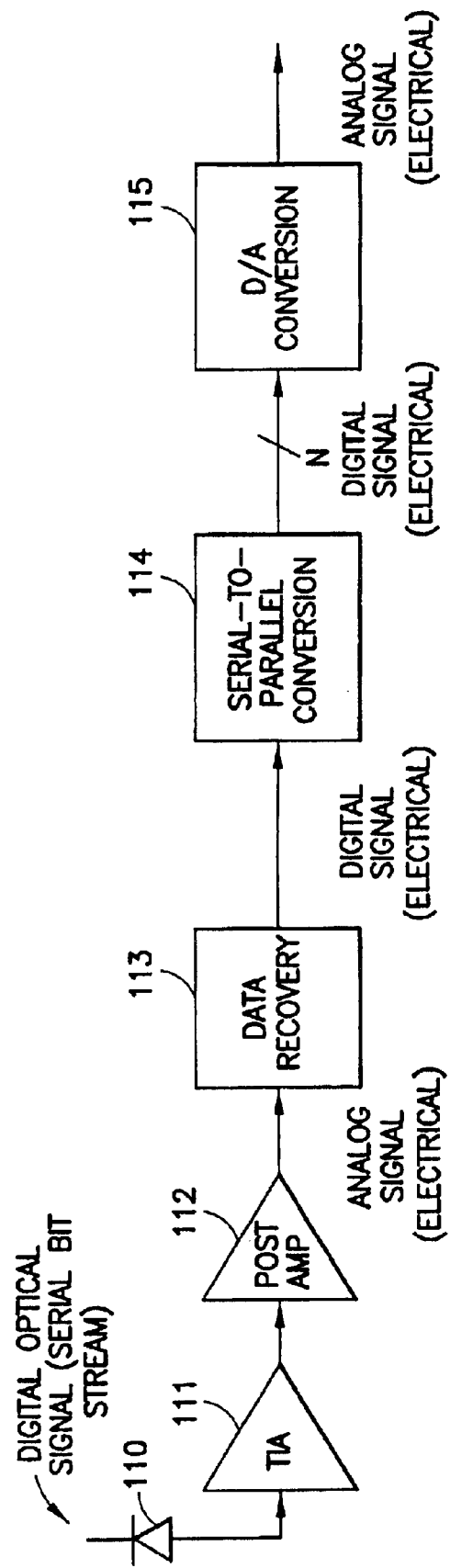
FIG. 1C is a functional block diagram illustrating a prior art mechanism that converts a digital optical signal to an analog electrical signal.
Figure 2C:
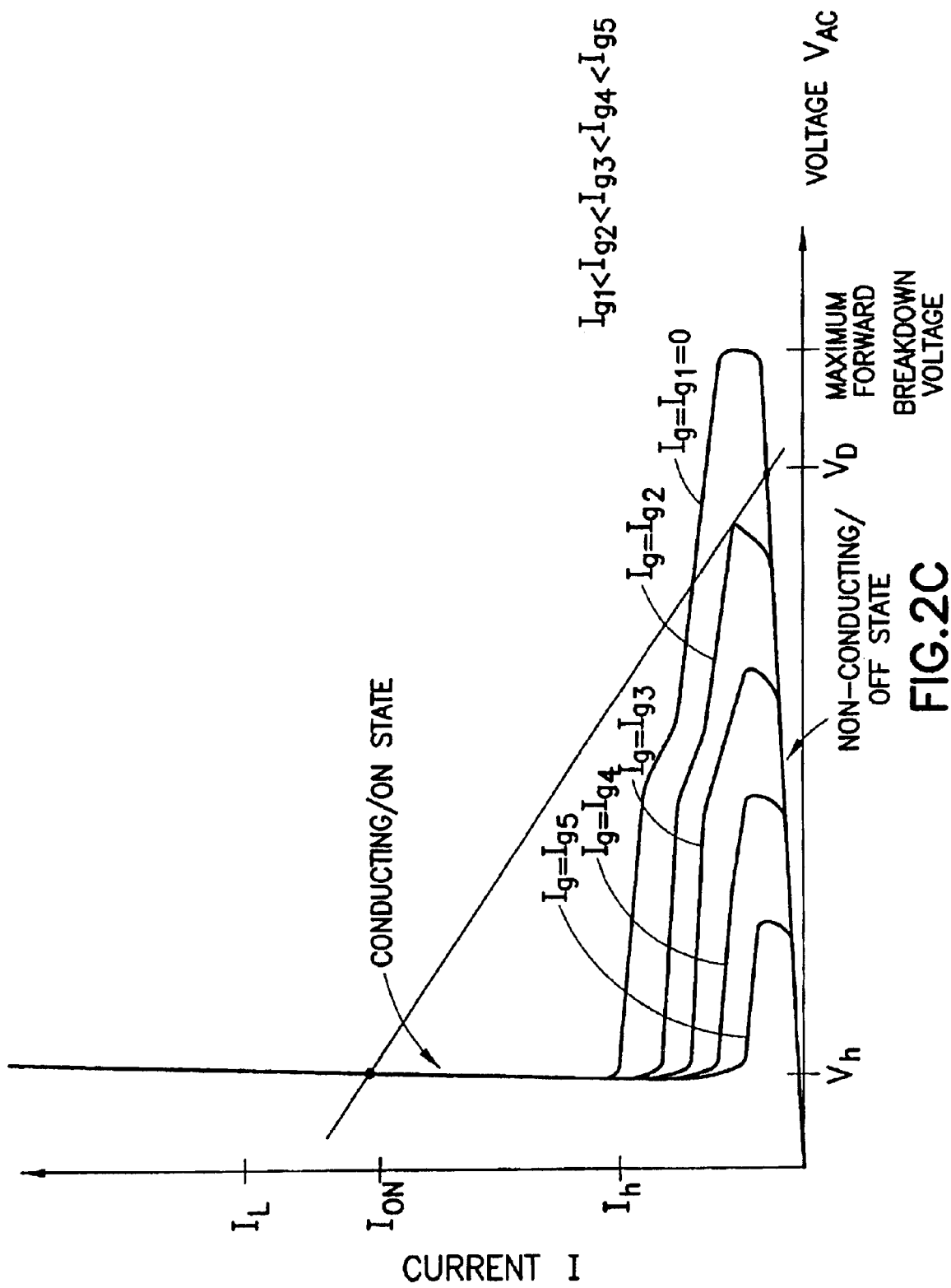
FIG. 2C is a graph showing the current-voltage characteristics of the heterojunction thyristor device of the present invention over varying injector currents ($I_g$), and the bias line that depicts operation of the heterojunction thyristor device in converting the input digital optical signal to an output digital electrical signal.

FIGS. 2B1 through 2B4, 2C, 2D1 and 2D2 illustrate the operational characteristics of the heterojunction thyristor device of FIG. 2A in accordance with the present invention. The device switches from a non-conducting/OFF state (where the current I is substantially zero) to a conducting/ON state (where current I is substantially greater than zero) when: i) the anode terminal 36 is forward biased (e.g. biased positively) with respect to the cathode terminal 40; and ii) absorption of optical energy in the QW channel(s) of N-type modulation doped heterojunction QW structure 24 and/or injection of electrical energy into the QW channel(s) of N-type modulation doped heterojunction QW structure 24 produce a charge in the N-type modulation doped QW structure 24 that is greater than the critical switching charge $Q_{CR}$, which is that charge that reduces the forward breakdown voltage such that no off state bias point exists. The critical switching charge $Q_{CR}$ is unique to the geometries and doping levels of the device. The forward breakdown voltage of the device varies over the injector current $I_g$ as shown in FIG. 2C.

The device switches from the conducting/ON state to a non-conducting/OFF state when the current I through the device falls below the hold current $I_H$ of the device for a sufficient period of time such that the charge in the N-type modulation doped QW structure 24 decreases below the holding charge $Q_H$. The holding charge $Q_H$ is the critical value of the channel charge which will sustain holding action.

The device is configured to convert an input digital optical signal to an output digital electrical signal as follows. The input digital optical signal encodes bits of information (each bit representing an OFF logic level or ON logic level) and is part of the Optical IN signal that is resonantly absorbed by the device. A sampling clock defines sampling periods that overlap the bits (e.g., ON/OFF pulse durations) in the input digital optical signal. In FIGS. 2B1 and 2B3, the sampling clock is in the form of downward running electrical pulses (e.g., pulses wherein the relative voltage between the start of the pulse and the peak of the pulse is less than zero) supplied to the injector terminal 38. Alternatively, as shown in FIGS. 2B2 and 2B4, the sampling clock is in the form of optical pulses that are part of the Optical IN signal that is resonantly absorbed by the device. In addition, the device is biased (preferably, by selecting the appropriate load resistance/voltage divider network as shown in FIGS. 2B1 through 2B4) such that the current I through the device in the ON state is substantially greater than zero but substantially below the threshold current for lasing $I_L$ (preferably about one-third of $I_L$) as shown in FIG. 2C. In addition, the injector terminal 38 is forward biased with respect to the anode terminal 36 through a current source that generates a bias current $I_{BIAS}$ as shown.

In the configurations of FIGS. 2B1 and 2B3, the length and width of the device is sized such that it operates during a given sampling period defined by the electrical sampling clock as follows. When the light level of the input digital optical signal corresponds to the ON logic level, channel current produced by the combination of the input digital optical signal and the electrical sampling pulse exceeds the bias current $I_{BIAS}$ to produce the critical switching charge $Q_{CR}$ in the N-type modulation doped QW structure 24. This causes the heterojunction thyristor to switch to its conducting/ON state where the current I through the device is substantially greater than zero but below the threshold for lasing $I_L$. This operation is shown graphically in FIG. 2D1. However, when the light level of the input digital optical signal falls to the OFF logic level, the bias current $I_{BIAS}$ exceeds the channel current produced by the electrical sampling clock alone and thus draws on the injector terminal 38 to drain charge from the N-type modulation doped QW structure 24, which causes the channel charge to fall below the holding charge $Q_H$. This causes the heterojunction thyristor to switch to its non-conducting/OFF state where the current I through the device is substantially zero. When the light level of the input digital optical signal corresponds to the OFF logic level, the bias current $I_{BIAS}$ exceeds the combination of the channel current produced by the input digital optical signal and the electrical sampling clock and thus draws on the injector terminal 38 to drain charge from the N-type modulation doped QW structure 24, which causes the channel charge to remain below the holding charge $Q_H$. This causes the device to remain in its non-conducting/OFF state where the current I through the device is substantially zero. In this manner, the logic levels (ON state/OFF state) of the output digital electrical signal produced at the cathode terminal 50 correspond to the logic levels of the input digital optical signal. The length and width of the device must also be selected such that the output current produced at the cathode terminal 40 is large enough to drive the capacitive load of the circuit element(s) coupled thereto, and leakage currents at the periphery of the device does not degrade the signal to noise ratio of the device to unacceptable levels.

The voltage level (e.g., magnitude) of the ON state of the output digital electrical signal produced by the device can be adjusted by a voltage divider network coupled between the cathode terminal 40 and ground potential as shown in FIG. 2B3.

In the configurations of FIGS. 2B2 and 2B4, the length and width of the device are sized such that it operates during a given sampling period defined by the optical sampling clock as follows. When the light level of the input digital optical signal corresponds to the ON logic level, channel current produced by the combination of the input digital optical signal and the optical sampling pulse exceeds the bias current $I_{BIAS}$ to produce the critical switching charge $Q_{CR}$ in the N-type modulation doped QW structure 24. This causes the heterojunction thyristor to switch to its conducting/ON state where the current I through the device is substantially greater than zero but below the threshold for lasing $I_L$. This operation is shown graphically in FIG. 2D2. However, when the light level of the input digital optical signal falls to the OFF logic level, the bias current $I_{BIAS}$ exceeds the channel current produced by the optical sampling pulse alone and thus draws on the injector terminal 38 to drain charge from the N-type modulation doped QW structure 24, which causes the channel charge to fall below the holding charge $Q_H$. This causes the heterojunction thyristor to switch to its non-conducting/OFF state where the current I through the device is substantially zero. When the light level of the input digital optical signal corresponds to the OFF logic level, the bias current $I_{BIAS}$ exceeds the combination of the channel current produced by the input digital optical signal and the optical sampling clock and thus draws on the injector terminal 38 to drain charge from the N-type modulation doped QW structure 24, which causes the channel charge to remain below the holding charge $Q_H$. This causes the device to remain in its non-conducting/OFF state where the current I through the device is substantially zero. In this manner, the logic levels (ON state/OFF state) of the output digital electrical signal produced at the cathode terminal 40 correspond to the logic levels of the input digital optical signal. The length and width of the device must also be selected such that the output current produced at the cathode terminal 40 is large enough to drive the capacitive load of the circuit element(s) coupled thereto, and leakage currents at the periphery of the device does not degrade the signal to noise ratio of the device to unacceptable levels.

The voltage level (e.g., magnitude) of the ON state of the output digital electrical signal produced by the device can be adjusted by a voltage divider network coupled between the cathode terminal 40 and ground potential as shown in FIG. 2B4.

As previously mentioned, in an alternate embodiment, the injector terminal 38 of the device may be operably coupled to the p-type QW channel(s) realized in the P-type modulation doped QW(s) structure 20. In such a configuration, the electrical sampling clock of FIGS. 2B1 and 2B3 is in the form of upward running electrical pulses (e.g., pulses wherein the relative voltage between the start of the pulse and the peak of the pulse is greater than zero) supplied to the injector terminal of the device. In addition, the bias current source of FIGS. 2B1 through 2B4 draws charge from the p-type QW channel(s) to ground potential.

Also, as previously mentioned, in another alternative embodiment, a first injector terminal may be operably coupled to the n-type QW channel(s) realized in the N-type modulation doped QW structure 24 while a second injector terminal is operably coupled to the p-type QW channel(s) in the P-type modulation doped QW(s) structure 20. In such a configuration, the electrical sampling clock supplied to the p-type QW channel(s) is in the form of upward running electrical pulses (e.g., pulses wherein the relative voltage between the start of the pulse and the peak of the pulse is greater than zero) supplied to the second injector terminal of the device. In addition, the bias current source operably coupled to the p-type QW channel(s) draws charge from the p-type QW channel(s) to ground potential.

The structure of FIG. 2A may also be used to produce various transistor devices, including n-channel HFET devices, p-channel HFET devices, p-type quantum-well-base bipolar transistor devices and n-type quantum-well-base bipolar transistor devices.

In a n-channel HFET, ohmic metal source and drain electrodes are electrically coupled to spaced apart N-type implants, which are electrically coupled to the n-type QW structure 24 to form a channel region there between. An ohmic metal gate electrode is formed on the p-type ohmic contact layer 30 and covers the channel region. An ohmic metal collector electrode is electrically coupled to at least one P-type implant, which is electrically coupled to the p-type QW structure 20 below the channel region.

In a p-channel HFET, ohmic metal source and drain electrodes are electrically coupled to spaced apart p-type implants, which are electrically coupled to the p-type QW structure 20 to form a channel region there between. Outside the channel region, an ohmic metal gate electrode is deposited on the n-type ohmic contact layer 14. An n-type implant is deposited above layer 22 and preferably into layer 24. An ohmic metal collector electrode is formed on the n-type implant.

In a p-type quantum-well-base bipolar transistor device, one or more base electrodes are electrically coupled to spaced apart P-type implants, which are electrically coupled to the p-type QW structure 20. Outside the p-type implants, one or more emitter electrodes are deposited on the n-type ohmic contact layer 14. A collector electrode is electrically coupled to an n-type implant, which is electrically coupled to the n-type QW structure 24. An additional collector electrode may be electrically coupled to another n-type implant into the p-type material of layer 28 or into the undoped spacer 26.

In an n-type quantum-well-base bipolar transistor device, one or more base electrodes are electrically coupled to spaced apart n-type implants, which are electrically coupled to the n-type QW structure 24. One or more collector electrodes are electrically coupled to corresponding p-type implants, which are electrically coupled to the p-type QW structure 20. An emitter electrode is deposited on the n-type ohmic contact layer 30.

In addition, the structure of FIG. 2A may be used to produce various optoelectronic components, such as a laser device or an in-plane passive waveguide. To configure the structure as a laser, the heterojunction thyristor device is biased (preferably, by selection of load resistance operably coupled between the cathode terminal 40 and ground potential) such that the current I flowing the through the device in the conducting/ON state is above the lasing threshold $I_L$ shown in FIG. 2C. The conducting-ON state is controlled by absorption of an optical control signal incident on the device (and/or by injection of an electrical control signal supplied to the injector terminal 38) which causes charge to build up in the QW channel(s) of the device sufficient to induce a change in current flowing through the device from the anode terminal 36 to the cathode terminal 40. To configure the structure as an in-plane passive waveguide, the diffraction grating, the ohmic gate/emitter electrode layers, and any contacts to n+ and p+ regions are omitted in order to minimize waveguide loss. The waveguide ridge cross-section is formed by a combination of several mesas, which are formed by vertical/horizontal surfaces formed in the layers between the top DBR mirror 34 and the bottom DBR mirror 12, to provide both laterally guiding and vertical guiding of light therein.

The heterojunction thyristor described above may be realized with a material system based on III–V materials (such as a GaAs/$Al_xGa_{1-x}As$). FIG. 3A illustrates an exemplary epitaxial growth structure utilizing group III–V materials for realizing a heterojunction thyristor and associated optoelectrical/optical devices in accordance with the present invention. Alternatively, strained silicon heterostructures employing silicon-germanium (SiGe) layers may be used to realize the heterojunction thyristor devices and associated optoelectrical/optical devices described herein.

The structure of FIG. 3A can be made, for example, using known molecular beam epitaxy (MBE) techniques. A first semiconductor layer 151 of AlAs and a second semiconductor layer 152 of GaAs are alternately deposited (with preferably at least seven pairs) upon a semi-insulating gallium arsenide substrate 149 in sequence to form the top dielectric distributed bragg reflector (DBR) mirror 12. The number of AlAs layers will preferably always be one greater than the number of GaAs layers so that the first and last layers of the mirror are shown as layer 151. In the preferred embodiment the AlAs layers 151 are subjected to high temperature steam oxidation to produce the compound $Al_xO_y$ so that a mirror will be formed at the designed center wavelength. Therefore the thicknesses of layers 151 and 152 in the mirror are chosen so that the final optical thickness of GaAs and $Al_xO_y$ is a quarter wavelength of the center wavelength $\lambda_D$. Alternatively the mirrors could be grown as alternating layers of one quarter wavelength thickness of GaAs and AlAs at the designed wavelength so that the oxidation step is not used. In that case, many more pairs are required (with typical numbers such as 22 pairs) to achieve the reflectivity needed for efficient lasing.

Deposited upon the mirror is the active device structure which consists of two HFET devices. The first of these is the above-described p-channel HFET (PHFET) 11, which has a p-type modulation doped quantum well and is positioned with the gate terminal on the bottom (i.e. on the mirror 12 just described) and the collector terminal above. The second of these is an n-channel HFET (NHFET) 13, which has an n-type modulation doped quantum well and is positioned with the gate terminal on top and the collector terminal below. The collector region of the NHFET device 13 also functions as the collector region of the PHFET device 11. However, the collector terminal of the NHFET device 13 is a p-type contact to p-type quantum well(s) disposed below (above) the collector region, while the collector terminal of the PHFET device 11 is a n-type contact to n-type quantum well(s) disposed above the collector region. Therefore a non-inverted n-channel device is stacked upon an inverted p-channel device to form the active device structure.

The active device layer structure begins with layer 153 of heavily N+ doped GaAs of about 2000 Å thickness to enable the formation of ohmic contacts to the gate electrode of the p-channel device. The N+ doped GaAs layer 153 corresponds to the ohmic contact layer 14 of FIG. 2A. Deposited on layer 153 is layer 154 of n-type $Al_{x1}Ga_{1-x1}As$ with a typical thickness of 500–3000 Å and a typical doping of $5\times10^{17}$ cm$^{-3}$. The parameter x1 is in the range between 15% and 80%, and preferably in the range of 30%–40% for layer 154. This layer serves as part of the PHFET gate and optically as part of the lower waveguide cladding layers for all laser, amplifier, and modulator structures. Next are 4 layers (155a, 155b, 155b, and 155b) of $Al_{x2}Ga_{1-x2}As$. These 4 layers (collectively, 155) have a total thickness about 380–500 Å and where x2 is about 15%. The first layer 155a is about 60–80 Å thick and is doped N+ type in the form of delta doping. The second layer 155b is about 200–300 Å thick and is undoped. The third layer 155c is about 80 Å thick and is doped P+ type in the form of delta doping. And the fourth layer 155d is about 20–30 Å thick and is undoped to form a spacer layer. This layer forms the lower separate confinement heterostructure (SCH) layer for the laser, amplifier and modulator devices. The n-type AlGaAs layer 154 and n-type AlGaAs layer 155a correspond to the n-type layer(s) 16 of FIG. 2A, and the undoped AlGaAs layer 155b corresponds to the undoped spacer layer 18 of FIG. 2A.

The next layers define the quantum well(s) that form the inversion channel(s) during operation of the PHFET 11. For a strained quantum well, this consists of a spacer layer 156 of undoped GaAs that is about 10–25 Å thick and then combinations of a quantum well layer 157 that is about 40–80 Å thick and a barrier layer 158 of undoped GaAs. The quantum well layer 157 may be comprised of a range of compositions. In the preferred embodiment, the quantum well is formed from a $In_{0.2}Ga_{0.8}AsN$ composition with the nitrogen content varying from 0% to 5% depending upon the desired natural emission frequency. Thus, for a natural emission frequency of 0.98 µm, the nitrogen content will be 0%; for a natural emission frequency of 1.3 µm, the nitrogen content will be approximately 2%; and for a natural emission frequency of 1.5 µm, the nitrogen content will be approximately 4–5%. The well barrier combination will typically be repeated (for example, three times as shown), however single quantum well structures may also be used. Unstrained quantum wells are also possible. Following the last barrier of undoped GaAs is a layer 159 of undoped $Al_{x2}Ga_{1-x2}As$ which forms the collector of the PHFET device 11 and is about 0.5 µm in thickness. All of the layers grown thus far form the PHFET device 11 with the gate contact on the bottom. The layers between the P+ AlGaAs layer 155c and the last undoped GaAs barrier layer 158 correspond to the p-type modulation doped heterojunction QW structure 20 of FIG. 2A. Undoped AlGaAs layer 159 corresponds to the undoped spacer layer 22 of FIG. 2A.

Layer 159 also forms the collector region of the NHFET device 13. Deposited on layer 159 are two layers (collectively 160) of undoped GaAs of about 200–250 Å total thickness, which form the barrier of the first n-type quantum well. Layer 160 is thicker than the normal barrier layer of about 100 Å because it accommodates the growth interruption to change the growth temperature from 610° C. (as required for optical quality $Al_{x2}Ga_{1-x2}As$ layers) to about 530° C. for the growth of InGaAs. Therefore layer 160 includes a single layer 160a of about 150 Å and a repeating barrier layer 160b of about 100 Å. The next layer 161 is the quantum well of $In_{0.2}Ga_{0.8}As$, which is undoped and about 40–80 Å in thickness. It is noted that the n-type quantum well layer 161 need not be of the same formulation as the p-type quantum well layer 157. The barrier layer 160b of 100 Å and quantum well layer 161 may be repeated, e.g., three times. Then there is a barrier layer 162 of about 10–30 Å of undoped GaAs which accommodates a growth interruption and a change of growth temperature. Next there are four layers (collectively 163) of $Al_{x2}Ga_{1-x2}As$ of about 300–500 Å total thickness. These four layers (163) include a spacer layer 163a of undoped $Al_{x2}Ga_{1-x2}As$ that is about 20–30 Å thick, a modulation doped layer 163b of N+ type doping of $Al_{x2}Ga_{1-x2}As$ (with doping about $3.5 \times 10^{18}$ cm$^{-3}$) that is about 80 Å thick, a capacitor spacing layer 163c of undoped $Al_{x2}1Ga_{1-x2}As$ that is about 200–300 Å thick, and a P+ type delta doped layer 163d of $Al_{x2}Ga_{1-x2}As$ (with doping about $3.5 \times 10^{18}$ cm$^{-3}$) that is about 60–80 Å to form the top plate of the capacitor. The doping species for layer 163d is preferably carbon (C) to ensure diffusive stability. In contrast to layer 163b which is always depleted, layer 16d should never be totally depleted in operation. Layers 163d and 163b form the two plates of a parallel plate capacitor which forms the field-effect input to all active devices. For the optoelectronic device operation, layer 163 is the upper SCH region. Layer 163 must be thin to enable very high frequency operation. In the illustrated embodiment, for a transistor cutoff frequency of 40 GHz, a thickness of 300 Å would be used, and for 90 GHz a thickness of 200 Å A would be more appropriate. The layers between the undoped GaAs barrier layer 160a and the N+ AlGaAs layer 163b correspond to the n-type modulation doped heterojunction QW structure 24 of FIG. 2A. Undoped AlGaAs layer 163c corresponds to the undoped spacer layer 26 of FIG. 2A.

One or more layers (collectively 164) of p-type $Al_{x1}Ga_{1-x1}As$ are deposited next to form part of the upper waveguide cladding layer for the laser, amplifier and modulator devices. It has a typical thickness of 500–1500 Å. Layer 164 may have a first thin sublayer 164a of, e.g., 10–20 Å thickness and having a P+ typical doping of $10^{19}$ cm$^{-3}$. A second sublayer 164b has a P doping of $1 \times 10^{17}$–$5 \times 10^{17}$ cm$^{-3}$ and a typical thickness of 700 Å. The parameter X1 of layer 164 is preferably about 70%. The p-type layers 163b, 164a, 164b correspond to the p-type layer(s) 28 of FIG. 2A.

Deposited next is an ohmic contact layer 165 (which may comprise a single layer of GaAs or a combination of GaAs (165a) and InGaAs (165b) as shown), which is about 50–100 Å thick and doped to a very high level of P+ type doping (about $1 \times 10^{20}$ cm$^{-3}$) to enable the best possible ohmic contact.

Figure 3B:
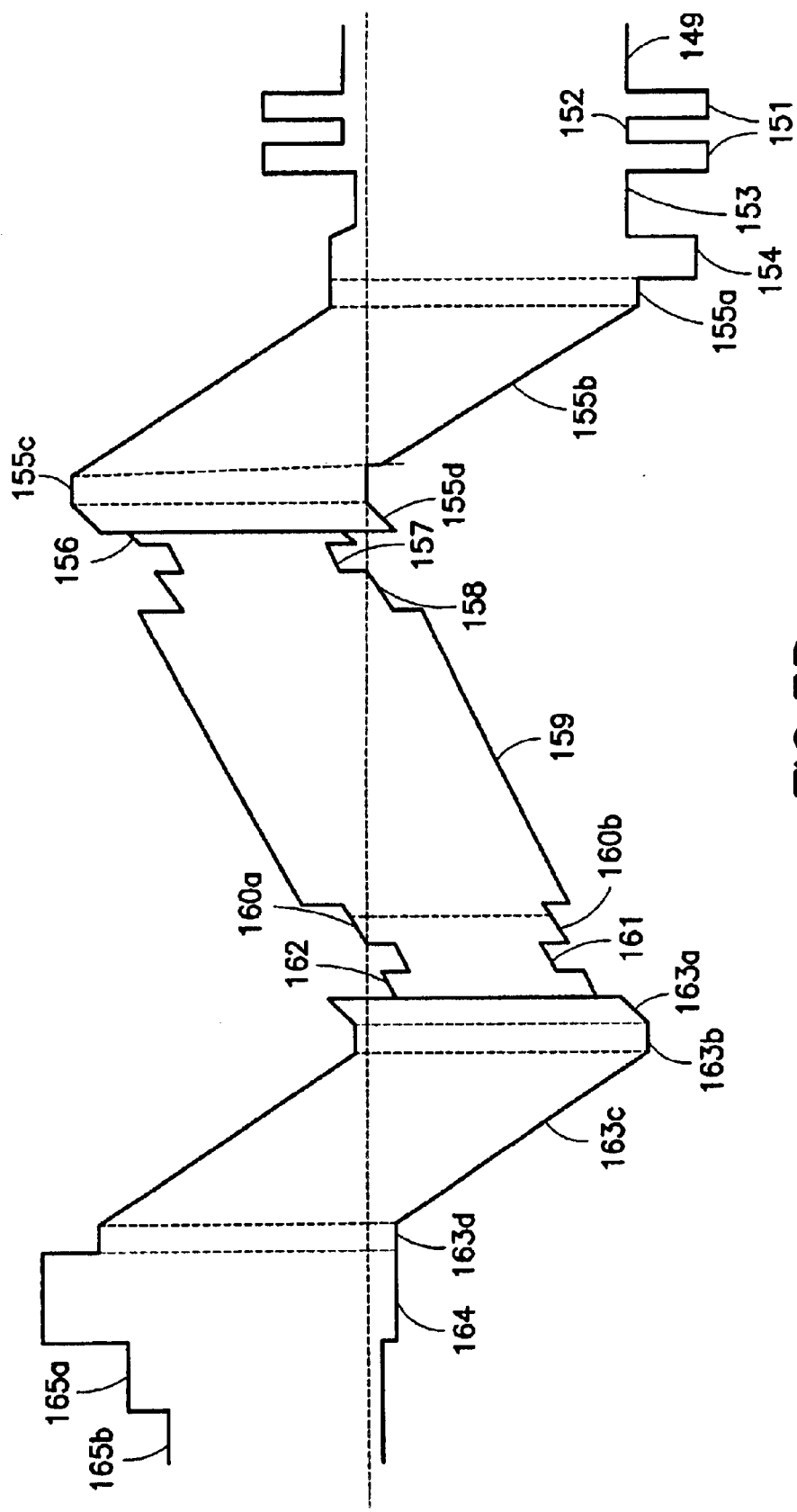
FIG. 3B shows the energy band diagram of the structure of FIG. 3A.

The Band Diagram of the FIG. 3A structure is shown in FIG. 3B.

To form a resonant cavity device where light is input into and emitted from the device laterally (i.e., from a direction normal to the cross section of FIG. 3A), a diffraction grating (as described in more detail in U.S. Pat. No. 6,021,243, incorporated by reference above in its entirety) and top DBR mirror are formed over the active device structure described above. When the heterojunction thyristor device is operating in the lasing mode, the diffraction grating performs the function of diffracting light produced by the vertical cavity into light propagating laterally in a waveguide which has the top DBR mirror and bottom DBR mirror as waveguide cladding layers and which has lateral confinement regions (typically formed by implants as described herein in more detail). When the heterojunction thyristor device is operating in the optical detection mode, the diffraction grating performs the function of diffracting incident light that is propagating in the lateral direction into the vertical cavity mode, where it is absorbed resonantly in the vertical cavity.

Alternatively, light may enter and exit the resonant vertical cavity vertically through an optical aperture in the top surface of the device. In this case, the diffraction grating is omitted, the top DBR mirror defines a cavity for the vertical emission and absorption of light, and the device operates as a vertical cavity surface emitting laser/detector. The distance between the top DBR mirror and bottom DBR mirror preferably represents an integral number of ¼ wavelengths at the designated wavelength. Preferably, the thickness of layer 164 or 159 is adjusted to enable this condition.

Figure 3C:
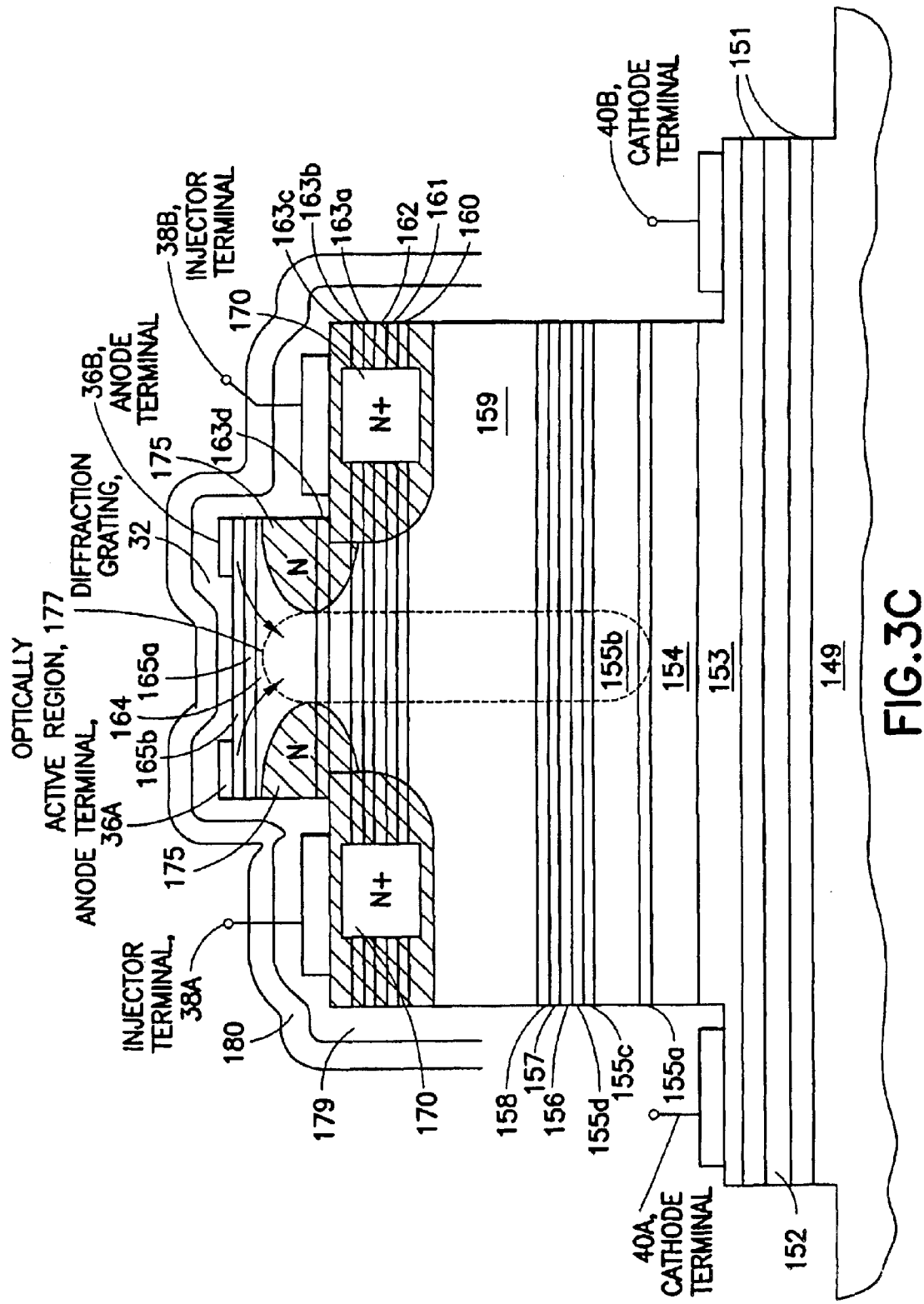
FIG. 3C is a cross-sectional schematic view showing the generalized construction of an exemplary heterojunction thyristor formed from the layer structure of FIG. 3A.

Using the structure described above with respect to FIGS. 3A and 3B, a heterojunction thyristor can be realized as shown in FIG. 3C. To connect to the anode of the device, alignment marks (not shown) are defined by etching, and then a layer of $Si_3N_4$ or $Al_2O_3$ or other suitable dielectric (not shown) is deposited to act as protection for the surface layer and as a blocking layer for subsequent ion implants. This dielectric layer also forms the first layer of the top DBR mirror. Then an ion implant 175 of n-type is performed using a photomask that is aligned to the alignments marks, and an optical aperture is defined by the separation between the implants 175. The implants 175 create a p-n junction in the layers between the n-type quantum wells and the surface, and the aperture between the implants defines the region in which the current may flow, and therefore the optically active region 177 as shown. The current cannot flow into the n-type implanted regions 175 because of the barrier to current injection. The current flow trajectory is shown in FIG. 3C as arrows. The laser threshold condition is reached before the voltage for turn-on of this barrier. Following the implant, the refractory anode terminals 36A and 36B (which collectively form the anode terminal 36 of the device) are deposited and defined.

N+ ion implants 170 are used to form self-aligned channel contacts to the n-type QW inversion channel(s). More specifically, the N+ implants are used as an etch stop to form a mesa via etching down (for example, to layer 163c) near the n-type QW channel(s). The N+ ion implants 170 are electrically coupled to the injector terminals 38A and 38B (which collectively form the injector terminal 38 of the device). The injector terminals 38A and 38B are preferably formed via deposition of an n-type Au alloy metal on the N+ ion implants 170 to form ohmic contacts thereto. In the event that injector terminals of the device are coupled to the p-type QW inversion channel(s), P+ ion implants (not shown) are used to form self-aligned channel contacts to the p-type QW inversion channel(s). In this case, injector terminals 38A and 38B are preferably formed via deposition of an p-type Au alloy metal on the P+ ion implants to form ohmic contacts thereto.

Alternatively, first injector terminals may be operably coupled to the n-type QW channel(s) while second injector terminals are operably coupled to the P-type QW channel(s). These channel contacts enable switching of the thyristor with n-type and/or p-type high impedance signals via the injector terminals. Connection to the cathode terminals 40A and 40B (which collectively form the cathode terminal 40 of the device) is provided by etching to the N+ bottom layer 153, and depositing a metal layer (for example AuGe/Ni/Au) to form an ohmic contact to N+ bottom layer 153. The resulting structured is isolated from other devices by etching down to the substrate 149. The structure is then subject to rapid thermal anneal (RTA) to activate the implants.

To form a device suitable for in-plane optical injection into a resonant vertical cavity and/or in plane optical emission from the resonant vertical cavity, a diffraction grating (as described in more detail in U.S. Pat. No. 6,021,243, incorporated by reference above in its entirety) and top DBR mirror are formed on this structure as described above. To form a device suitable for vertical optical injection into (and/or optical emission from) a resonant vertical cavity, the diffraction grating is omitted. The diffraction grating, when used, is created over the active device structure described above. The top DBR mirror is preferably created by the deposition of one or more dielectric layer pairs (179,180), which typically comprise $SiO_2$ and a high refractive index material such as GaAs, Si, or GaN, respectively.

FIG. 3D illustrates an alternate epitaxial growth structure utilizing group III–V materials for realizing a heterojunction thyristor and associated optoelectrical/optical devices in accordance with the present invention. The structure of FIG. 3D can be made, for example, using known molecular beam epitaxy (MBE) techniques. Similar to the growth structure of FIG. 3A, a first semiconductor layer 151 of AlAs and a second semiconductor layer 152 of GaAs are alternately deposited (with preferably at least seven pairs) upon a semi-insulating gallium arsenide substrate 149 in sequence to form the top dielectric distributed bragg reflector (DBR) mirror 12. The number of AlAs layers will preferably always be one greater than the number of GaAs layers so that the first and last layers of the mirror are shown as layer 151. In the preferred embodiment the AlAs layers 151 are subjected to high temperature steam oxidation to produce the compound $Al_xO_y$ so that a mirror will be formed at the designed center wavelength. Therefore the thicknesses of layers 151 and 152 in the mirror are chosen so that the final optical thickness of GaAs and $Al_xO_y$ is a quarter wavelength of the center wavelength $\lambda_D$. Alternatively the mirrors could be grown as alternating layers of one quarter wavelength thickness of GaAs and AlAs at the designed wavelength so that the oxidation step is not used. In that case, many more pairs are required (with typical numbers such as 22 pairs) to achieve the reflectivity needed for efficient lasing.

Deposited upon the mirror is the active device structure which consists of two HFET devices. The first of these is the above-described p-channel HFET (PHFET) 11, which has one or more p-type modulation doped quantum wells and is positioned with the gate terminal on the bottom (i.e. on the mirror 12 just described) and the collector terminal above. The second of these is an n-channel HFET (NHFET) 13, which has one or more n-type modulation doped quantum wells and is positioned with the gate terminal on top and the collector terminal below. The collector region of the NHFET device 13 also functions as the collector region of the PHFET device 11. However, the collector terminal of the NHFET device 13 is a p-type contact to p-type quantum well(s) disposed below (above) the collector region, while the collector terminal of the PHFET device 11 is a n-type contact to n-type quantum well(s) disposed above the collector region. Therefore a non-inverted n-channel device is stacked upon an inverted p-channel device to form the active device structure.

The active-device layer structure begins with layer 153 of N+ type GaAs that enables the formation of ohmic contacts thereto (for example, when contacting to the cathode terminal of a heterojunction thyristor device, the gate terminal of an inverted p-channel HFET device, the sub-collector terminal of an n-channel HFET device, or the emitter terminal of a p-type quantum-well-base bipolar transistor device). Layer 153 has a typical thickness of 1000–2000 Å and a typical n-type doping of $3.5 \times 10^{18}$ cm$^{-3}$. The N+ doped GaAs layer 153 corresponds to the ohmic contact layer 14 of FIG. 2A. Deposited on layer 153 is layer 166a of n-type AlAs having a typical thickness of 30–200 Å and a typical n-type doping of $3.5 \times 10^{18}$ cm$^{-3}$. One constraint upon the thickness and the doping of this layer 166A is that it should not be depleted in any range of operation of the device, i.e. the total doping in this layer should exceed the total doping charge contained in the layer 155c described below. This layer 166a serves optically as the lower waveguide cladding layers for all laser, amplifier and modulator structures. In addition, it also acts as a etch stop layer (described below in more detail) when forming contacts to the ohmic contact layer 153. Another constraint on the thickness of layer 166a is that it must be made sufficiently thin to enable hole current to flow through it by tunneling. In this manner, the thickness of this layer 166a determines the current gain of an inverted p-type quantum-well-base bipolar transistor device realized in this growth structure. Next is a layer 166b of undoped GaAs having a typical thickness of 6–20 Å. This layer 166b serves to prevent oxidation of the layer 166a during subsequent oxidation operations (e.g., where the bottom DBR mirror layers 151/152 are oxidized). In addition, undoped GaAs layer 166b is advantageous in a single aluminum effusion cell MBE system because it accommodates a growth interruption to change the growth temperature between layers 166a and 155b as required.

Next are three layers (155b, 155c, and 155d) of $Al_{x2}Ga_{1-x2}$As. These three layers have a total thickness about 300–500 Å and where x2 is about 15%. The first layer 155b is about 200–300 Å thick and is undoped. The second layer 155c is about 80 Å thick and is doped P+ type in the form of delta doping with a typical concentration of $3.5 \times 10^{18}$ cm$^{-3}$. And the third layer 155d is about 20–30 Å thick and is undoped. This layer 155d forms the lower separate confinement heterostructure (SCH) layer for the laser, amplifier and modulator devices. The N+ AlAs layer 166a corresponds to the n-type layer 16 of FIG. 2A, and the undoped GaAs layer 166b and the undoped GaAs layer 155b corresponds to the undoped spacer layer 18 of FIG. 2A. To realize a p-type quantum-well-base bipolar transistor device (and/or a p-channel HFET) with a cutoff frequency of about 40 GHz, the thickness of layers 166b and 155b are preferably on the order of 300 Å. And to realize a p-type quantum-well-base bipolar transistor (and/or a p-channel HFET) with a cutoff frequency of about 90 GHz, the thickness of layers 166b and 155b are preferably on the order of 250 Å.

The next layers define the quantum well(s) that form the inversion channel(s) during operation of the PHFET 11. For a strained quantum well, this consists of a spacer layer 156 of undoped GaAs that is about 10–25 Å thick and then combinations of a quantum well layer 157 (that is about 40–80 Å thick) and a barrier layer 158 of undoped GaAs. The quantum well layer 157 may be comprised of a range of compositions. In the preferred embodiment, the quantum well is formed from a $In_{0.2}Ga_{0.8}AsN$ composition with the nitrogen content varying from 0% to 5% depending upon the desired natural emission frequency. Thus, for a natural emission frequency of 0.98 μm, the nitrogen content will be 0%; for a natural emission frequency of 1.3 μm, the nitrogen content will be approximately 2%; and for a natural emission frequency of 1.5 μm, the nitrogen content will be approximately 4–5%. The well-barrier combination will typically be repeated (for example, three times as shown) to define the quantum wells that form the inversion channels during operation of the PHFET 11 (however single quantum well structures are also possible). Unstrained quantum wells are also possible. Following the last barrier of undoped GaAs is a layer 167 of undoped GaAs and a layer 159 of undoped $Al_{x2}Ga_{1-x2}As$. The undoped GaAs layer 167 has a typical thickness of 250–500 Å, and the undoped $Al_{x2}Ga_{1-x2}As$ layer 159 has a typical thickness of 0.5 μm. These layers 167 and 159 form the collector of the PHFET device 11. The purpose of the GaAs layer 167 is to accommodate a change in the growth temperature from about 530° C. (as required for the InGaAs quantum well structure of layer 157) to about 610° C. (as required for $Al_{x2}Ga_{1-x2}As$ layer 159). Layer 167 performs no electrical purpose and so it should be electrically totally transparent to all current flows. Therefore, layer 167 is thin enough that currents may conduct through it by tunneling with negligible voltage drop. All of the layers grown thus far form the PHFET device 11 with the gate contact on the bottom. The layers between the P+ AlGaAs layer 155c and the last undoped GaAs barrier layer 158 correspond to the p-type modulation doped heterojunction QW structure 20 of FIG. 2A. Undoped GaAs layer 167 and undoped AlGaAs layer 159 corresponds to the undoped spacer layer 22 of FIG. 2A.

Layers 167 and 159 also form the collector region of the NHFET device 13. Deposited on layer 159 are two layers 160a, 160b (collectively 160) of undoped GaAs of about 200–250 Å total thickness, which form the barrier of the first n-type quantum well. Layer 160 is thicker than the normal barrier layer of about 100 Å because it accommodates a change of the growth temperature from 610° C. (as required for the $Al_{x2}Ga_{1-x2}As$ layer 159) to about 530° C. (as required for the $In_{0.2}Ga_{0.8}As$ quantum well layer 161). The next layer 161 is the quantum well of $In_{0.2}Ga_{0.8}As$, which is undoped and about 40–80 Å in thickness. The quantum well layer 161 may be comprised of a range of compositions as described above with respect to the quantum well layer 157. In the preferred embodiment, the quantum well is formed from an $In_{0.2}Ga_{0.8}AsN$ composition with the nitrogen content varying from 0% to 5% depending upon the desired natural emission frequency. It is noted that the n-type quantum well layer 161 need not be of the same formulation as the p-type quantum well layer 157. The barrier-well combination will typically be repeated (for example, three times as shown) to define the quantum wells that form the inversion channel(s) during operation of the NHFET 13. Then there is a barrier layer 162 of about 10–30 Å of undoped GaAs which accommodates a growth interruption and a change of growth temperature.

Next there are three layers (163a, 163b, 163c) of $Al_{x2}Ga_{1-x2}As$ of about 300–500 Å total thickness. These three layers include a spacer layer 163a of undoped $Al_{x2}Ga_{1-x2}As$ that is about 20–30 Å thick, a modulation doped layer 163b of N+ type doping of $Al_{x2}Ga_{1-x2}As$ (with doping about $3.5\times10^{18}$ cm$^{-3}$) that is about 80 Å thick, and a spacer layer 163c of undoped $Al_{x2}Ga_{1-x2}As$ that is about 200–300 Å thick. Next is a layer 168a of undoped GaAs that is about 6–20 Å thick, and a P+ type doped layer 168b of AlAs (with doping about $3.5\times10^{18}$ cm$^{-3}$) that is about 300 Å. In contrast to layer 163b which is always depleted, layer 168b should never be totally depleted in operation (i.e., the total doped charge in layer 168b should always exceed that in layer 163b). Layers 168b and 163b (and the undoped spacer layers 163c and 168a therebetween) form the two plates of a parallel plate capacitor which forms the field-effect input to all active devices. For the optoelectronic device operation, layer 163a is the upper SCH region. Layer 168b also acts as a etch stop layer (described below in more detail) when forming contacts to the N-type inversion channel(s) of the NHFET 13 (for example, when contacting to the N-channel injector terminal(s) of a heterojunction thyristor device, the source/drain terminals of an n-channel HFET device, the base terminal of an n-type p-type quantum-well-base bipolar transistor, or the collector terminal of a p-type quantum-well-base bipolar transistor device). Layer 168a serves to prevent oxidation of previous layers 163a, 163b, 163c of $Al_{x2}Ga_{1-x2}As$ during subsequent oxidation operations (e.g., where the bottom DBR mirror layers are oxidized). Moreover, similar to layer 166b, layer 168a must be made sufficiently thin to enable electron current to flow through it by tunneling. In this manner, the thickness of this layer 168a determines the current gain of an n-type quantum-well-base bipolar transistor device realized in this growth structure. In addition, undoped GaAs layer 168a is advantageous in a single aluminum effusion cell MBE system because it accommodates a growth interruption to change the growth temperature between layers 163c and 168b as required. The layers between the undoped GaAs barrier layer 160a and the N+ AlGaAs layer 163b correspond to the n-type modulation doped heterojunction QW structure 24 of FIG. 2A. Undoped AlGaAs layer 163c and undoped GaAs layer 168a corresponds to the undoped spacer layer 26 of FIG. 2A. To realize an n-type quantum-well-base bipolar transistor (and/or an n-channel HFET) with a cutoff frequency of about 40 GHz, the thickness of layers 163c and 168a are preferably on the order of 300 Å. And to realize an n-type quantum-well-base bipolar transistor (and/or an n-channel HFET) with a cutoff frequency of about 90 GHz, the thickness of layers 163c and 168a are preferably on the order of 250 Å.

A layer 164 of p-type GaAs is deposited next to form part of the upper waveguide cladding layer for the laser, amplifier and modulator devices. It also forms a spacer layer in which to accommodate the aperture implant which steers the current into the VCSEL active region. It should provide a low resistance access to the top contact. It has a typical thickness of 300 Å. The p-type layers 168b and 164 correspond to the p-type layer(s) 28 of FIG. 2A.

Deposited next is an ohmic contact layer 165 (which may comprise a single layer of GaAs or a combination of GaAs (165a) and InGaAs (165b) as shown). In the illustrative embodiment shown, GaAs layer 165a is about 50–100 Å thick and doped to a very high level of P+ type doping (about $1\times10^{20}$ cm$^{-3}$) and InGaAs layer 165b is about 25–50 Å thick and doped very high level of P+ type doping (about $1\times10^{20}$ cm$^{-3}$) to enable the best possible ohmic contact.

Figure 3E:
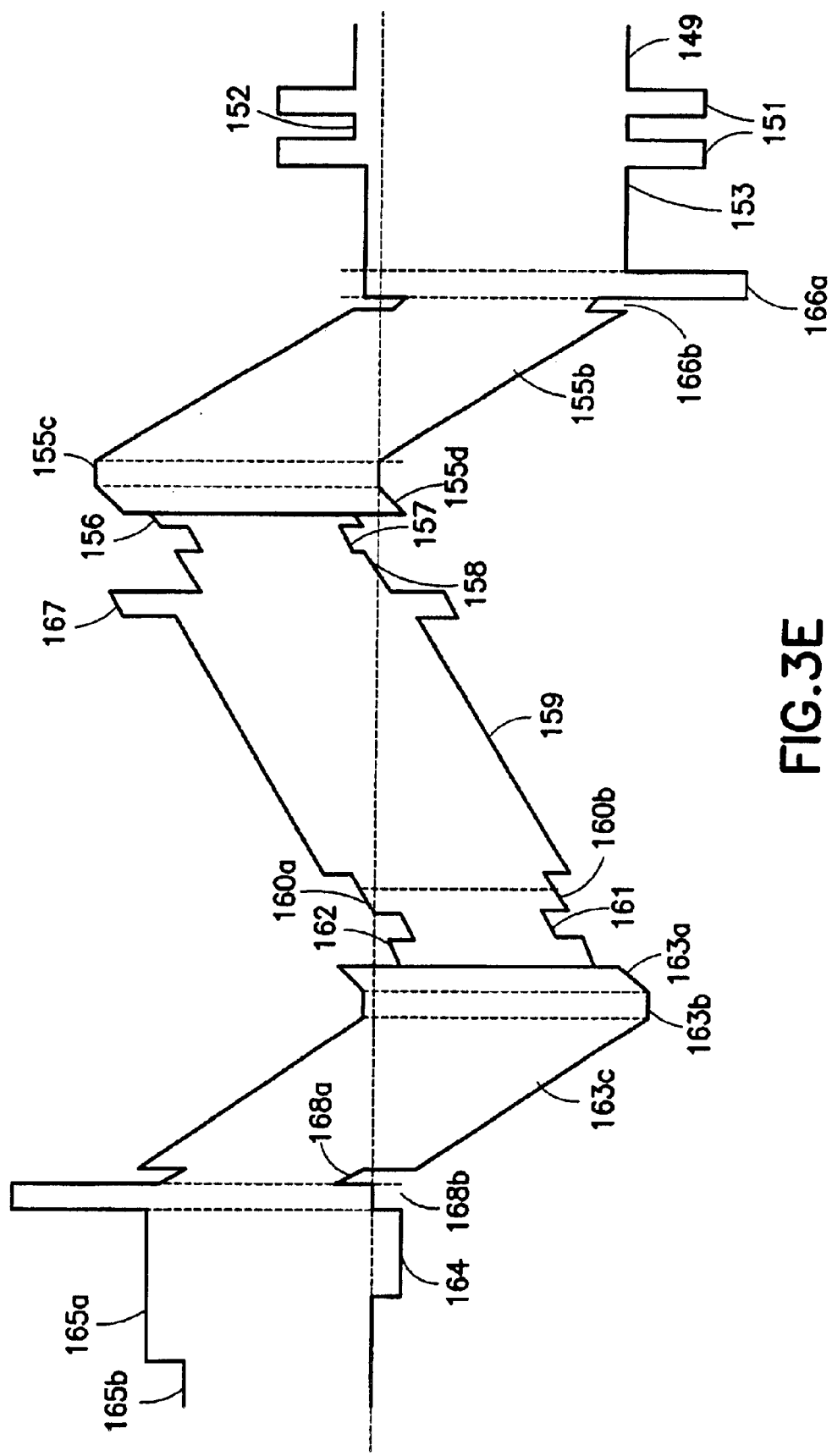
FIG. 3E shows the energy band diagram of the structure of FIG. 3D.

The band diagram of the FIG. 3D structure is shown in FIG. 3E.

To form a resonant cavity device where light is input into and emitted from the device laterally (i.e., from a direction normal to the cross section of FIG. 3D), a diffraction grating (as described in more detail in U.S. Pat. No. 6,021,243, incorporated by reference above in its entirety) and top DBR mirror are formed over the active device structure described above. When the heterojunction thyristor device is operating in the lasing mode, the diffraction grating performs the function of diffracting light produced by the vertical cavity into light propagating laterally in a waveguide which has the top DBR mirror and bottom DBR mirror as waveguide cladding layers and which has lateral confinement regions (typically formed by implants as described herein in more detail). When the heterojunction thyristor device is operating in the optical detection mode, the diffraction grating performs the function of diffracting incident light that is propagating in the lateral direction into the vertical cavity mode, where it is absorbed resonantly in the vertical cavity.

Alternatively, light may enter and exit the resonant vertical cavity vertically through an optical aperture in the top surface of the device. In this case, the diffraction grating is omitted, the top DBR mirror defines a cavity for the vertical emission and absorption of light, and the device operates as a vertical cavity surface emitting laser/detector. The distance between the top DBR mirror and bottom DBR mirror preferably represents an integral number of ¼ wavelengths at the designated wavelength. Preferably, the thickness of layer 164 or 159 is adjusted to enable this condition.

Figure 3F:
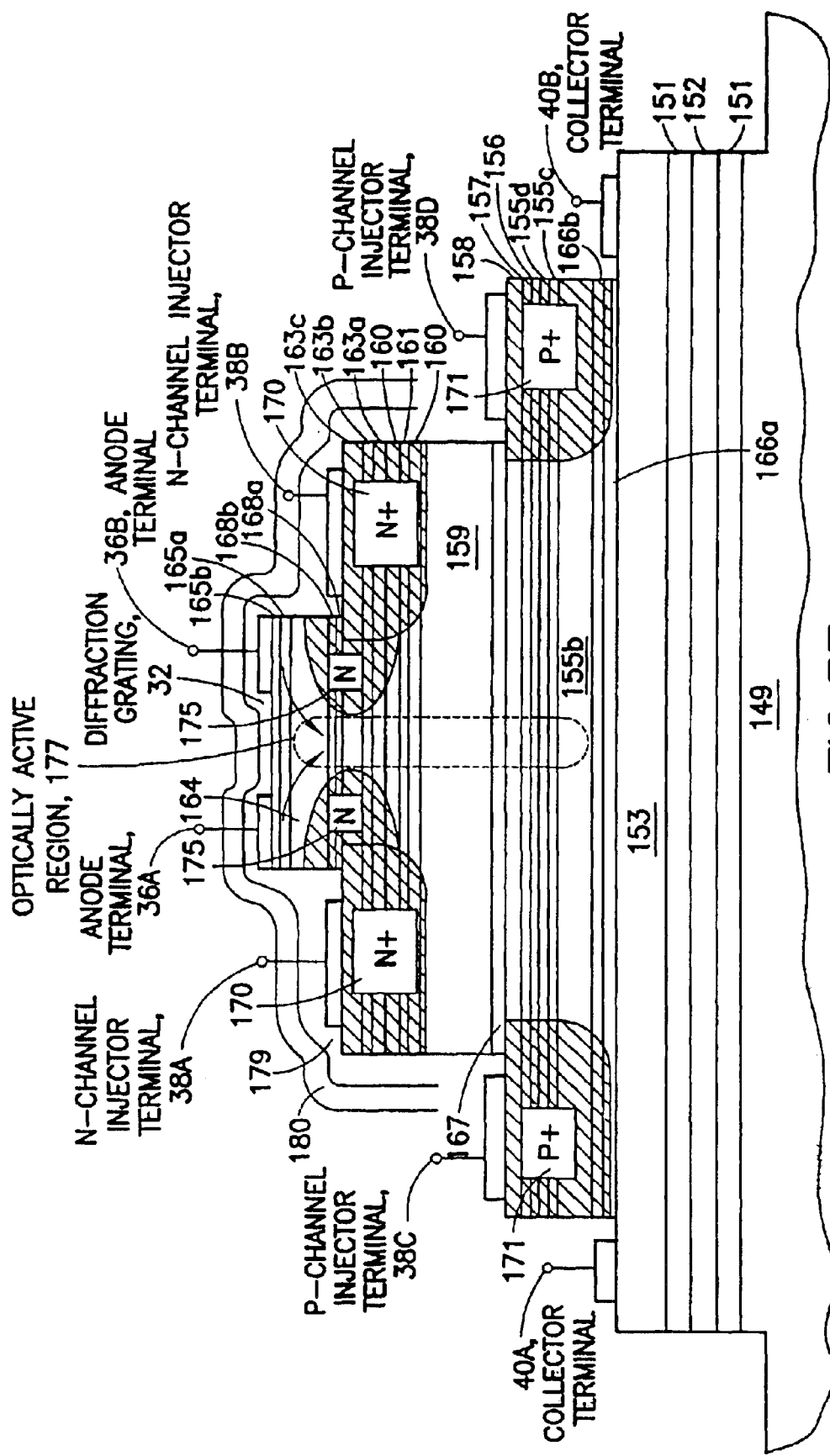
FIG. 3F is a cross-sectional schematic view showing the generalized construction of an exemplary heterojunction thyristor formed from the layer structure of FIG. 3D.

Using the structure described above with respect to FIGS. 3D and 3E, a heterojunction thyristor can be realized as shown in FIG. 3F. To connect to the anode of the device, alignment marks (not shown) are defined by etching, and then a layer of $Si_3N_4$ or $Al_2O_3$ or other suitable dielectric (not shown) is deposited to act as protection for the surface layer and as a blocking layer for subsequent ion implants. Preferably, this dielectric layer also forms the first layer of the top DBR mirror. Then an ion implant 175 of n-type is performed using a photomask that is aligned to the alignments marks, and an optical aperture is defined by the separation between the implants 175. The implants 175 create a p-n junction in the layers between the n-type quantum well(s) and the surface, and the aperture between the implants defines the region in which the current may flow, and therefore the optically active region 177 as shown. The current cannot flow into the n-type implanted regions 175 because of the barrier to current injection. The current flow trajectory is shown in FIG. 3F as arrows. The laser threshold condition is reached before the voltage for turn-on of this barrier. Following the implant 175, the refractory anode terminals 36A and 36B (which collectively form the anode terminal 36 of the device) are deposited and defined.

Then an ion implant 170 of n+-type is performed using a photomask that is aligned to the alignments marks, to thereby form contacts to the n-type QW inversion channel(s). During this operation, a chlorine-based gas mixture that includes fluorine is used as an etchant to etch down to the etch-stop layer 168b. The etch rate through the InGaAs layer 165b and GaAs layers (165a and 164) is fairly rapid. However, because of the presence of fluorine in the etchant, the etch rate decreases drastically when the AlAs layer 168b is encountered. This is because the AlAs layer 168b has a high percentage of Aluminum, which forms AlF in the presence of the etch mixture. The AlF deposits on the surface of the structure and prevents further etching (because it is non-volatile and not etched by any of the conventional etchants). In this manner, the AlAs layer 168b operates as an etch stop layer. This layer is then easily dissolved in de-ionized (DI) water or wet buffered hydrofluoric acid (BHF) to form mesas at the undoped GaAs layer 168a. The resulting mesas at the undoped GaAs layer 168a is subject to the N+ ion implants 170, which are electrically coupled to the N-channel injector terminals 38A and 38B. The N-channel injector terminals 38A and 38B are preferably formed via deposition of an n-type Au alloy metal on the N+ ion implants 170 to form ohmic contacts thereto.

Then an ion implant 171 of p+-type is performed using a photomask that is aligned to the alignments marks, to thereby form contacts to the p-type QW inversion channel(s). During this operation, mesas are formed by etching preferably down to the undoped GaAs layer 158. The resulting mesas are then subject to P+ ion implants 171, which are electrically coupled to the P-channel injector terminals 38C and 38D. The P-channel injector terminals 38C and 38D are preferably formed via deposition of an p-type alloy metal on the P+ ion implants 171 to form ohmic contacts thereto.

In alternative embodiments, the P+ ion implants 171 (and corresponding P-channel injector terminals 38C and 38D) may be omitted. In such a configuration, the N-channel injector terminals 38A and 38B (which are coupled to the n-type inversion QW channel(s) of the NHFET 13 device by the N+ ion implants 170) are used to control charge in such n-type inversion QW channel(s) as described herein. In yet another alternative embodiment, the N+ ion implants 170 (and corresponding N-channel injector terminals 38A and 38B) may be omitted. In such a configuration, the P-channel injector terminals 38C and 38D (which are coupled to the p-type inversion QW channel(s) of the PHFET 11 device by the P+ ion implants 171) are used to control charge in such p-type inversion QW channel(s) as described herein.

Connection to the cathode terminals 40A and 40B the device is made by etching with a chlorine-based gas mixture that includes fluorine. This etch is performed down to the AlAs etch stop layer 166a as described above. This layer 166a is then easily dissolved in de-ionized (DI) water or wet buffered hydrofluoric acid (BHF) to form resulting mesas in the N+ layer 153. A metal layer (for example AuGe/Ni/Au) is deposited on the mesas at the N+ layer 153 to formed an ohmic contact thereto. The resulting structured is isolated from other devices by etching down to the substrate 149. The structure is then subject to rapid thermal anneal (RTA) to activate the implants.

To form a device suitable for in-plane optical injection into a resonant vertical cavity and/or in-plane optical emission from the resonant vertical cavity, a diffraction grating 32 (as described in more detail in U.S. Pat. No. 6,021,243, incorporated by reference above in its entirety) and top DBR mirror is deposited on this structure as described above. To form a device suitable for vertical optical injection into (and/or optical emission from) a resonant vertical cavity, the diffraction grating 32 is omitted. The top DBR mirror is preferably created by the deposition of one or more dielectric layer pairs (179,180), which typically comprise $SiO_2$ and a high refractive index material such as GaAs, Si, or GaN, respectively.

Turning now to FIGS. 4A through 5F, a heterojunction thyristor device, which is configured to convert a digital optical signal to a corresponding digital electrical signal as described above, is used as the basis for a photonic digital-to-analog converter that converts a digital word encoded by a plurality of input digital optical signals to an output analog electrical signal corresponding to the digital word.

Figure 4A:
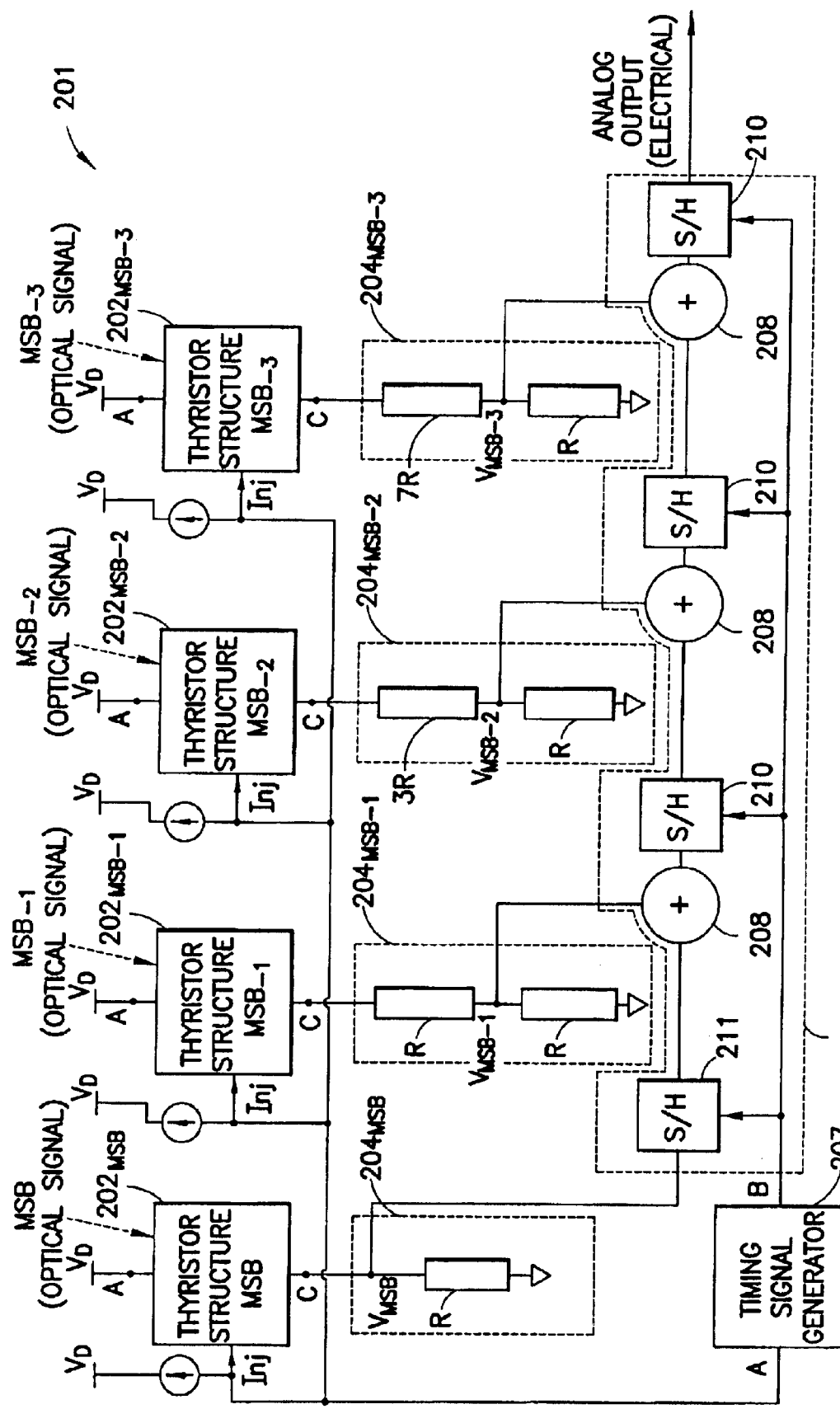
FIG. 4A is a functional block diagram illustrating a photonic digital-to-analog converter that converts a digital word encoded by a parallel digital optical signal (e.g., a plurality of synchronous optical bits) to an output analog electrical signal whose magnitude corresponds to the digital word in accordance with the present invention; in this configuration, electrical clock signals are used to perform the conversion operations.

A first exemplary embodiment of the photonic digital-to analog converter 201 is shown in FIG. 4A. The input digital optical signals synchronously encode a plurality of bits of information that are logically arranged from a most-significant-bit (MSB) to a least-significant-bit (LSB) as shown in FIGS. 4A and 4B(i). These bits form a digital word. In the exemplary embodiment shown, four (4) input digital optical signals encode four (4) bits of information logically arranged from a most-significant-bit (MSB) to a least-significant-bit ($MSB_{-3}$). A plurality of heterojunction thyristor devices (4 shown as $202_{MSB}$, $202_{MSB-1}$, $202_{MSB-2}$, $202_{MSB-3}$), each corresponding to a different input digital optical signal/bit, are formed in resonant cavities on at least one substrate. Preferably, the plurality heterojunction thyristor devices are integrally formed in resonant cavities on a common substrate. In addition, a plurality of voltage divider networks (4 shown as $204_{MSB}$, $204_{MSB-1}$, $204_{MSB-2}$, $204_{MSB-3}$), each corresponding to a different heterojunction thyristor device and input digital optical signal/bit, are operably coupled to the cathode terminal of the heterojunction thyristor devices ($202_{MSB}$, $202_{MSB-1}$, $202_{MSB-2}$, $202_{MSB-3}$). A summing circuit 206 is operably coupled to the voltage divider networks ($204_{MSB}$, $204_{MSB-1}$, $204_{MSB-2}$, $204_{MSB-3}$) as shown. A timing signal generator 207 generates an electrical timing signal A and an electrical timing signal B as shown in FIG. 4B(ii) and 4B(iii), respectively. The electrical timing signal A includes a sampling clock pulse whose duration defines a sampling period that overlaps the bits of information encoded in the input digital optical signals. The electrical timing signal B includes a summing clock pulse whose duration defines a summing period that is subsequent to the sampling period.

During conversion operations, the plurality of input optical signals are injected into the resonant cavities, where such signals are resonantly absorbed by the heterojunction thyristor devices ($204_{MSB}$, $202_{MSB-1}$, $202_{MSB-2}$, $202_{MSB-3}$). Each heterojunction thyristor device is configured (as described above with respect FIGS. 2B1, 2B3, 2C, and 2D1) to operate during a given sampling period to convert the input digital optical signal supplied thereto to a corresponding digital electrical signal. The voltage divider networks ($204_{MSB}$, $204_{MSB-1}$, $204_{MSB-2}$, $204_{MSB-3}$) are configured to scale the magnitude of the digital electrical signals produced by the heterojunction thyristor devices ($202_{MSB}$, $202_{MSB-1}$, $202_{MSB-2}$, $202_{MSB-3}$) to produce output electrical signals ($V_{MSB}$, $V_{MSB-1}$, $V_{MSB-2}$, $V_{MSB-3}$) whose magnitude corresponds to the bits encoded by the input digital optical signals. For example, the voltage divider networks ($204_{MSB}$, $204_{MSB-1}$, $204_{MSB-2}$, $204_{MSB-3}$) shown in FIG. 4A scale the magnitude of the digital electrical signals produced by the heterojunction thyristor devices ($202_{MSB}$, $202_{MSB-1}$, $202_{MSB-2}$, $202_{MSB-3}$) by factors of 1, ½, ¼, and ⅛, respectively, to produce output electrical signals as shown in the following table I.

TABLE I

| Output Electrical Signal | Voltage Level when the corresponding optical bit is ON | Voltage Level when the corresponding optical bit is OFF |
| --- | --- | --- |
| $V_{MSB}$ | $V_D$ | 0 |
| $V_{MSB-1}$ | $V_D/2$ | 0 |
| $V_{MSB-2}$ | $V_D/4$ | 0 |
| $V_{MSB-3}$ | $V_D/8$ | 0 |

The scaling function for a given voltage divider network can be represented generally by a scale factor of ($½^X$), where X is the difference between the position of the corresponding bit and the MSB.

The summing circuitry 206 operates during the summing period to sum the output electrical signals ($V_{MSB}$, $V_{MSB-1}$, $V_{MSB-2}$, $V_{MSB-3}$) produced by the voltage divider networks ($204_{MSB}$, $204_{MSB-1}$, $204_{MSB-2}$, $204_{MSB-3}$). The result of the summing operation performed by the summing circuitry 205, which is output from the summing circuitry 206, is an analog electric signal whose magnitude corresponds to the digital word encoded by the bits of the input digital optical signals. For example, the summing circuit 206 of FIG. 4A sums the four (4) output electrical signals to produce a resultant analog signal whose magnitude corresponds to the digital word encoded by the four(4) bits of the input digital optical signals as shown in the following table II.

TABLE II

| MSB (Optical) | $MSB_{-1}$ (Optical) | $MSB_{-2}$ (Optical) | $MSB_{-3}$ (Optical) | Analog Output (V) (Elect) |
| --- | --- | --- | --- | --- |
| 0 (OFF) | 0 | 0 | 0 | 0.0 |
| 0 | 0 | 0 | 1 (ON) | $V_D/8$ |
| 0 | 0 | 1 | 0 | $V_D/4$ |
| 0 | 0 | 1 | 1 | $3V_D/8$ |
| 0 | 1 | 0 | 0 | $V_D/2$ |
| 0 | 1 | 0 | 1 | $5V_D/8$ |
| 0 | 1 | 1 | 0 | $3V_D/4$ |
| 0 | 1 | 1 | 1 | $7V_D/8$ |
| 1 | 0 | 0 | 0 | $V_D$ |
| 1 | 0 | 0 | 1 | $9V_D/8$ |
| 1 | 0 | 1 | 0 | $5V_D/4$ |
| 1 | 0 | 1 | 1 | $11V_D/8$ |
| 1 | 1 | 0 | 0 | $3V_D/2$ |
| 1 | 1 | 0 | 1 | $13V_D/8$ |
| 1 | 1 | 1 | 0 | $7V_D/4$ |
| 1 | 1 | 1 | 1 | $15V_D/8$ |

Preferably, the summing circuitry 206 includes a chain of two-port adding nodes 208 and sample/hold circuits 210 arranged as pairs, each pair corresponding to a different voltage divider network ($204_{MSB-1}$, $204_{MSB-2}$, $204_{MSB-3}$) as shown. In this configuration, the output electrical signal generated by a given voltage divider network is supplied to an input node of the corresponding two-port adding node 208. In addition, a single sample/hold circuit 211 supplies an output electrical signal ($V_{MSB}$) whose magnitude corresponds to the MSB to the chain of two-port adding nodes 208 and sample/hold circuits 210. The sample and hold circuits 210 of this chain and the single sample and hold circuit 211 are activated during the summing period (which is defined by the duration of the summing clock pulse in the timing signal B as shown in FIG. 4B(iii)) to thereby effectuate the summing operation, which produces the output analog electrical signal as described above. In this configuration, each sample and hold circuit 210 and 211 includes an input capacitance that operates to store the electrical signal generated by a given voltage divider network and supplied thereto during a given sampling period for summation during the subsequent summing period.

Preferably, such conversion operations are repeated for another digital word that is subsequently encoded by the input digital optical signals supplied to the converter 201 as described above.

In the embodiment of FIG. 4A, each heterojunction thyristor device operates to convert the input digital optical signal supplied thereto to a corresponding digital electrical signal as described above with respect to FIGS. 2B1, 2B3, 2C, and 2D1. In this embodiment, the length and width of the given heterojunction thyristor device are sized such that it switches from a non-conducting/OFF state to a conducting/ON state when the combination of i) the injection of electrical energy into the QW channel(s) of the device from the electrical sampling clock pulse and ii) absorption of optical energy in the QW channel(s) of the device from the ON pulse of the input optical signal produces a channel current that exceeds the bias current $I_{BIAS}$ such that charge in the QW channel(s) of the device build to a level that is greater than the critical switching charge $Q_{CR}$. When the electrical sampling clock pulse terminates, the bias current $I_{BIAS}$ reduces the charge in QW channel(s) of the device to a level below the holding charge $Q_H$, thereby causing the device to switch from the conducting/ON state to the non-conducting/OFF state. Note that the device does not switch from the non-conducting/OFF state to the conducting/ON state in the event that either the electrical sampling clock pulse is not present or the input optical signal represents the OFF logic level. This occurs because these signals alone are not sufficient to produce the critical switching charge $Q_{CR}$.

In another aspect of the present invention, the heterojunction thyristor device can be configured to operate as an electrically-controlled sampling device (e.g., electrically-controlled switch), which is suitable for use in a sample and hold circuit (such as sample and hold circuits 210/211 in FIG. 4A) and in many other signal processing applications (such as switched capacitance filters and switched capacitance waveform generators). Two possible configurations are shown in FIGS. 4C and 4D, respectively.

Figure 4C:
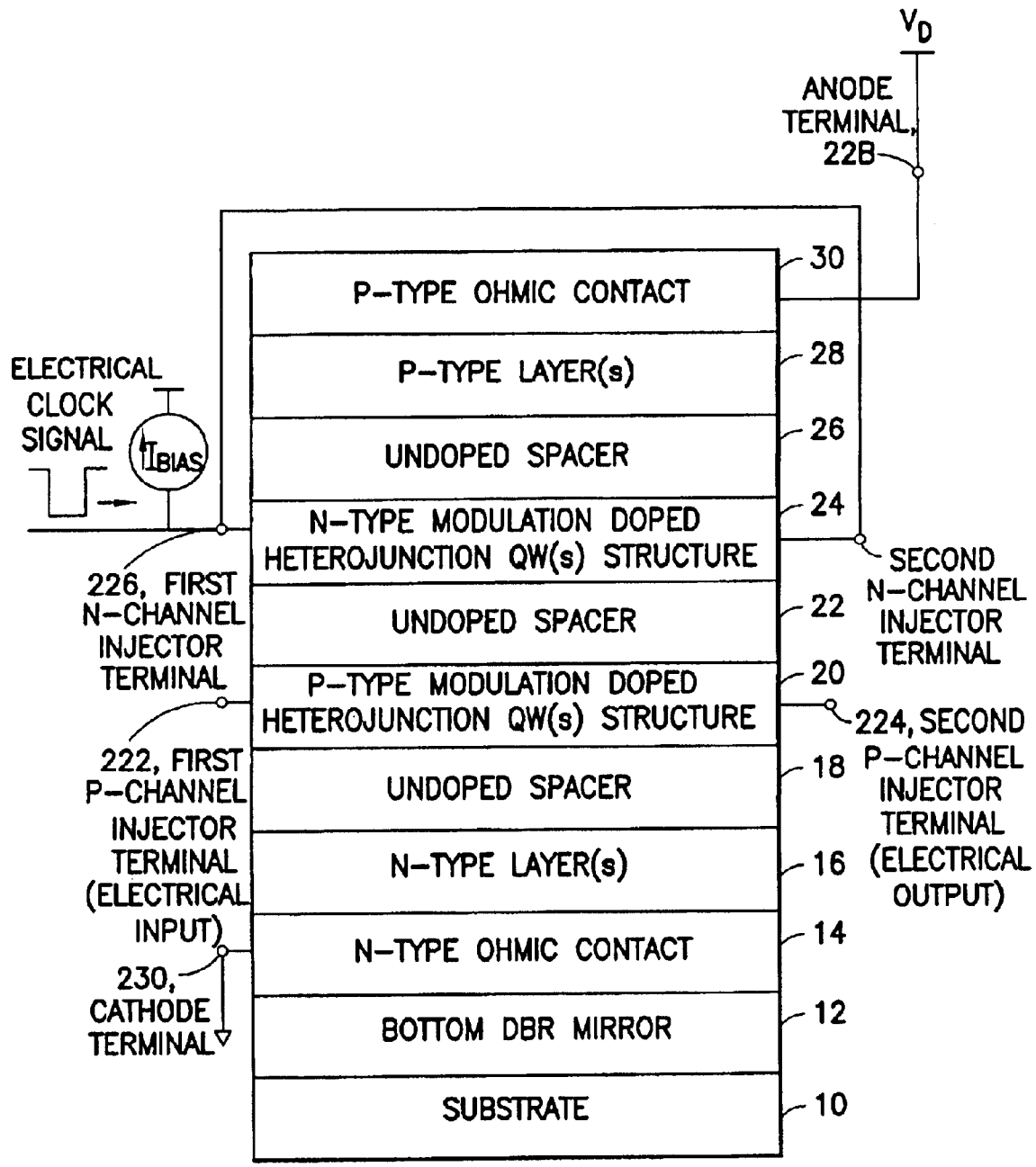
FIGS. 4C and 4D are cross-sectional schematics showing heterojunction thyristor devices configured to perform electrically-controlled sampling operations in response to an electrical clock signal supplied thereto; each of these configurations is suitable to realize the electrically-controlled sample and hold circuit of FIG. 4A.

In FIG. 4C, a first p-channel injector terminal 222 (the electrical input terminal) and a second p-channel injector terminal 224 (the electrical output terminal) are operably coupled to opposite ends of the p-type QW channel(s) of structure 20. An electrical sampling clock pulse in the form of a downward running electrical pulse is supplied to the n-channel injector terminal(s) 226 of the device. In addition, a bias current source is coupled to the n-channel injector terminal(s) 226 and draws charge from the n-type QW channel(s) to the positive supply voltage potential $V_D$. The anode terminal 228 is forward biased (e.g. biased positively) with respect to the cathode terminal 230. The length and width of the device are sized such that it switches from a non-conducting/OFF state to a conducting/ON state when the electrical energy injected into the n-type QW channel(s) of structure 24 by the electrical sampling clock pulse produces a channel current that exceeds the bias current $I_{BIAS}$ such that charge in the n-type QW channel(s) of structure 24 builds to a level that is greater than the critical switching charge $Q_{CR}$. When the electrical sampling clock pulse terminates, the bias current $I_{BIAS}$ reduces the charge in the n-type QW channel(s) to a level below the holding charge $Q_H$, thereby causing the device to switch from the conducting/ON state to the non-conducting/OFF state. Note that the device does not switch from the non-conducting/OFF state to the conducting/ON state in the event that the electrical sampling clock pulse is not present. This occurs because there is no injection of electrical energy into the QW channel(s) of the device to produce the critical switching charge $Q_{CR}$.

When the device is operating in the non-conducting/OFF state, the electrical input terminal 222 is electrically isolated from the electrical output terminal 224. However, when the device is operating in the conducting/ON state, the electrical input terminal 222 is electrically coupled to the electrical output terminal 224 (and there is minimal potential voltage differences between input terminal 222 and output terminal 224). In this manner, the heterojunction thyristor device operates as a sampling device (e.g., switch) that is selectively activated and deactivated by an electric control signal (e.g., the sample clock pulse).

Figure 4D:
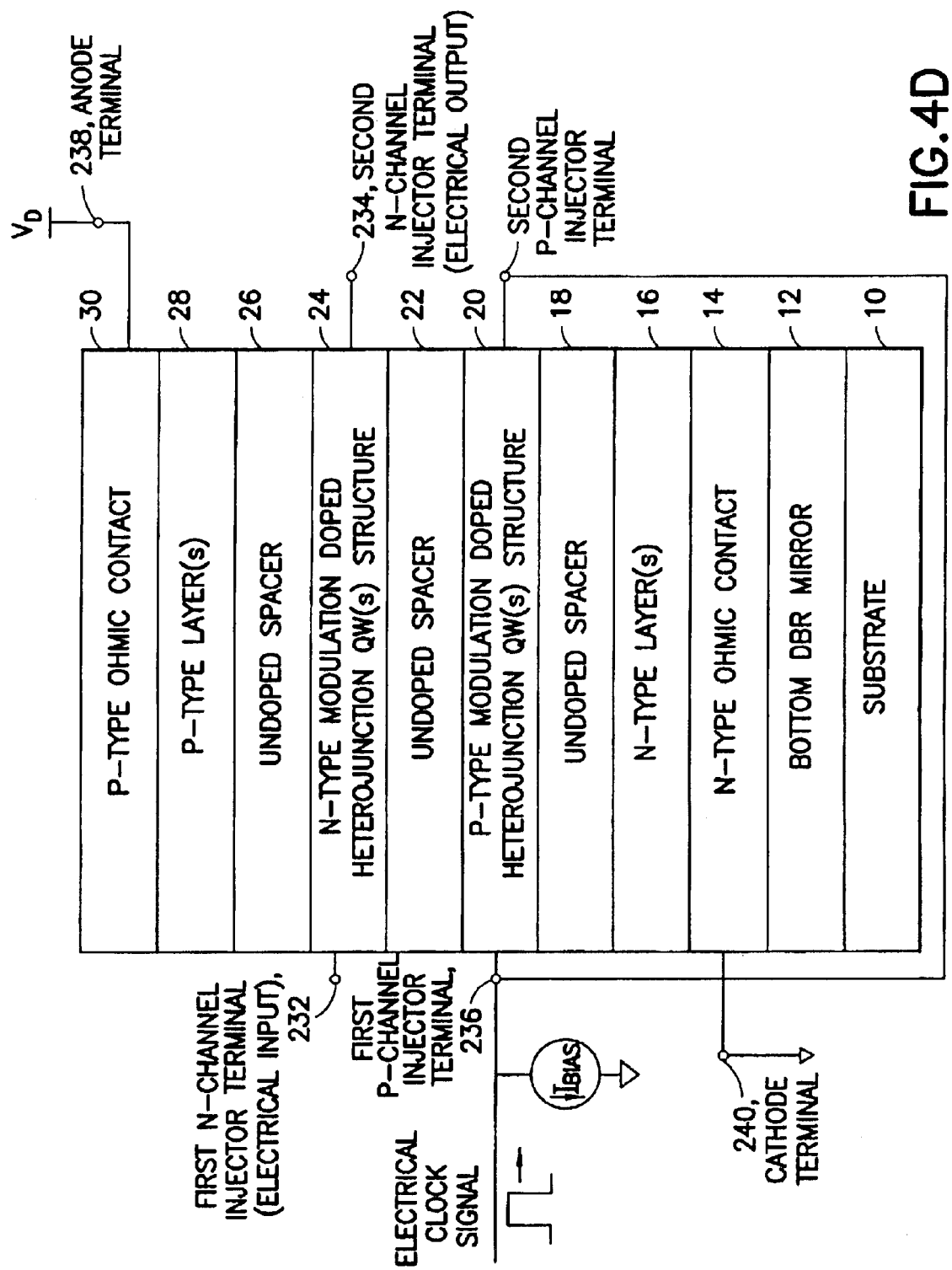

In FIG. 4D, a first n-channel injector terminal 232 (the electrical input terminal) and a second n-channel injector terminal 234 (the electrical output terminal) are operably coupled to opposite ends of the n-type QW channel(s) of structure 24. An electrical sampling clock pulse in the form of a upward running electrical pulse is supplied to the p-channel injector terminal(s) 236 of the device. In addition, a bias current source is coupled to the p-channel injector terminal(s) 236 and draws charge from the p-type QW channel(s) to the ground potential. The anode terminal 238 is forward biased (e.g. biased positively) with respect to the cathode terminal 240. The length and width of the device are sized such that it switches from a non-conducting/OFF state to a conducting/ON state when the electrical energy injected into the p-type QW channel(s) of structure 20 by the electrical sampling clock pulse produces a channel current that exceeds the bias current $I_{BIAS}$ such that charge in the p-type QW channel(s) of structure 20 builds to a level that is greater than the critical switching charge $Q_{CR}$. When the electrical sampling clock pulse terminates, the bias current $I_{BIAS}$ reduces the charge in the p-type QW channel(s) to a level below the holding charge $Q_H$, thereby causing the device to switch from the conducting/ON state to the non-conducting/OFF state. Note that the device does not switch from the non-conducting/OFF state to the conducting/ON state in the event that the electrical sampling clock pulse is not present. This occurs because there is no injection of electrical energy into the QW channel(s) of the device to produce the critical switching charge $Q_{CR}$.

When the device is operating in the non-conducting/OFF state, the electrical input terminal 232 is electrically isolated from the electrical output terminal 234. However, when the device is operating in the conducting/ON state, the electrical input terminal 232 is electrically coupled to the electrical output terminal 234 (and there is minimal potential voltage differences between input terminal 232 and output terminal 234). In this manner, the heterojunction thyristor device operates as a sampling device (e.g., switch) that is selectively activated and deactivated by an electric control signal (e.g., the sample clock pulse).

Figure 4E:
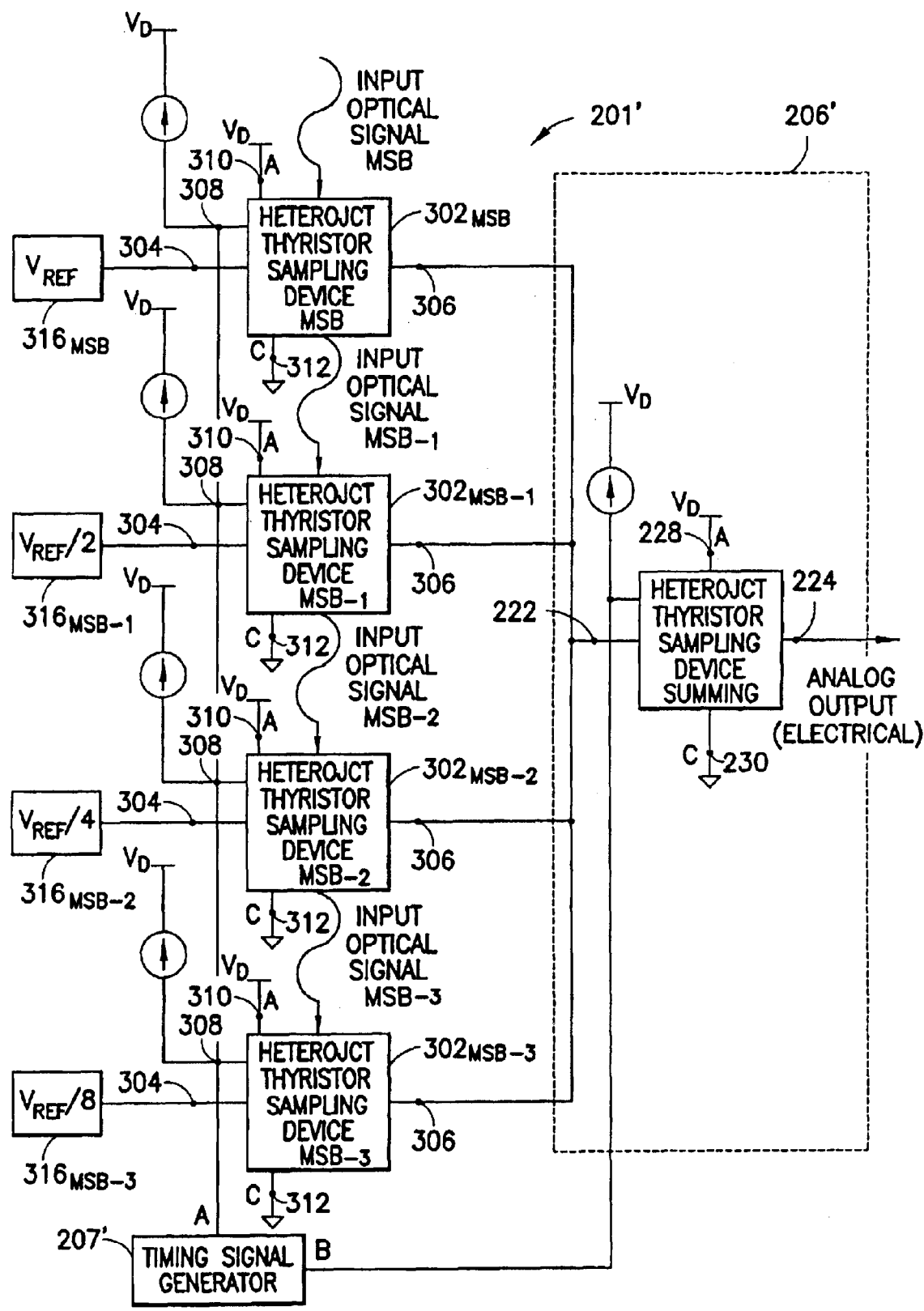
FIG. 4E is a functional block diagram illustrating a photonic digital-to-analog converter that converts a digital word encoded by a parallel digital optical signal (e.g., a plurality of synchronous optical bits) to an output analog electrical signal whose magnitude corresponds to the digital word in accordance with the present invention; in this configuration, electrical clock signals are used to perform the conversion operations.

Another photonic digital-to analog converter 201' is shown in FIG. 4E. Similar to the embodiment of FIG. 4A, the input digital optical signals synchronously encode a plurality of bits of information that are logically arranged from a most-significant-bit (MSB) to a least-significant-bit (LSB) as shown in FIG. 4B(i). These bits form a digital word. In the exemplary embodiment shown, four (4) input digital optical signals encode four (4) bits of information logically arranged from a most-significant-bit (MSB) to a least-significant-bit ($MSB_{-3}$). A plurality of heterojunction thyristor devices (4 shown as $302_{MSB}$, $302_{MSB-1}$, $302_{MSB-2}$, $302_{MSB-3}$), each corresponding to a different input digital optical signal/bit, are formed in resonant cavities on at least one substrate. Preferably, the plurality of heterojunction thyristor devices are integrally formed in resonant cavities on a common substrate. Each heterojunction thyristor device is configured as a sampling device (e.g., switch) in a manner similar to the sampling device described below with respect to FIGS. 6A and 6B, whereby the n-channel injector terminals form the electrical input terminal 304 and the electrical output terminal 306. A bias current source is coupled to the p-channel injector terminal(s) 308 and draws charge from the QW channel(s) coupled thereto. The anode terminal 310 is forward biased (e.g. biased positively) with respect to the cathode terminal 312. As described below in detail with FIGS. 6A and 6B, the length and width of each heterojunction-thyristor-based sampling device are sized such that it switches from a non-conducting/OFF state to a conducting/ON state when the combination of i) the injection of electrical energy into the QW channel(s) of the device from the electrical sampling clock pulse and ii) absorption of optical energy in the QW channel(s) of the device from the ON pulse of the input optical signal produces a channel current that exceeds the bias current $I_{BIAS}$ such that charge in the QW channel(s) of the device build to a level that is greater than the critical switching charge $Q_{CR}$.

When the electrical sampling clock pulse terminates, the bias current $I_{BIAS}$ reduces the charge in QW channel(s) of the device to a level below the holding charge $Q_H$, thereby causing the device to switch from the conducting/ON state to the non-conducting/OFF state. Note that the device does not switch from the non-conducting/OFF state to the conducting/ON state in the event that either the electrical sampling clock pulse is not present or the input optical signal represents the OFF logic level. This occurs because these signals alone are not sufficient to produce the critical switching charge $Q_{CR}$.

As shown in FIG. 4E, a clock generator 207' generates an electrical clock signal that is supplied to the n-channel injector terminal(s) 308 for injection into the QW channel(s) coupled thereto. The electrical clock signal includes downward running electrical clock pulses that define active sampling periods whose duration overlaps the bits of information encoded in the input digital optical signal as shown in FIG. 4B(i). The input digital optical signals are supplied to the resonant cavities for resonant absorption by the device 201'. A plurality of voltage references (4 shown as $316_{MSB}$, $316_{MSB-1}$, $316_{MSB-2}$, $316_{MSB-3}$), each corresponding to a different heterojunction thyristor device, are operably coupled to the electrical input terminal 304 of the corresponding heterojunction thyristor device. The voltage reference and corresponding heterojunction thyristor-based sampling device cooperate to generate at the electrical output terminal 306 a voltage signal ($V_{MSB}$, $V_{MSB-1}$, $V_{MSB-2}$, or $V_{MSB-3}$) representing the contribution of the bit in the digital word in accordance with the input digital optical signal supplied thereto. Examples of such voltage signals are shown above in table I. A summing circuit 206' is operably coupled to the output terminals of the heterojunction-thyristor-based sampling devices as shown. The summing circuitry 206' operates during the summing period to sum the voltage signals ($V_{MSB}$, $V_{MSB-1}$, $V_{MSB-2}$, and $V_{MSB-3}$) produced at the output terminals 306 of the sampling devices. The result of the summing operation performed by the summing circuitry 206', which is output from the summing circuitry 206, is an analog electric signal whose magnitude corresponds to the digital word encoded by the bits of the input digital optical signals. For example, the summing circuit 206' of FIG. 4E sums the four (4) output electrical signals to produce a resultant analog signal whose magnitude corresponds to the digital word encoded by the four(4) bits of the input digital optical signals as shown above in table II.

Preferably, the summing circuitry 206' includes a heterojunction-thyristor-based electrically-controlled sampling device as described above with respect to FIGS. 4C and 4D. In this configuration, the voltage signals ($V_{MSB}$, $V_{MSB-1}$, $V_{MSB-2}$, $V_{MSB-3}$) produced at the output terminals 306 of the plurality of heterojunction-thyristor-based sampling devices are supplied to the input terminal 222 of the sampling device of circuit 206', which is activated during the summing period (which is defined by the duration of the summing clock pulse in the timing signal B as shown in FIG. 4B(iii)) to thereby effectuate the summing operation, which produces the output analog electrical signal as described above. Note that the heterojunction-thyristor-based sampling device of circuit 206' includes an input capacitance that operates to store the sum of the voltage signals ($V_{MSB}$, $V_{MSB-1}$, $V_{MSB-2}$, $V_{MSB-3}$) produced at the output terminals 306 of the plurality of heterojunction-thyristor-based sampling devices and supplied to the input terminal 222 of the sampling device of circuit 206' for output during the subsequent summing period.

Preferably, such conversion operations are repeated for another digital word that is subsequently encoded by the input digital optical signals supplied to the converter 201' as described above.

In the illustrative embodiment shown in FIG. 4E, the voltage references $316_{MSB}$, $316_{MSB-1}$, $316_{MSB-2}$, $316_{MSB-3}$ supply voltage levels corresponding to maximum voltage level ($V_{REF}$) of the analog electrical signal divided by $2^I$, where I corresponds to the bit position in the digital word (e.g., I=0 for MSB, I=1 for MSB-1 . . . ). However, it should be noted that alternate configurations are possible with varying voltage reference source values.

In the embodiment of FIGS. 4A and 4E, the injector terminal of the device is operably coupled to the N-type QW channel(s) realized in the N-type modulation doped QW(s) structure of the device. In such a configuration, the sampling clock pulse of FIG. 4B(ii) is in the form of a downward running electrical pulse supplied to the injector terminal of the device. In addition, the bias current source draws charge from the n-type QW channel(s) to the positive supply voltage potential $V_D$. In an alternate embodiment, the injector terminal of the device may be operably coupled to the p-type QW channel(s) realized in the P-type modulation doped QW(s) structure of the device. In such a configuration, the sampling clock pulse of FIG. 4B(ii) is in the form of an upward running electrical pulse supplied to the injector terminal of the device. In addition, the bias current source draws charge from the p-type QW channel(s) to ground potential. Similarly, the summing clock pulse of FIG. 4B(iii) is shown as a downward running electrical clock pulse. Such a pulse is suitable to activate a heterojunction-based sample and hold circuit as described above with respect to FIG. 4C. Alternatively, the summing clock pulse of FIG. 4B(iii) can be an upward running electrical clock pulse. Such a pulse is suitable to activate a heterojunction-thyristor-based sample and hold circuit as described above with respect to FIG. 4D.

Figure 5A:
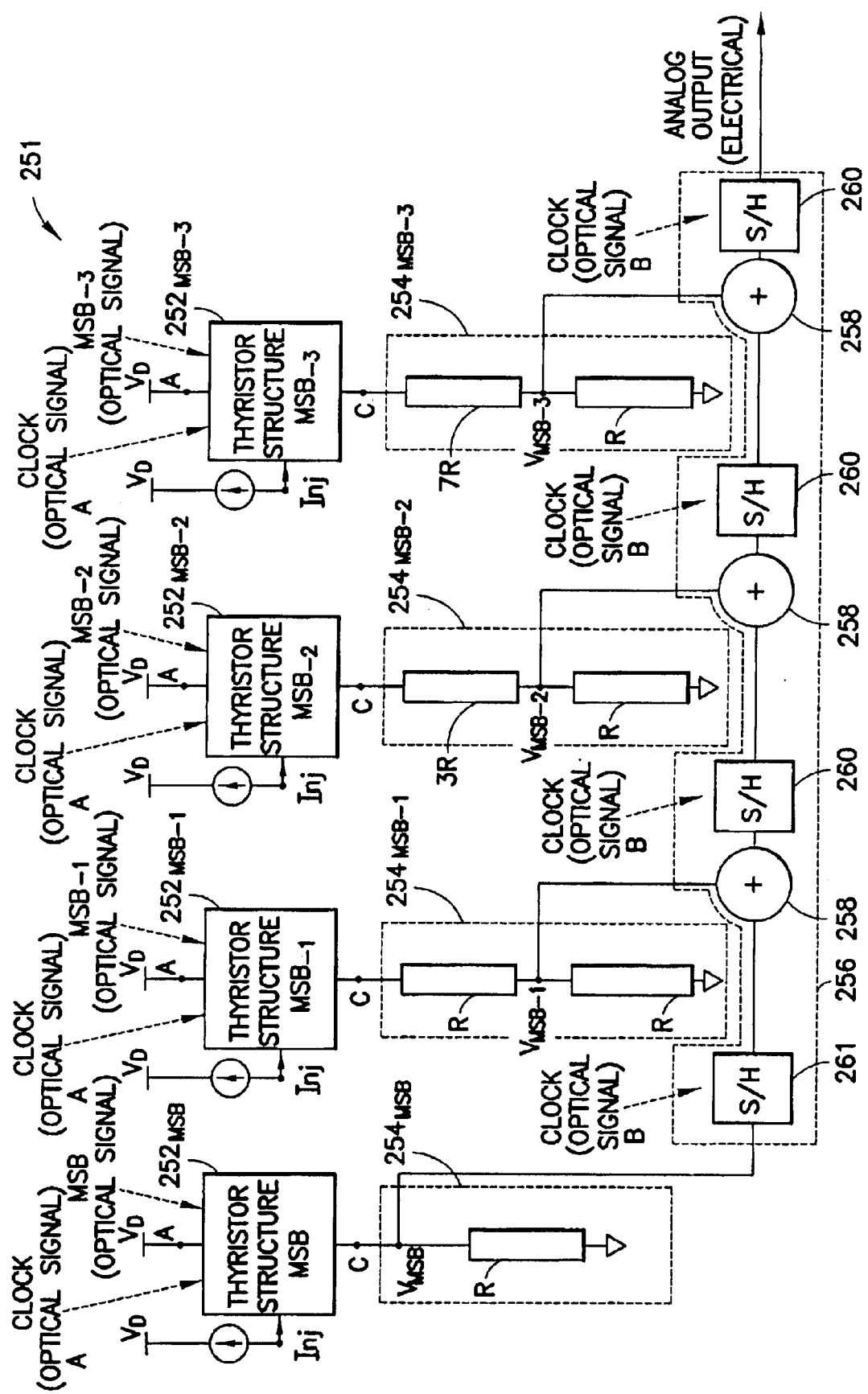
FIG. 5A is a functional block diagram illustrating a photonic digital-to-analog converter that converts a digital word encoded by a parallel digital optical signal (e.g., a plurality of synchronous optical bits) to an output analog electrical signal whose magnitude corresponds to the digital word in accordance with the present invention; in this configuration, optical clock signals are used to perform the conversion operations.

Another photonic digital-to analog converter 251 is shown in FIG. 5A. Similar to the embodiment of FIG. 4A, the input digital optical signals synchronously encode a plurality of bits of information that are logically arranged from a most-significant-bit (MSB) to a least-significant-bit (LSB) as shown in FIGS. 5A and 5B(i). These bits form a digital word. In the exemplary embodiment shown, four (4) input digital optical signals encode four (4) bits of information logically arranged from a most-significant-bit (MSB) to a least-significant-bit ($MSB_{-3}$). A plurality of heterojunction thyristor devices (4 shown as $252_{MSB}$, $252_{MSB-1}$, $252_{MSB-2}$, $252_{MSB-3}$), each corresponding to a different input digital optical signal/bit, are formed in resonant cavities on at least one substrate. Preferably, the plurality of heterojunction thyristor devices are integrally formed in resonant cavities on a common substrate. In addition, a plurality of voltage divider networks (4 shown as $254_{MSB}$, $254_{MSB-1}$, $254_{MSB-2}$, $254_{MSB-3}$), each corresponding to a different heterojunction thyristor device and input digital optical signal/bit, are operably coupled to the cathode terminal of the heterojunction thyristor devices ($252_{MSB}$, $252_{MSB-1}$, $252_{MSB-2}$, $252_{MSB-3}$). A summing circuit 256 is operably coupled to the voltage divider networks ($254_{MSB}$, $254_{MSB-1}$, $254_{MSB-2}$, $254_{MSB-3}$) as shown. An optical clock generator (not shown) generates a plurality of optical timing A signals and optical timing B signals as shown in FIG. 5B(ii) and 5B(iii), respectively. Each optical timing A signal includes a sampling clock pulse whose duration defines a sampling period that overlaps the bits of information encoded in the input digital optical signals. Each optical timing B signal includes a summing clock pulse whose duration defines a summing period that is subsequent to the sampling period.

During conversion operations, the plurality of input optical signals and the plurality of optical timing A signals are injected into the resonant cavities, where such signals are resonantly absorbed by the heterojunction thyristor devices ($252_{MSB}$, $252_{MSB-1}$, $252_{MSB-2}$, $252_{MSB-3}$). Each heterojunction thyristor device is configured (as described above with respect FIGS. 2B2, 2B4, 2C and 2D2) to operate during a given sampling period to convert the input digital optical signal supplied thereto to a corresponding digital electrical signal. In this configuration, each heterojunction thyristor device switches from the non-conducting/OFF state to the conducting/ON state in the event that both the optical sampling clock pulse is present and the input optical signal represents the ON logic level. This occurs because the combination of these signals are sufficient to produce the critical switching charge $Q_{CR}$. However, each heterojunction thyristor device does not switch from the non-conducting/OFF state to the conducting/ON state in the event that either the optical sampling clock pulse is not present or the input optical signal represents the OFF logic level. This occurs because each of these signals alone is not sufficient to produce the critical switching charge $Q_{CR}$.

The voltage divider networks ($254_{MSB}$, $254_{MSB-1}$, $254_{MSB-2}$, $254_{MSB-3}$) are configured to scale the magnitude of the digital electrical signals produced by the heterojunction thyristor devices ($252_{MSB}$, $252_{MSB-1}$, $252_{MSB-2}$, $252_{MSB-3}$) to produce output electrical signals ($V_{MSB}$, $V_{MSB-1}$, $V_{MSB-2}$, $V_{MSB-3}$) whose magnitude corresponds to the bits encoded by the input digital optical signals. For example, the voltage divider networks ($254_{MSB}$, $254_{MSB-1}$, $254_{MSB-2}$, $254_{MSB-3}$) shown in FIG. 5A scale the magnitude of the digital electrical signals produced by the heterojunction thyristor devices ($202_{MSB}$, $202_{MSB-1}$, $202_{MSB-2}$, $202_{MSB-3}$) by factors of 1, ½, ¼, and ⅛, respectively, to produce output electrical signals as shown in the Table I above. The scaling function for a given voltage divider network can be represented generally by a scale factor of ($½^X$), where X is the difference between the position of the corresponding bit and the MSB.

The summing circuitry 256 operates during the summing period to sum the output electrical signals ($V_{MSB}$, $V_{MSB-1}$, $V_{MSB-2}$, $V_{MSB-3}$) produced by the voltage divider networks ($254_{MSB}$, $254_{MSB-1}$, $254_{MSB-2}$, $254_{MSB-3}$). The result of the summing operation performed by the summing circuitry 256, which is output from the summing circuitry 256, is an analog electric signal whose magnitude corresponds to the digital word encoded by the bits of the input digital optical signals. For example, the summing circuit 256 of FIG. 5A sums the four (4) output electrical signals to produce a resultant analog signal whose magnitude corresponds to the digital word encoded by the four (4) bits of the input digital optical signals as shown in the Table II above.

Preferably, the summing circuitry 256 includes a chain of two-port adding nodes 258 and sample/hold circuits 260 arranged as pairs, each pair correspond to a different voltage divider network ($254_{MSB-1}$, $254_{MSB-2}$, $254_{MSB-3}$) as shown. In this configuration, the output electrical signal generated by a given voltage divider network is supplied to an input node of the corresponding two-port adding node 258. In addition, a single sample/hold circuit 261 supplies an output electrical signal ($V_{MSB}$) whose magnitude corresponds to the MSB to the chain of two-port adding nodes 258 and sample/hold circuits 260. The sample and hold circuits 260 of this chain and the single sample and hold circuit 261 are activated during the summing period (which is defined by duration of the summing clock pulse in the optical timing B signal as shown in FIG. 4B(iii)) to thereby effectuate the summing operation, which produces the output analog electrical signal as described above. In this configuration, each sample and hold circuit 260 and 261 includes an input capacitance that operates to store the electrical signal generated by a given voltage divider network and supplied thereto during a given sampling period for summation during the subsequent summing period.

Preferably, such conversion operations are repeated for another digital word that is subsequently encoded by the input digital optical signals supplied to the converter 251 as described above.

In another aspect of the present invention, the heterojunction thyristor device can be configured to operate as an optically-controlled sampling device (e.g., optically-controlled switch), which is suitable for use in a sample and hold circuit (such as sample and hold circuits 260/261 in FIG. 5A) and in many other signal processing applications (such as switched capacitance filters and switched capacitance waveform generators). Two possible configurations are shown in FIGS. 5C and 5D, respectively.

Figure 5C:
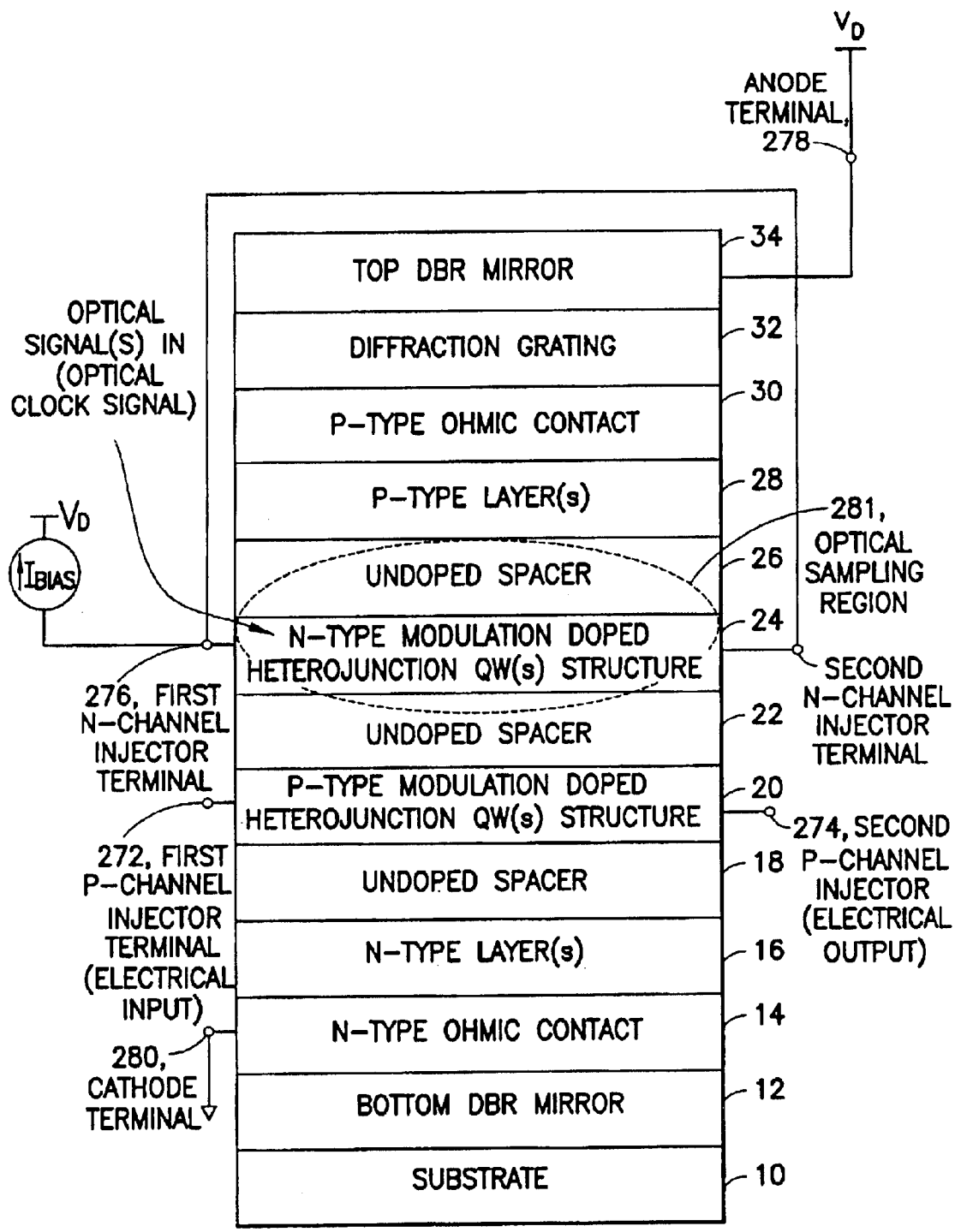
FIGS. 5C and 5D are cross-sectional schematics showing heterojunction thyristor devices configured to perform optically-controlled sampling operations in response to an optical clock signal supplied thereto; each of these configurations is suitable to realize the optically-controlled sample and hold circuit of FIG. 5A.

In FIG. 5C, a first p-channel injector terminal 272 (the electrical input terminal) and a second p-channel injector terminal 274 (the electrical output terminal) are operably coupled to opposite ends of the p-channel QW(s) of structure 20. A bias current source is coupled to the n-channel injector terminal(s) 276 and draws charge from the n-type QW channel(s) to the positive supply voltage potential $V_D$. The anode terminal 278 is forward biased (e.g. biased positively) with respect to the cathode terminal 280. An optical clock signal is supplied to the device for resonant absorption in the n-type QW channel(s) of structure 24 (which is part of the optical sampling region 281 as shown). The optical clock signal includes an optical clock pulse that defines an active sampling period. The length and width of the device is sized such that it switches from a non-conducting/OFF state to a conducting/ON state when absorption of the optical energy from the optical clock pulse produces a channel current that exceeds the bias current $I_{BIAS}$ such that charge in the n-type QW(s) of structure 24 builds to a level that is greater than the critical switching charge $Q_{CR}$. When the optical clock pulse terminates, the bias current $I_{BIAS}$ reduces the charge in the n-type QW(s) channels to a level below the holding charge $Q_H$, thereby causing the device to switch from the conducting/ON state to the non-conducting/OFF state. Note that each heterojunction thyristor device does not switch from the non-conducting/OFF state to the conducting/ON state in the event that the optical sampling clock pulse is not present. This occurs because there is no absorption of optical energy in the QW channel(s) of the device to produce the critical switching charge $Q_{CR}$.

When the device is operating in the non-conducting/OFF state, the electrical input terminal 272 is electrically isolated from the electrical output terminal 274. However, when the device is operating in the conducting/ON state, the electrical input terminal 272 is electrically coupled to the electrical output terminal 274 (and there is minimal potential voltage differences between input terminal 272 and output terminal 274). In this manner, the heterojunction thyristor device operates as a sampling device (e.g., switch) that is selectively activated and deactivated by an optical control signal (e.g., the optical clock signal).

Figure 5D:
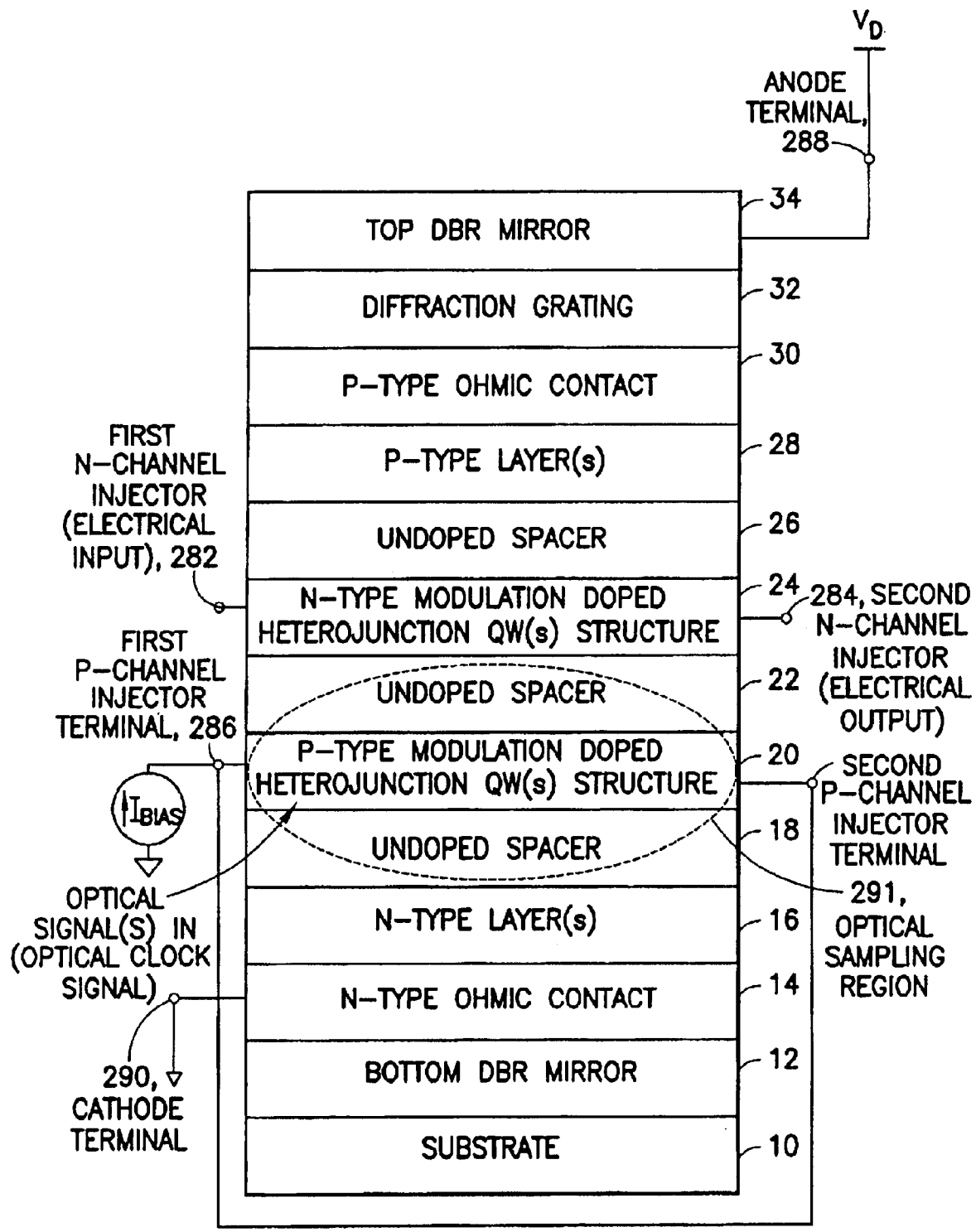

In FIG. 5D, a first n-channel injector terminal 282 (the electrical input terminal) and a second n-channel injector terminal 284 (the electrical output terminal) are operably coupled to opposite ends of the n-channel QW(s) of structure 24. A bias current source is coupled to the p-channel injector terminal(s) 286 and draws charge from the p-type QW channel(s) to the ground potential. The anode terminal 288 is forward biased (e.g. biased positively) with respect to the cathode terminal 290. An optical clock signal is supplied to the device for resonant absorption in the p-type QW channel(s) of structure 20 (which is part of the optical sampling region 291 as shown). The optical clock signal includes an optical clock pulse that defines an active sampling period. The length and width of the device is sized such that it switches from a non-conducting/OFF state to a conducting/ON state when absorption of the optical energy from the optical clock pulse produces a channel current that exceeds the bias current $I_{BIAS}$ such that charge in the p-type QW(s) of structure 20 builds to a level that is greater than the critical switching charge $Q_{CR}$. When the optical clock pulse terminates, the bias current $I_{BIAS}$ reduces the charge in the p-type QW(s) channels to a level below the holding charge $Q_H$, thereby causing the device to switch from the conducting/ON state to the non-conducting/OFF state. Note that each heterojunction thyristor device does not switch from the non-conducting/OFF state to the conducting/ON state in the event that the optical sampling clock pulse is not present. This occurs because there is no absorption of optical energy in the QW channel(s) of the device to produce the critical switching charge $Q_{CR}$.

When the device is operating in the non-conducting/OFF state, the electrical input terminal 282 is electrically isolated from the electrical output terminal 284. However, when the device is operating in the conducting/ON state, the electrical input terminal 282 is electrically coupled to the electrical output terminal 284 (and there is a minimal potential voltage difference between the input terminal 282 and the output terminal 284). In this manner, the heterojunction thyristor device operates as a sampling device (e.g., switch) that is selectively activated and deactivated by an optical control signal (e.g., the optical clock signal).

Figure 5E:
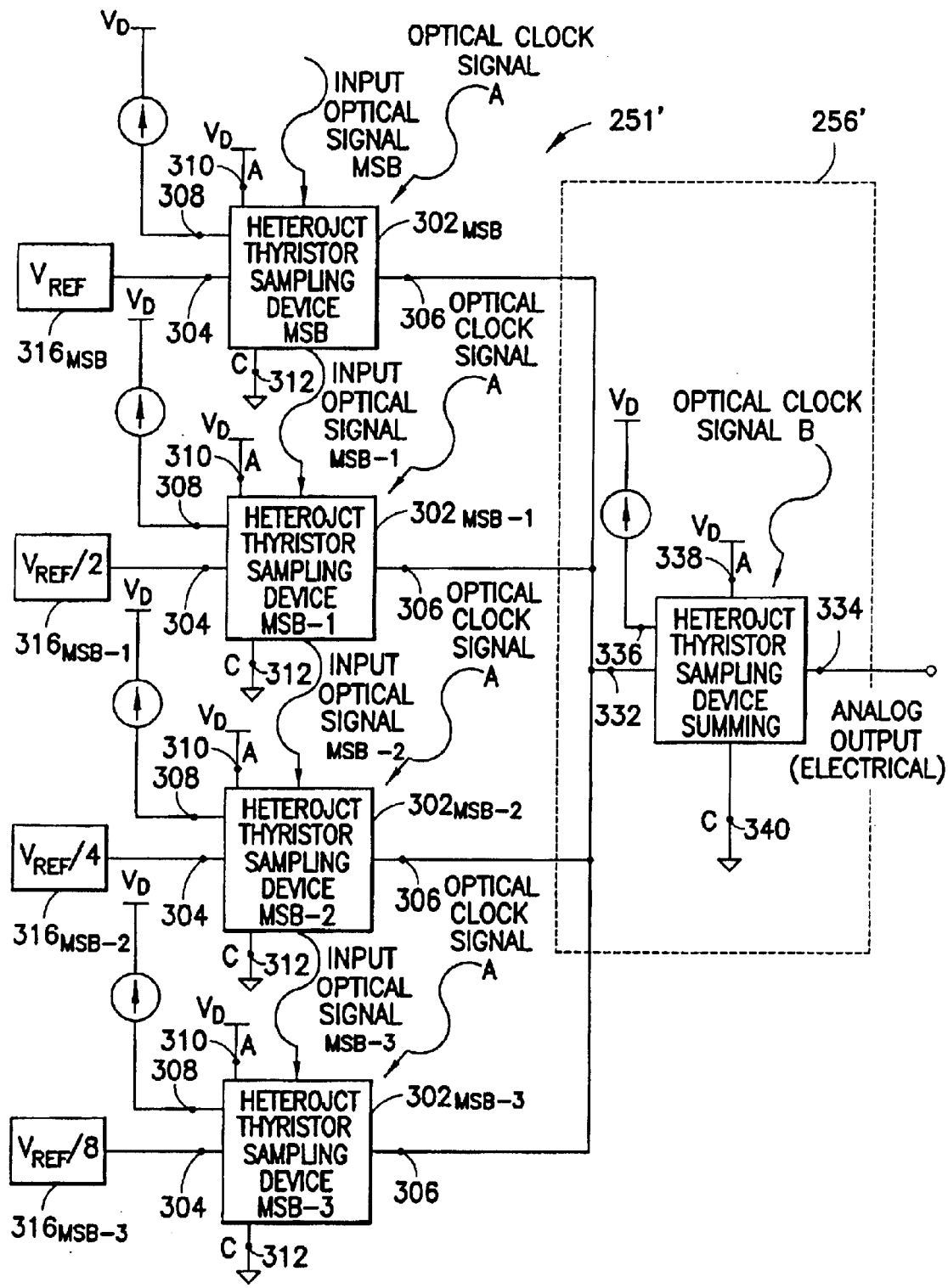
FIG. 5E is a functional block diagram illustrating a photonic digital-to-analog converter that converts a digital word encoded by a parallel digital optical signal (e.g., a plurality of synchronous optical bits) to an output analog electrical signal whose magnitude corresponds to the digital word in accordance with the present invention; in this configuration, optical clock signals are used to perform the conversion operations.

Another photonic digital-to analog converter 251' is shown in FIG. 5E. Similar to the embodiment of FIG. 5A, the input digital optical signals synchronously encode a plurality of bits of information that are logically arranged from a most-significant-bit (MSB) to a least-significant-bit (LSB) as shown in FIG. 5B(i). These bits form a digital word. In the exemplary embodiment shown, four (4) input digital optical signals encode four (4) bits of information logically arranged from a most-significant-bit (MSB) to a least-significant-bit ($MSB_{-3}$). A plurality of heterojunction thyristor devices (4 shown as $302_{MSB}$, $302_{MSB-1}$, $302_{MSB-2}$, $302_{MSB-3}$), each corresponding to a different input digital optical signal/bit, are formed in resonant cavities on at least one substrate. Preferably, the plurality of heterojunction thyristor devices are integrally formed in resonant cavities on a common substrate. Each heterojunction thyristor device is configured as an optically-controlled sampling device (e.g., switch) in a manner similar to the sampling device described below with respect to FIGS. 7A and 7B, whereby the n-channel injector terminals form the electrical input terminal 304 and the electrical output terminal 306. A bias current source is coupled to the p-channel injector terminal(s) 308 and draws charge from the QW channel(s) coupled thereto. The anode terminal 310 is forward biased (e.g. biased positively) with respect to the cathode terminal 312. As described below in detail with FIGS. 7A and 7B, the length and width of each heterojunction-thyristor-based sampling device are sized such that it switches from a non-conducting/OFF state to a conducting/ON state when combination of i) absorption of optical energy in the QW channel(s) of the device from the sampling optical clock pulse of the optical timing signal A and ii) absorption of optical energy in the QW channel(s) of the device from the ON pulse of the input optical signal produces a channel current that exceeds the bias current $I_{BIAS}$ such that charge in the QW channel(s) of the device build to a level that is greater than the critical switching charge $Q_{CR}$. When the optical sampling clock pulse terminates, the bias current $I_{BIAS}$ reduces the charge in QW channel(s) of the device to a level below the holding charge $Q_H$, thereby causing the device to switch from the conducting/ON state to the non-conducting/OFF state. Note that the device does not switch from the non-conducting/OFF state to the conducting/ON state in the event that either the optical sampling clock pulse is not present or the input optical signal represents the OFF logic level. This occurs because these signals alone are not sufficient to produce the critical switching charge $Q_{CR}$.

As shown in FIG. 4B(ii), the optical timing signal A includes an optical sampling clock pulse that define an active sampling period whose duration overlaps the bits of information encoded in the input digital optical signal as shown in FIG. 4B(i). The optical timing signal A and the input digital optical signals are supplied to the resonant cavities for resonant absorption by the corresponding heterojunction thyristor devices as shown in FIG. 5E. A plurality of voltage references (4 shown as $316_{MSB}$, $316_{MSB-1}$, $316_{MSB-2}$, $316_{MSB-3}$), each corresponding different heterojunction thyristor device, are operably coupled to the electrical input terminal 304 of the corresponding heterojunction thyristor device. The voltage reference and corresponding heterojunction thyristor-based sampling device cooperate to generate at the electrical output terminal 306 a voltage signal ($V_{MSB}$, $V_{MSB-1}$, $V_{MSB-2}$, or $V_{MSB-3}$) representing the contribution of the bit in the digital word in accordance with the input digital optical signal supplied thereto. Examples of such voltage signals are shown above in table I. A summing circuit 256' is operably coupled to the output terminals of the heterojunction-thyristor-based sampling devices as shown. The summing circuitry 256' operates during the summing period to sum the voltage signals ($V_{MSB}$, $V_{MSB-1}$, $V_{MSB-2}$, and $V_{MSB-3}$) produced at the output terminals 306 of the sampling devices. The result of the summing operation performed by the summing circuitry 256', which is output from the summing circuitry 256,' is an analog electric signal whose magnitude corresponds to the digital word encoded by the bits of the input digital optical signals. For example, the summing circuit 256' of FIG. 5E sums the four (4) output electrical signals to produce a resultant analog signal whose magnitude corresponds to the digital word encoded by the four (4) bits of the input digital optical signals as shown above in table II.

Preferably, the summing circuitry 256' includes a heterojunction-thyristor-based optically-controlled sampling device as described above with respect to FIGS. 5C and 5D. In this configuration, the voltage signals ($V_{MSB}$, $V_{MSB-1}$, $V_{MSB-2}$, $V_{MSB-3}$) produced at the output terminals 306 of the plurality of heterojunction-thyristor-based sampling devices are supplied to the input terminal 332 of the sampling device of circuit 256', which is activated during the summing period (which is defined by the duration of the summing clock pulse in the timing signal B as shown in FIG. 5B(iii)) to thereby effectuate the summing operation, which produces the output analog electrical signal as described above. Note that the heterojunction-thyristor-based sampling device of circuit 256' includes an input capacitance that operates to store the sum of the voltage signals ($V_{MSB}$, $V_{MSB-1}$, $V_{MSB-2}$, $V_{MSB-3}$) produced at the output terminals 306 of the plurality of heterojunction-thyristor-based sampling devices and supplied to the input terminal 332 of the sampling device of circuit 256' for output during the subsequent summing period.

Preferably, such conversion operations are repeated for another digital word that is subsequently encoded by the input digital optical signals supplied to the converter 251' as described above.

In the illustrative embodiment shown in FIG. 5E, the voltage references $316_{MSB}$, $316_{MSB-1}$, $316_{MSB-2}$, $316_{MSB-3}$ supply voltage levels corresponding to maximum voltage level ($V_{REF}$) of the analog electrical signal divided by $2^I$, where I corresponds to the bit position in the digital word (e.g., I=0 for MSB, I=1 for MSB-1 . . . ). However, it should be noted that alternate configurations are possible with varying voltage reference source values.

In the embodiments of FIGS. 5A and 5E, the injector terminal of the device is operably coupled to N-type QW channel(s) realized in the N-type modulation doped QW(s) structure of the device. In such a configuration, the bias current source draws charge from the n-type QW channel(s) to the positive supply voltage potential $V_D$. In an alternate embodiment, the injector terminal of the device may be operably coupled to the p-type QW channel(s) realized in the P-type modulation doped QW(s) structure of the device. In such a configuration, the bias current source draws charge from the p-type QW channel(s) to ground potential. Similarly, the summing clock pulse of FIG. 5B(iii) is shown as a downward running electrical clock pulse. Such a pulse is suitable to activate a heterojunction-based sample and hold circuit as described above with respect to FIG. 5C. Alternatively, the summing clock pulse of FIG. 4B(iii) can be an upward running electrical clock pulse. Such a pulse is suitable to activate a heterojunction-thyristor-based sample and hold circuit as described above with respect to FIG. 5D.

The heterojunction-thyristor-based sampling devices of FIGS. 4C–4E and 5C–5E as described above may be realized with a material system based on III–V materials (such as a GaAs/AlxGa$_{1-x}$As). FIGS. 3A through 3F illustrate an exemplary structures utilizing group III–V materials for realizing the heterojunction-thyristor-based sampling device in accordance with the present invention. Alternatively, strained silicon heterostructures employing silicon-germanium (SiGe) layers may be used to realize the heterojunction-thyristor-based sampling devices described herein. Using the structure described above with respect to FIGS. 3A and 3B, a heterojunction-thyristor-based sampling device can be realized as shown in FIG. 5F. This device is similar to the heterojunction thyristor device of FIG. 3C, but includes additional mesas 294, 295 (preferably formed by etching down near the bottom of layer 159 as shown) into which is implanted P+ ion implants 296, 297 that form self-aligned channel contacts to the p-type QW inversion channel(s). In this configuration, p-channel injector terminals 38C and 38D are formed via deposition of p-type Au alloy metal layers 298, 299 on the P+ ion implants 296, 297 to form ohmic contacts thereto.

Turning now to FIGS. 6A through 7D, in another aspect of the present invention, a heterojunction-thyristor-based sampling device is used as the basis for a photonic digital-to-analog converter that converts a digital word encoded by a serial digital bit stream in optical form to an output analog electrical signal corresponding to the digital word.

Figure 6A:
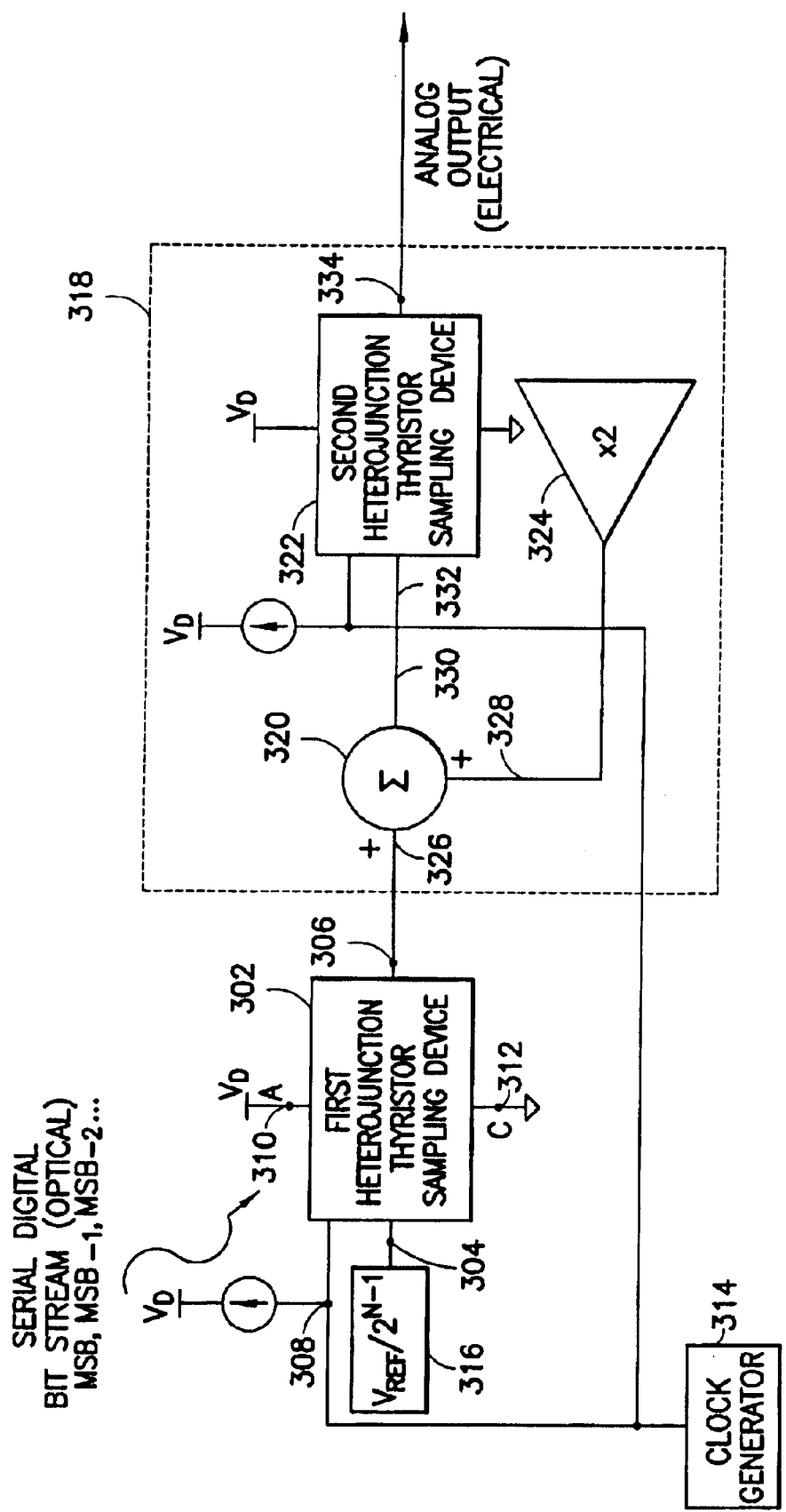
FIG. 6A is a functional block diagram illustrating a photonic digital-to-analog converter that converts a digital word encoded by a serial digital optical signal (e.g., a plurality of serial optical bits) to an output analog electrical signal whose magnitude corresponds to the digital word in accordance with the present invention; in this configuration, an electrical clock signal is used to perform the conversion operations.
Figure 6C:
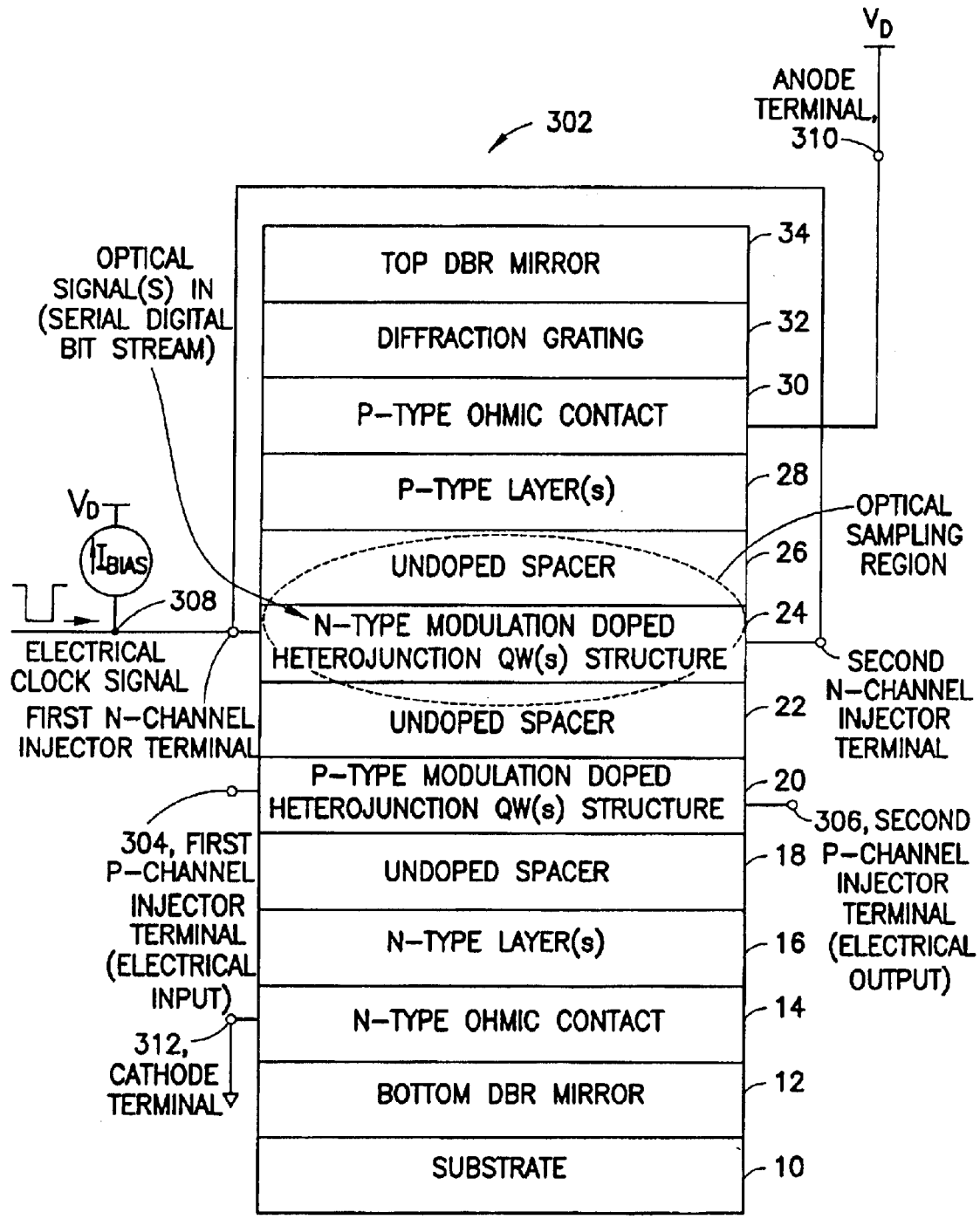
FIGS. 6C and 6D are cross-sectional schematics showing heterojunction thyristor devices configured to perform optically-controlled sampling operations in response to a digital optical signal and an electrical clock signal supplied thereto; each of these configurations is suitable to realize the first heterojunction sampling device of FIG. 6A.

An exemplary embodiment of the photonic digital-to-analog converter 301 is shown in FIG. 6A. The serial digital bit stream is an optical signal that sequentially encodes a plurality of bits of information which are logically arranged from a most-significant-bit (MSB) to a least-significant-bit (LSB) as shown in FIG. 6B(i). These bits form a digital word. In the exemplary embodiment shown, the serial digital bit stream sequentially encodes four (4) bits of information logically arranged from a most-significant-bit (MSB) to a least-significant-bit ($MSB_{-3}$). A first heterojunction thyristor device 302 is formed in a resonant cavity on a substrate as shown in FIG. 6C. The first heterojunction thyristor device is configured as an optically-controlled sampling device (e.g., optically-controlled switch) in a manner similar to the device described above with respect to FIGS. 5C, 5D, and 5E. More specifically, as shown in FIG. 6C, a first p-channel injector terminal 304 (the electrical input terminal) and a second p-channel injector terminal 306 (the electrical output terminal) are operably coupled to opposite ends of the p-channel QW(s) of the device 302. A bias current source is coupled to the n-channel injector terminal(s) 308 and draws charge from the n-type QW channel(s) to the positive supply voltage potential $V_D$. The anode terminal 310 is forward biased (e.g. biased positively) with respect to the cathode terminal 312. Yet, this configuration differs from that in FIGS. 5C and 5D, and 5E, in that a clock generator 314 generates an electrical clock signal that is supplied to the n-channel injector terminal(s) 308 for injection into the n-type QW channel(s) of device 302. The electrical clock signal includes downward running electrical clock pulses that define active sampling periods whose duration overlaps the bits of information encoded in the serial digital bit stream as shown in FIG. 6B(ii).

As shown in FIG. 6A, the serial digital bit stream is supplied to the resonant cavity of device 302 for resonant absorption by the device 302. A voltage reference 316 is operably coupled to the electrical input terminal 304. The voltage reference 316 and the heterojunction thyristor-based sampling device 302 cooperate to sequentially generate at the electrical output terminal 306 a voltage signal representing the contribution of each bit of the digital word in accordance with the serial digital bit stream as described below in more detail. A summing circuit 318, which is operably coupled to the electrical output terminal 306, sequentially sums contribution of the voltage signal produced at the output terminal 306 over the sequence of bits in the serial digital bit stream to produce an output analog electrical signal corresponding to the digital word.

In order to perform the required sampling/switching operations, the length and width of the device 302 is sized such that it operates during a given sampling period defined by the electrical sampling clock as follows. When the light level of the serial digital bit stream corresponds to the ON logic level, channel current produced by the combination of i) injection of electrical energy supplied by the electrical clock pulse and ii) absorption of optical energy supplied by the serial digital bit stream exceeds the bias current $I_{BIAS}$ to produce the critical switching charge $Q_{CR}$ in the N-type modulation doped QW structure of device 302. This causes the heterojunction thyristor device 302 to switch to its conducting/ON state where the current I through the device is substantially greater than zero but below the threshold for lasing $I_L$. However, when the light level of the input digital optical signal falls to the OFF logic level, the bias current $I_{BIAS}$ exceeds the channel current produced by the electrical clock pulse alone and thus draws on the injector terminal 308 to drain charge from the N-type modulation doped QW structure of device 302, which causes the channel charge to fall below the holding charge $Q_H$. This causes the heterojunction thyristor device 302 to switch to its non-conducting/OFF state where the current I through the device is substantially zero. When the light level of the input digital optical signal corresponds to the OFF logic level, the bias current $I_{BIAS}$ exceeds the channel current produced by the combination of injection of electrical energy supplied by the electrical clock pulse and absorption of optical energy supplied by the serial digital bit stream and thus draws on the injector terminal 308 to drain charge from the N-type modulation doped QW structure of device 302, which causes the channel charge to remain below the holding charge $Q_H$. This causes the device to remain in its non-conducting/OFF state where the current I through the device is substantially zero. When the device 302 is operating in the non-conducting/OFF state, the electrical input terminal 304 (and the voltage reference 316 coupled thereto) is electrically isolated from the electrical output terminal 306. However, when the device 302 is operating in the conducting/ON state, the electrical input terminal 304 (and the voltage reference 316 coupled thereto) is electrically coupled to the electrical output terminal 306,(and there is a minimal potential voltage difference between the input terminal 304 and the output terminal 306). In this manner, the device 302 operates as a sampling device (e.g., switch) that is selectively activated and deactivated by binary logic level of the optical bits encoded in the serial digital bit stream, and produces at the output terminal 306 a voltage signal that representing contribution of each optical bit of the digital word.

The summing circuit 318 sequentially sums the voltage signal produced at the output terminal 306 over the sequence of bits in the serial digital bit stream to produce an output analog electrical signal corresponding to the digital word. Preferably, the summing circuitry 206 includes an adder node 320, a sample and hold circuit 322, and a feedback amplifier 324 coupled between the sample and hold circuit 322 and the adder node 320. The adder node has a first input port 326, a second input port 328, and an output port 330. The sample and hold circuit 322 has an input 332 and an output 334, and is activated by the electrical clock pulse. In this configuration, the first input port 326 of the adder node 320 is operably coupled to said electrical output terminal 306 of the heterojunction thyristor device 302, the output port 330 of the adder node 320 is operably coupled to the input 332 of the sample and hold circuit 322, and the feedback amplifier 324 is operably coupled between the output node 334 of the sample and hold circuit 322 and the second input port 328 of the adder node 320. In this configuration, at the end of the fourth (e.g., Nth) electrical clock pulse, the analog value corresponding to the four (N) bit digital word is produced at output 334 of the sample and hold circuit 322.

In the illustrative embodiment shown in FIG. 6A, the voltage reference 316 supplies a voltage level corresponding to maximum voltage level ($V_{REF}$) of the analog electrical signal divided by $2^{(N-1)}$, where N is the number of bits in the digital word. In addition, the feedback amplifier 324 amplifies output 334 of the sample and hold circuit by a factor of 2. However, it should be noted that alternate configurations are possible with varying voltage reference source values and feedback amplifier gain factors. In addition, as shown in FIG. 6A. the sample and hold circuit 322 is preferably realized with an electrically-controlled heterojunction-thyristor-based sampling device as described above with respect to FIGS. 4C and 4D.

Figure 6D:
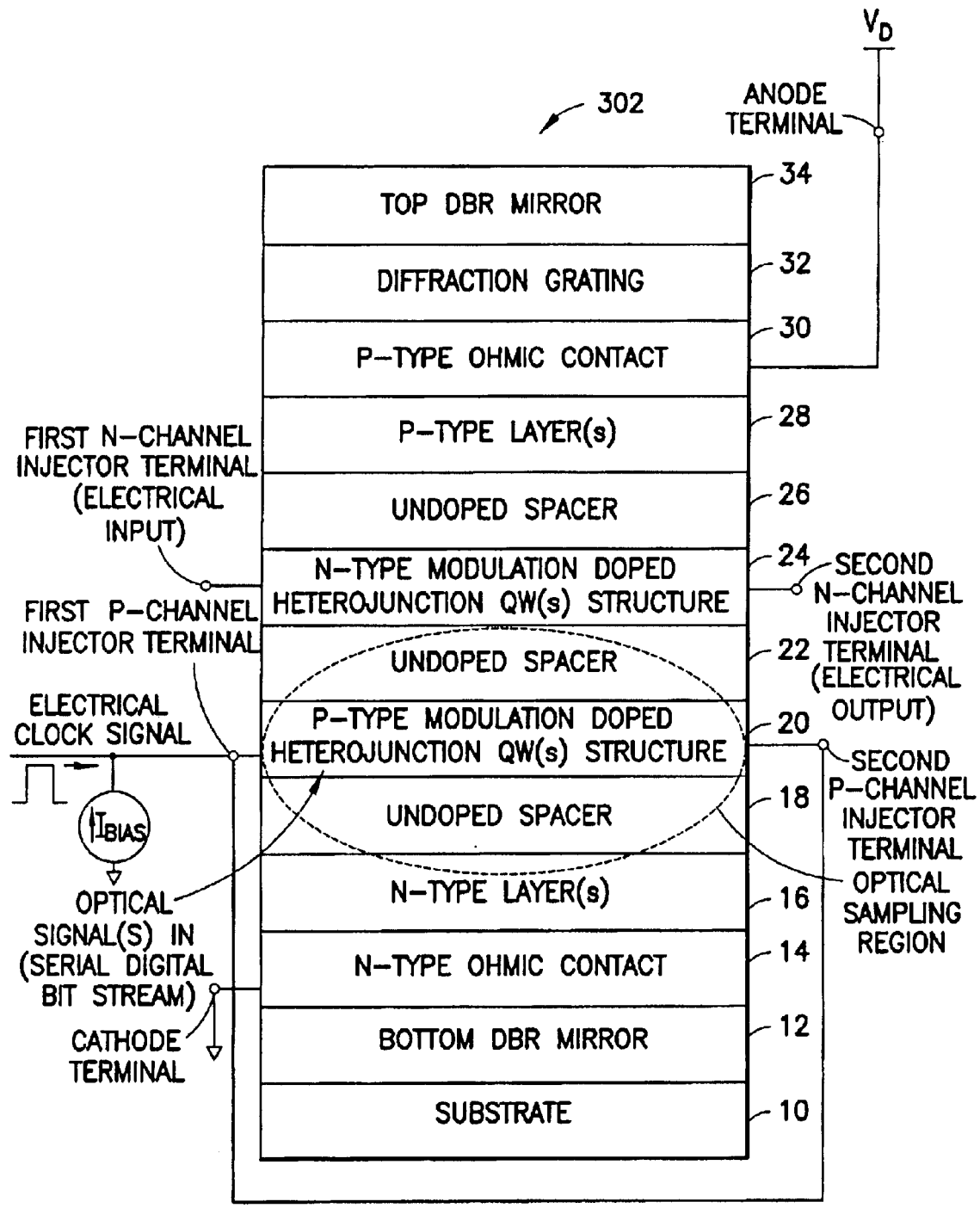

In an alternate embodiment shown in FIG. 6D, the configuration of the device 302 as described above with respect to FIG. 6A through 6C can be modified such that the first and second n-channel injector terminals are used as electrical input and output terminals, and the electrical clock signal injects upward running clock pulses into the p-type QW channel(s) in structure 20. In addition, the bias current draws charge from the p-type QW channel(s) to ground potential as shown. In this configuration, during a given sampling period defined by the electrical sampling clock, the combination of injection of electrical energy supplied by the electrical clock pulse and absorption of optical energy supplied by the serial digital bit stream into the P-type modulation doped QW structure 20 of the device selectively produces channel charge above the critical switching charge or below the holding charge such that device operates in the conducting/ON state and non-conducting/OFF state, respectively.

Figure 7A:
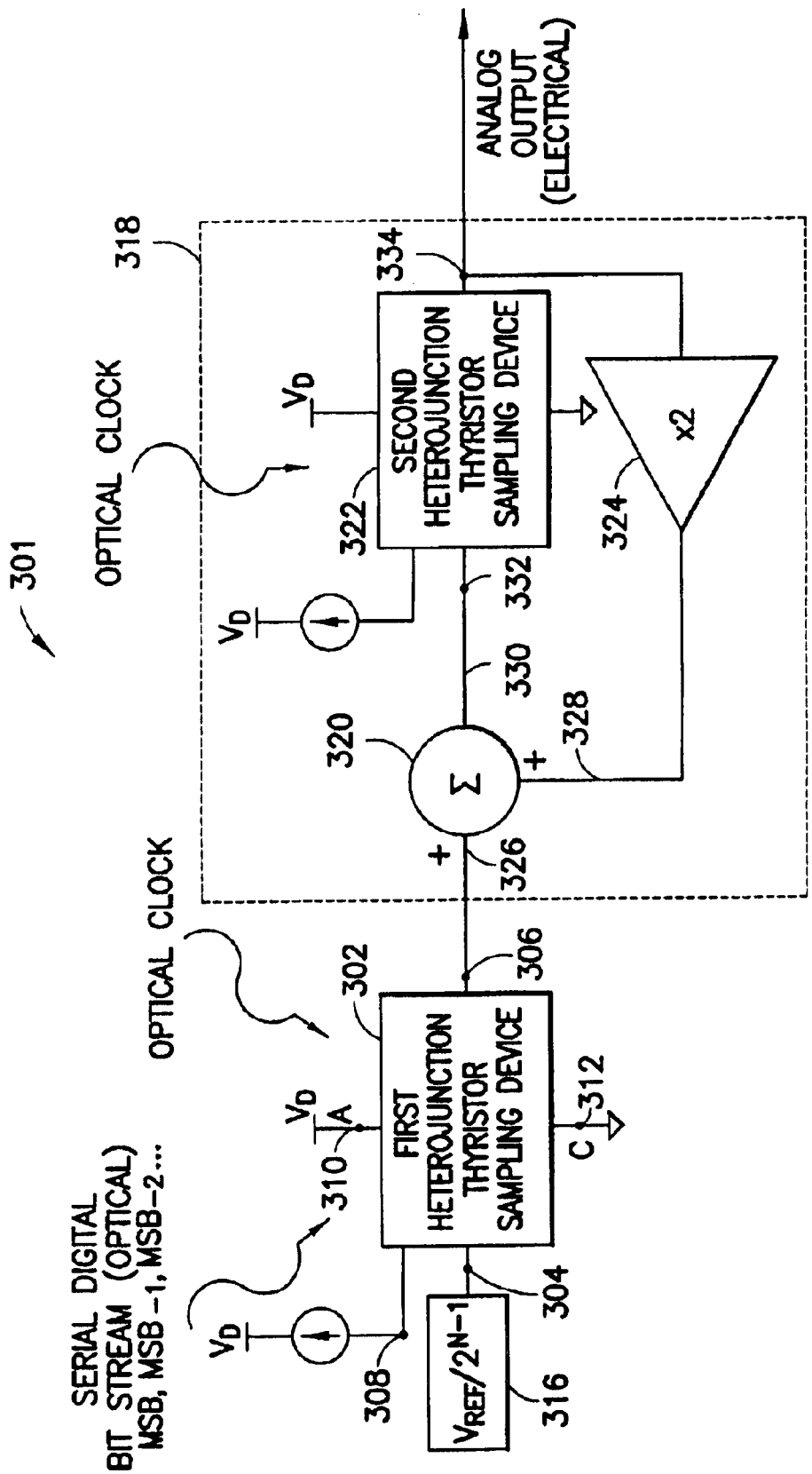
FIG. 7A is a functional block diagram illustrating a photonic digital-to-analog converter that converts a digital word encoded by a serial digital optical signal (e.g., a plurality of serial optical bits) to an output analog electrical signal whose magnitude corresponds to the digital word in accordance with the present invention; in this configuration, an optical clock signal is used to perform the conversion operations.
Figure 7C:
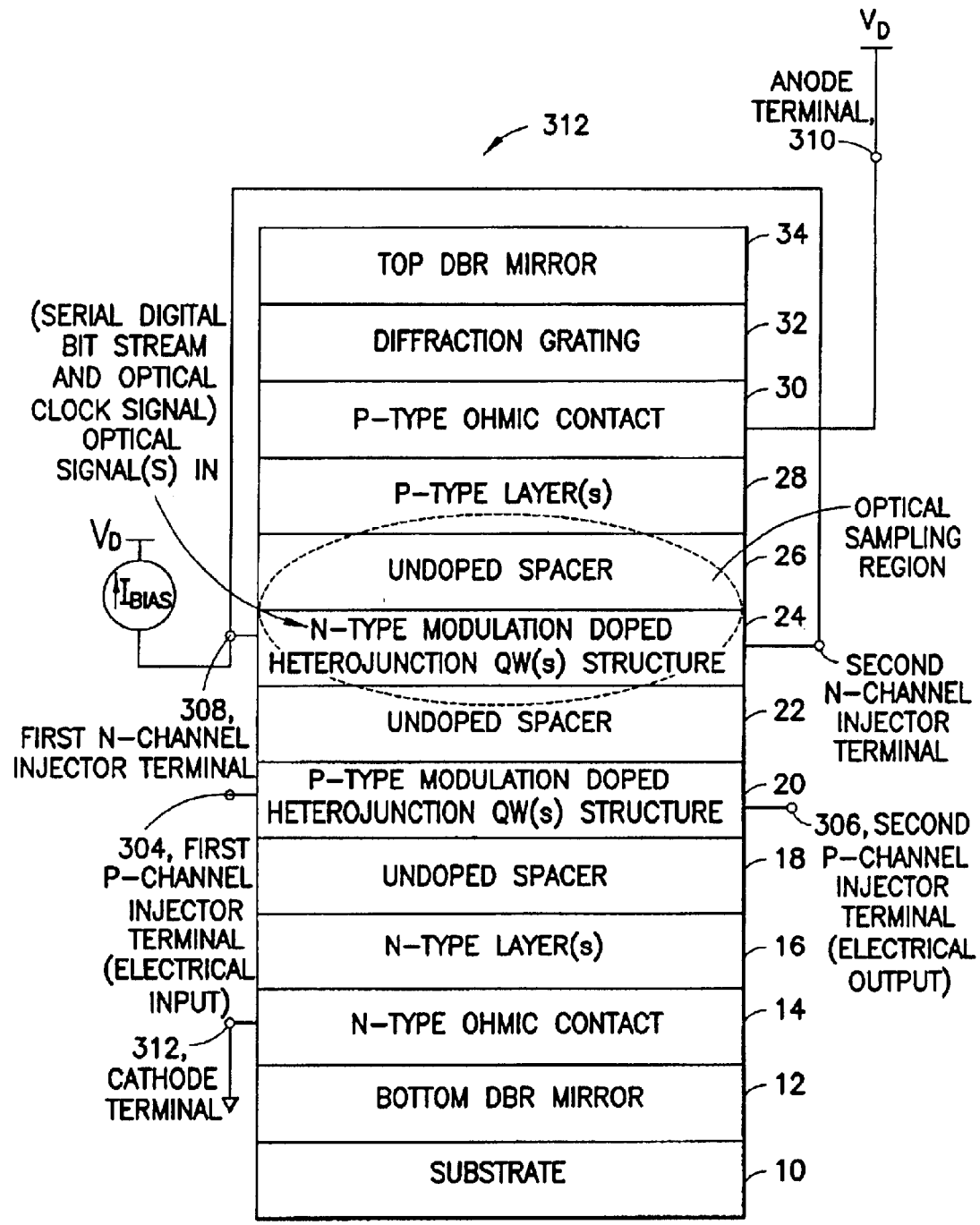
FIGS. 7C and 7D are cross-sectional schematics showing heterojunction thyristor devices configured to perform optically-controlled sampling operations in response to a digital optical signal and an optical clock signal supplied thereto; each of these configurations is suitable to realize the first heterojunction sampling device of FIG. 7A.

A second exemplary embodiment of the photonic digital-to analog converter 301 is shown in FIG. 7A. The serial digital bit stream is an optical signal that sequentially encodes a plurality of bits of information which are logically arranged from a most-significant-bit (MSB) to a least-significant-bit (LSB) as shown in FIG. 7B(i). These bits form a digital word. In the exemplary embodiment shown, the serial digital bit stream sequentially encodes four (4) bits of information logically arranged from a most-significant-bit (MSB) to a least-significant-bit ($MSB_{-3}$). A first heterojunction thyristor device 302 is formed in a resonant cavity on a substrate as shown in FIG. 7C. The first heterojunction thyristor device is configured as an optically-controlled sampling device (e.g., optically-controlled switch) in a manner similar to the device described above with respect to FIGS. 5C, 5D, and 5E. More specifically, as shown in FIG. 7C, a first p-channel injector terminal 304 (the electrical input terminal) and a second p-channel injector terminal 306 (the electrical output terminal) are operably coupled to opposite ends of the p-channel QW(s) of the device 302. A bias current source is coupled to the n-channel injector terminal(s) 308 and draws charge from the n-type QW channel(s) to the positive supply voltage potential $V_D$. The anode terminal 310 is forward biased (e.g. biased positively) with respect to the cathode terminal 312.

As shown in FIG. 7A, an optical clock signal that is supplied to the device for resonant absorption therein. The optical clock signal includes optical clock pulses that define active sampling periods whose duration overlaps the bits of information encoded in the serial digital bit stream as shown in FIG. 7B(ii). Yet, this configuration differs from that in FIGS. 5C, 5D, and 5E, in that the serial digital bit stream is supplied to the resonant cavity of device 302 for resonant absorption therein. In addition, a voltage reference 316 is operably coupled to the electrical input terminal 304. The voltage reference 316 and the heterojunction thyristor-based sampling device 302 cooperate to sequentially generate at the electrical output terminal 306 a voltage signal representing the contribution of each bit of the digital word in accordance with the serial digital bit stream as described below in more detail. A summing circuit 318, which is operably coupled to the electrical output terminal 306, sequentially sums the voltage signal produced at the output terminal 306 over the sequence of bits in the serial digital bit stream to produce an output analog electrical signal corresponding to the digital word.

In order to perform the required sampling/switching operations, the length and width of device 302 is sized such that it operates during a given sampling period defined by the optical clock as follows. When the light level of the serial digital bit stream corresponds to the ON logic level, channel current produced by absorption of optical energy supplied by the serial digital bit stream and the optical clock exceeds the bias current $I_{BIAS}$ to produce the critical switching charge $Q_{CR}$ in the N-type modulation doped QW structure of device 302. This causes the heterojunction thyristor device 302 to switch to its conducting/ON state where the current I through the device is substantially greater than zero but below the threshold for lasing $I_L$. However, when the light level of the input digital optical signal falls to the OFF logic level, the bias current $I_{BIAS}$ exceeds the channel current produced by absorption of the optical clock alone and thus draws on the injector terminal 308 to drain charge from the N-type modulation doped QW structure of device 302, which causes the channel charge to fall below the holding charge $Q_H$. This causes the heterojunction thyristor device 302 to switch to its non-conducting/OFF state where the current I through the device is substantially zero. When the light level of the input digital optical signal corresponds to the OFF logic level, the bias current $I_{BIAS}$ exceeds the channel current produced by absorption of optical energy supplied by the serial digital bit stream and the optical clock and thus draws on the injector terminal 308 to drain charge from the N-type modulation doped QW structure of device 302, which causes the channel charge to remain below the holding charge $Q_H$. This causes the device to remain in its non-conducting/OFF state where the current I through the device is substantially zero. When the device 302 is operating in the non-conducting/OFF state, the electrical input terminal 304 (and the voltage reference 316 coupled thereto) is electrically isolated from the electrical output terminal 306. However, when the device 302 is operating in the conducting/ON state, the electrical input terminal 304 (and the voltage reference 316 coupled thereto) is electrically coupled to the electrical output terminal 306 (and there is a minimal potential voltage difference between the input terminal 304 and the output terminal 306). In this manner, the device 302 operates as a sampling device (e.g., switch) that is selectively activated and deactivated by the binary logic level of the optical bits encoded in the serial digital bit stream, and produces at the output terminal 306 a voltage signal that represents the contribution of each optical bit of the digital word.

The summing circuit 318 sequentially sums the voltage signal produced at the output terminal 306 over the sequence of bits in the serial digital bit stream to produce an output analog electrical signal corresponding to the digital word. Preferably, the summing circuitry 206 includes an adder node 320, a sample and hold circuit 322, and a feedback amplifier 324 coupled between the sample and hold circuit 322 and the adder node 320. The adder node has a first input port 326, a second input port 328, and an output port 330. The sample and hold circuit 322 has an input 332 and an output 334, and is activated by a clock pulse (which may be optical or electrical in form). In this configuration, the first input port 326 of the adder node 320 is operably coupled to the electrical output terminal 306 of the heterojunction thyristor device 302, the output port 330 of the adder node 320 is operably coupled to the input 332 of the sample and hold circuit 322, and the feedback amplifier 324 is operably coupled between the output node 334 of the sample and hold circuit 322 and the second input port 328 of the adder node 320. In this configuration, at the end of the fourth (e.g., Nth) clock pulse, the analog value corresponding to the four (N) bit digital word is produced at output 334 of the sample and hold circuit 322.

In the illustrative embodiment shown in FIG. 7A, the voltage reference 316 supplies a voltage level corresponding to maximum voltage level ($V_{REF}$) of the analog electrical signal divided by $2^{(N-1)}$, where N is the number of bits in the digital word. In addition, the feedback amplifier 324 amplifies the output 334 of the sample and hold circuitry by a factor of 2. However, it should be noted that alternate configurations are possible with varying voltage reference source values and feedback amplifier gain factors. In addition, as shown in FIG. 7A, the sample and hold circuit 322 is preferably realized with an optically-controlled heterojunction-thyristor-based sampling device as described above with respect to FIGS. 5C, 5D, and 5E.

Figure 7D:
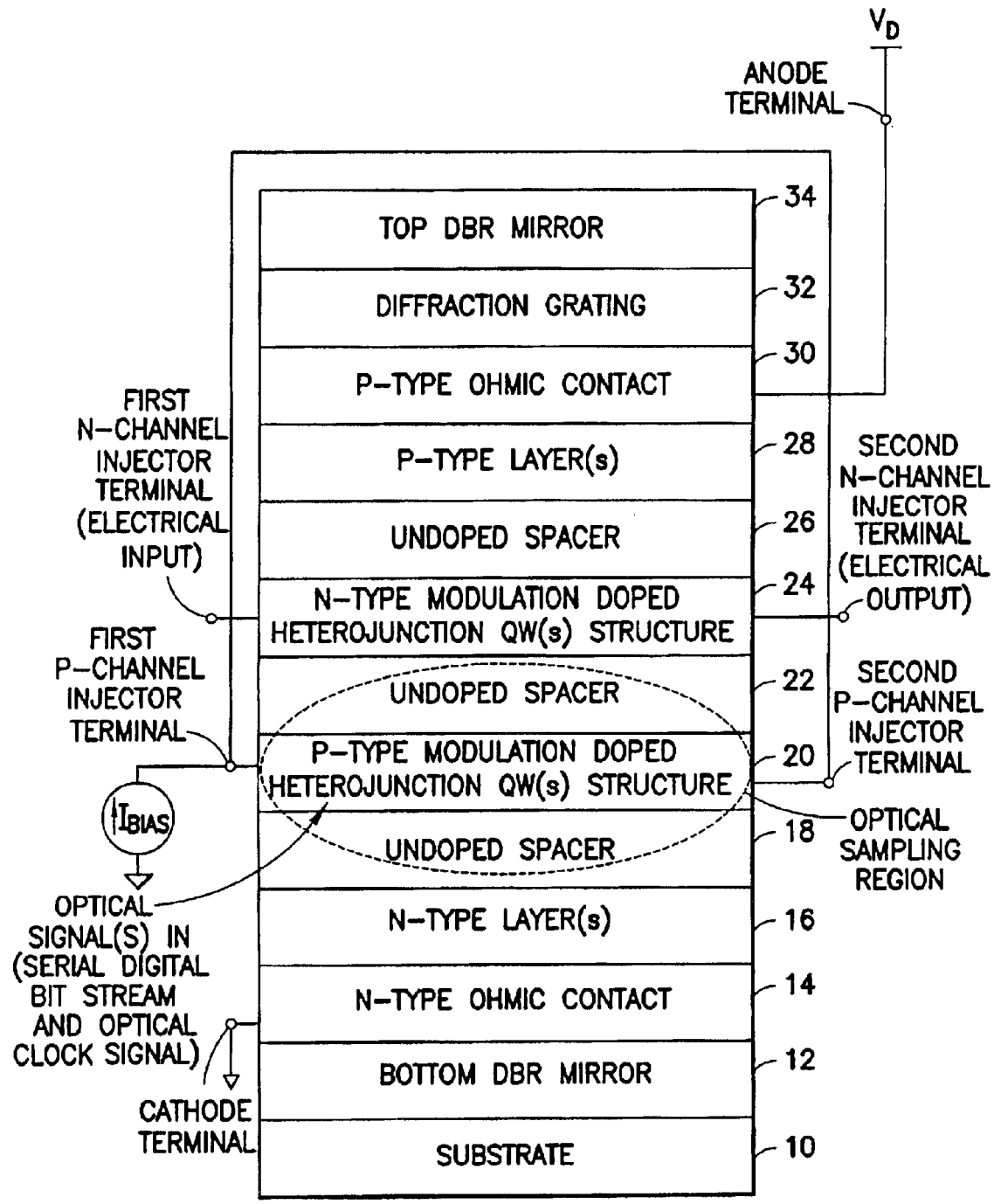

In an alternate embodiment as shown in FIG. 7D, the configuration of the device 302 as described above with respect to FIG. 7A through 7C can be modified such that the first and second n-channel injector terminals are used as electrical input and output terminals, and the bias current draws charge from the p-type QW channel(s) to ground potential as shown. In this configuration, during a given sampling period defined by the optical clock, optical energy supplied by the serial digital bit stream and by the optical clock and absorbed into the P-type modulation doped QW structure 20 of the device selectively produces channel charge above the critical switching charge (or below the holding charge) such that device operates in the conducting/ON state (or the non-conducting/OFF state).

Figure 8A:
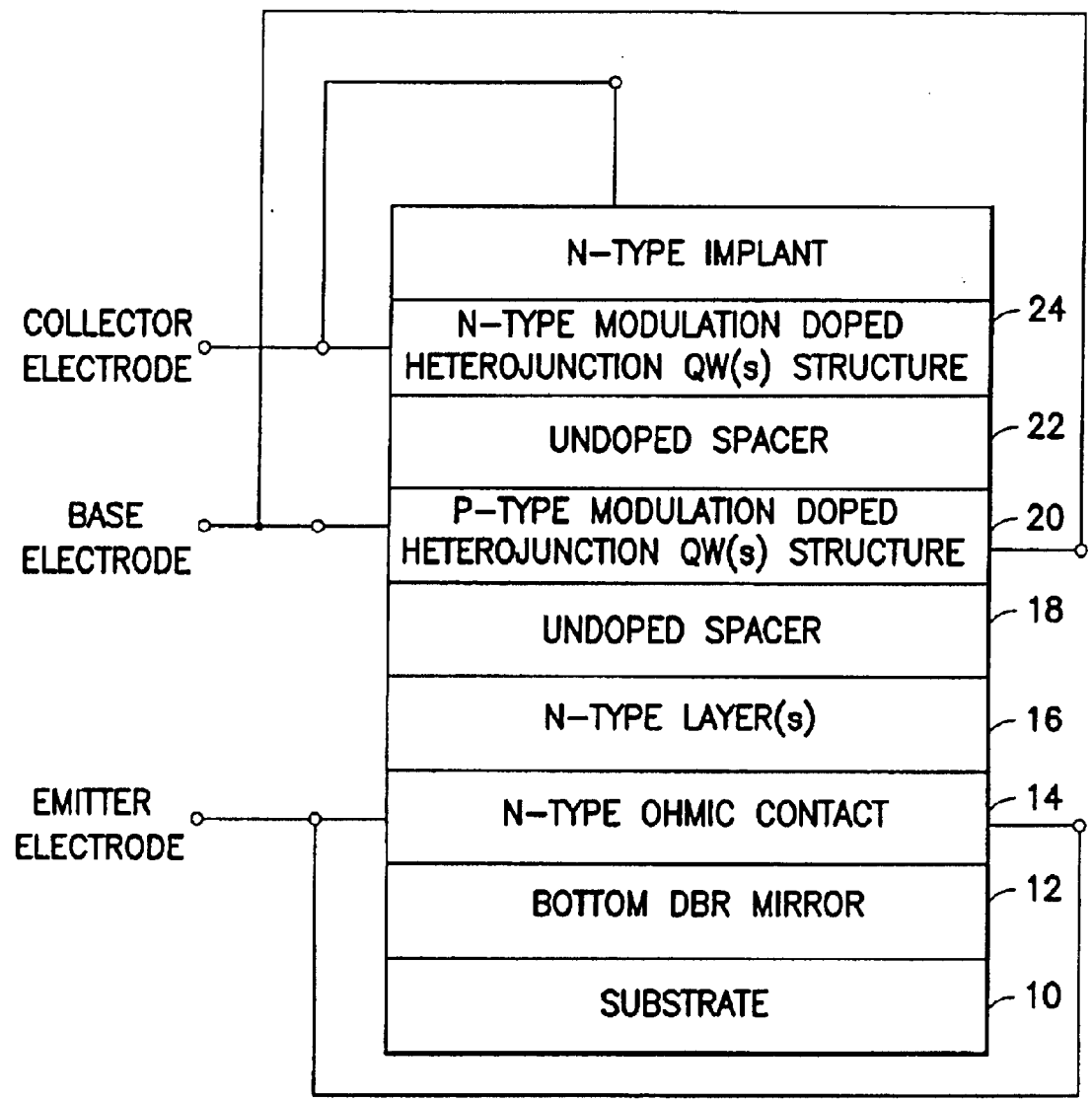
FIG. 8A is a cross-sectional schematic view showing the generalized construction of an exemplary p-type quantum-well-base bipolar transistor device formed from the layer structure of FIG. 2A.

The devices 302, 322, and 324 of FIG. 6A and 7A are preferably formed on a common substrate from the same multilayer structure, such as the multilayer structures described above with respect to FIGS. 2A and 3A. In such a configuration, a plurality of transistors (such as n-type heterojunction bipolar transistors, p-type heterojunction bipolar transistors, n-channel heterojunction FET transistors, and/or p-channel heterojunction FET transistors) may be used to build the amplifier device 324. A pictorial illustration of an exemplary p-type quantum-well-base bipolar transistor 802 formed from the multilayer structure of FIG. 2A is shown in FIG. 8A. The p-type quantum-well-base bipolar transistor 802 includes a base electrode (B) electrically coupled to the p-type QW structure 20 (preferably via spaced apart P-type implants as described above for the heterojunction thyristor device). An emitter electrode (E) is contacted (preferably via etching down to the ohmic contact layer as described above for the heterojunction thyristor device) to the n-type ohmic contact layer 14. A collector electrode (C) is electrically coupled to an n-type implant, which is electrically coupled to the n-type QW structure 24.

Figure 8B:
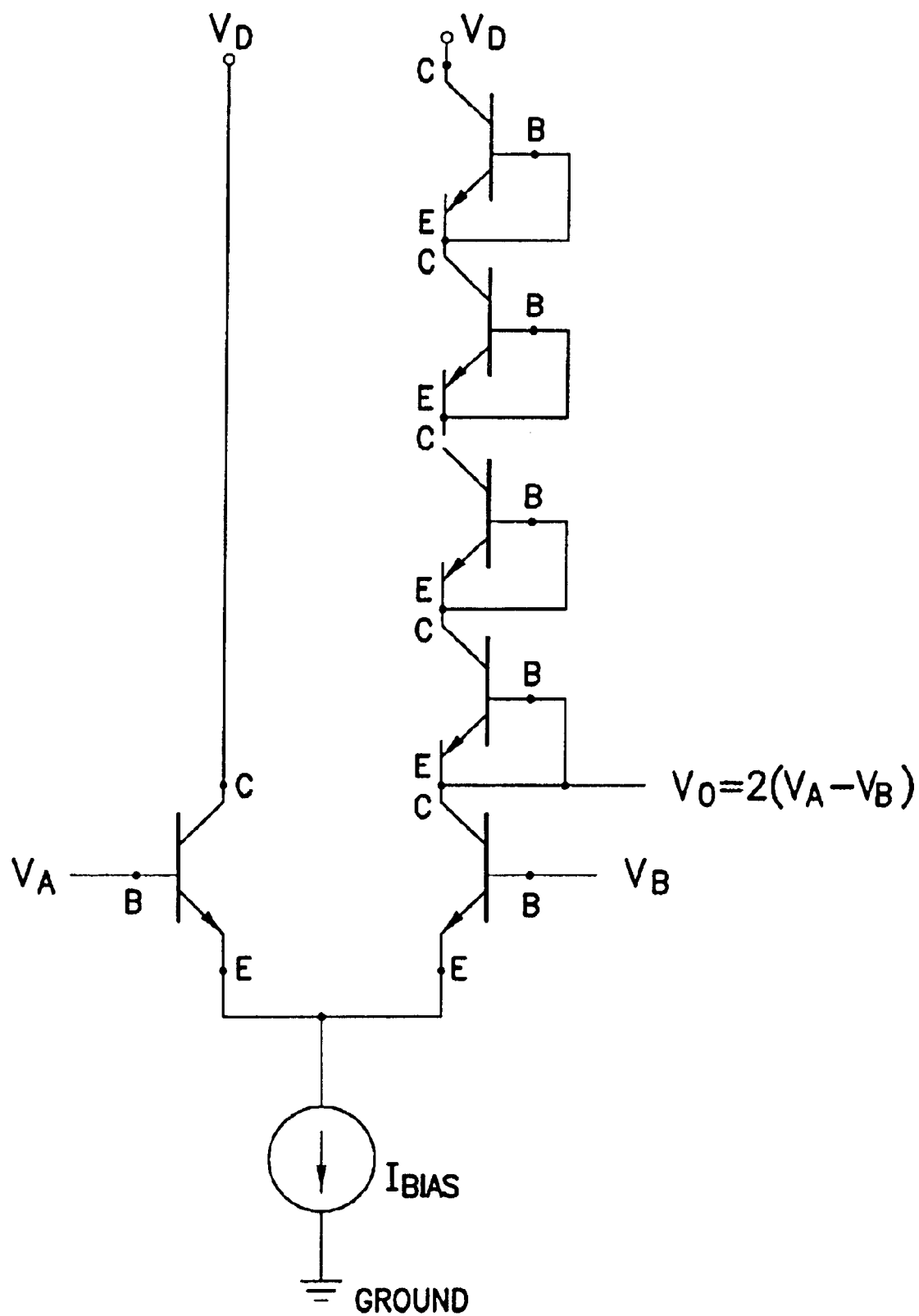
FIG. 8B is a diagram illustrating a differential amplifier circuit having a gain factor of 2, which is realized with a plurality of p-type quantum-well-base bipolar transistor devices as shown in FIG. 8A; this configuration is suitable for the feedback amplifier in the summing network of FIGS. 6A and 7A.

A plurality of such p-type quantum-well-base bipolar transistor devices 802 can be configured to form a differential amplifier stage with a gain factor of 2 as shown in FIG. 8B, which is suitable for use as the amplifier circuit 324 in the illustrative embodiment of FIG. 6A and FIG. 7A. The differential amplifier stage of FIG. 8B includes an emitter-coupled pair of p-type quantum-well-base bipolar transistors whose emitter terminals are coupled to ground through a bias current source as shown. The input nodes (labeled $V_A$ and $V_B$) are coupled to the base electrodes of this pair of p-type quantum-well-base bipolar transistor as shown. The collector electrode of the p-type quantum-well-base bipolar transistor for the input node $V_A$ is coupled directly to the positive power supply $V_D$. The collector electrode of the p-type quantum-well-base bipolar transistor for the input node $V_B$ is coupled to the positive power supply $V_D$ through four (4) base-emitter coupled p-type quantum-well-base bipolar transistor devices. The collector terminal of the p-type quantum-well-base bipolar transistor for the input node $V_B$ is coupled to the output node (labeled $V_o$). Such a configuration provides a gain factor of 2 to produce a voltage signal at the output node of $2*(V_A-V_B)$.

Figure 9A:
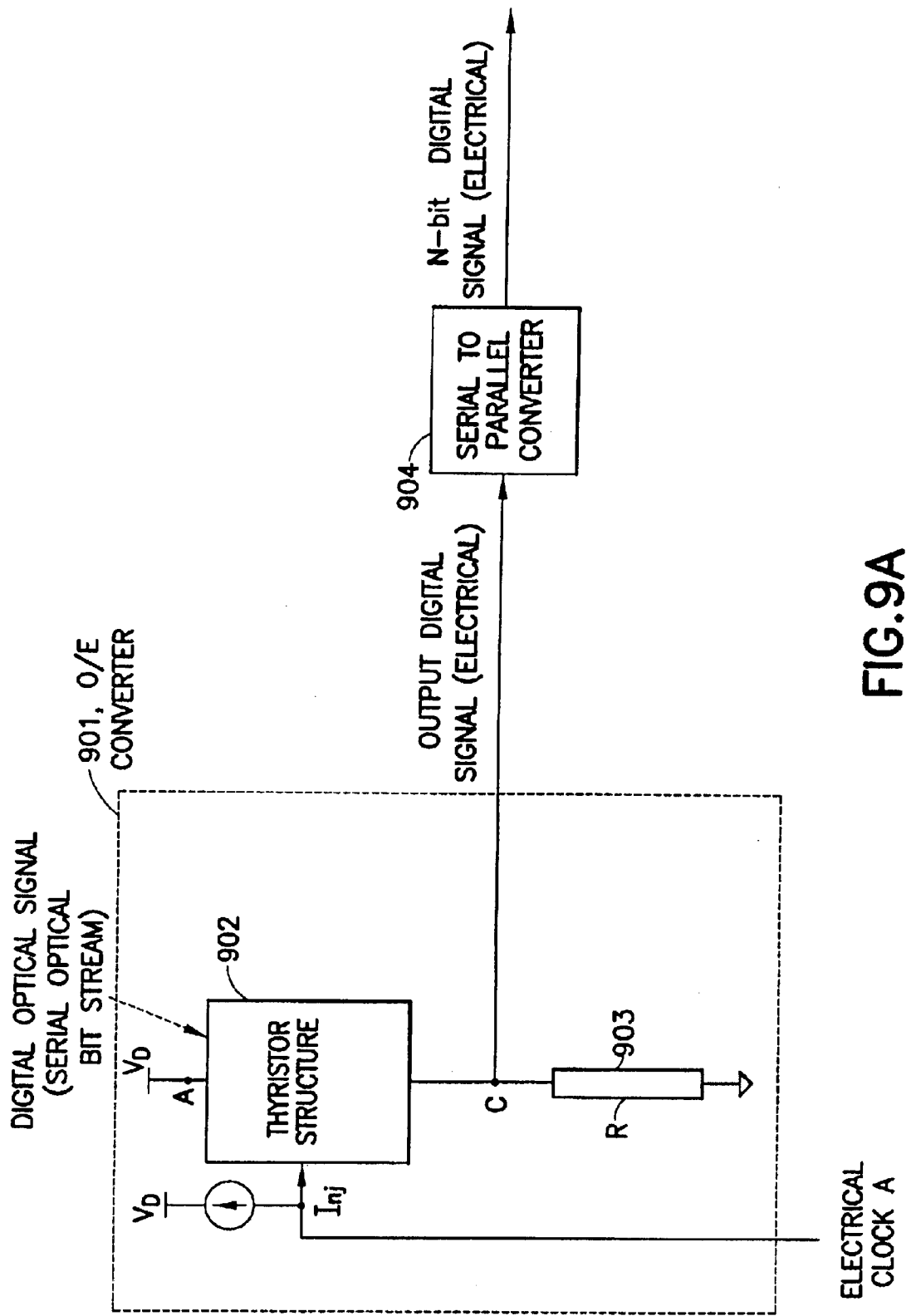
FIG. 9A is a functional block diagram illustrating an optical-to-electrical converter that converts a digital optical signal (e.g., serial optical bit stream) to a digital electrical signal; in this configuration, electrical clock signals are used to perform the conversion operations.

In another aspect of the present invention, the heterojunction device configured for digital-optical-to-digitalelectrical conversion as described above with respect to FIGS. 2A through 2D4 can be used to realize an optical-to-digital converter as shown in FIGS. 9A through and 9D(ii).

In the configuration of FIG. 9A, the heterojunction thyristor device 901 is supplied a serial optical bit stream as shown in FIG. 9B(i). During sampling periods defined by sampling clock pulses in the electrical clock A signal as shown in FIG. 9B(ii), the heterojunction thyristor device 902 converts the serial optical bit stream (input digital optical signal) supplied thereto to a corresponding digital electrical bit stream (output digital electrical signal) as described above with respect to FIGS. 2A, 2B1, 2C, and 2D1. Optionally, a serial-to-parallel converter 904 may be provided to convert the serial digital bit stream into an n-bit digital word as shown.

Figure 9C:
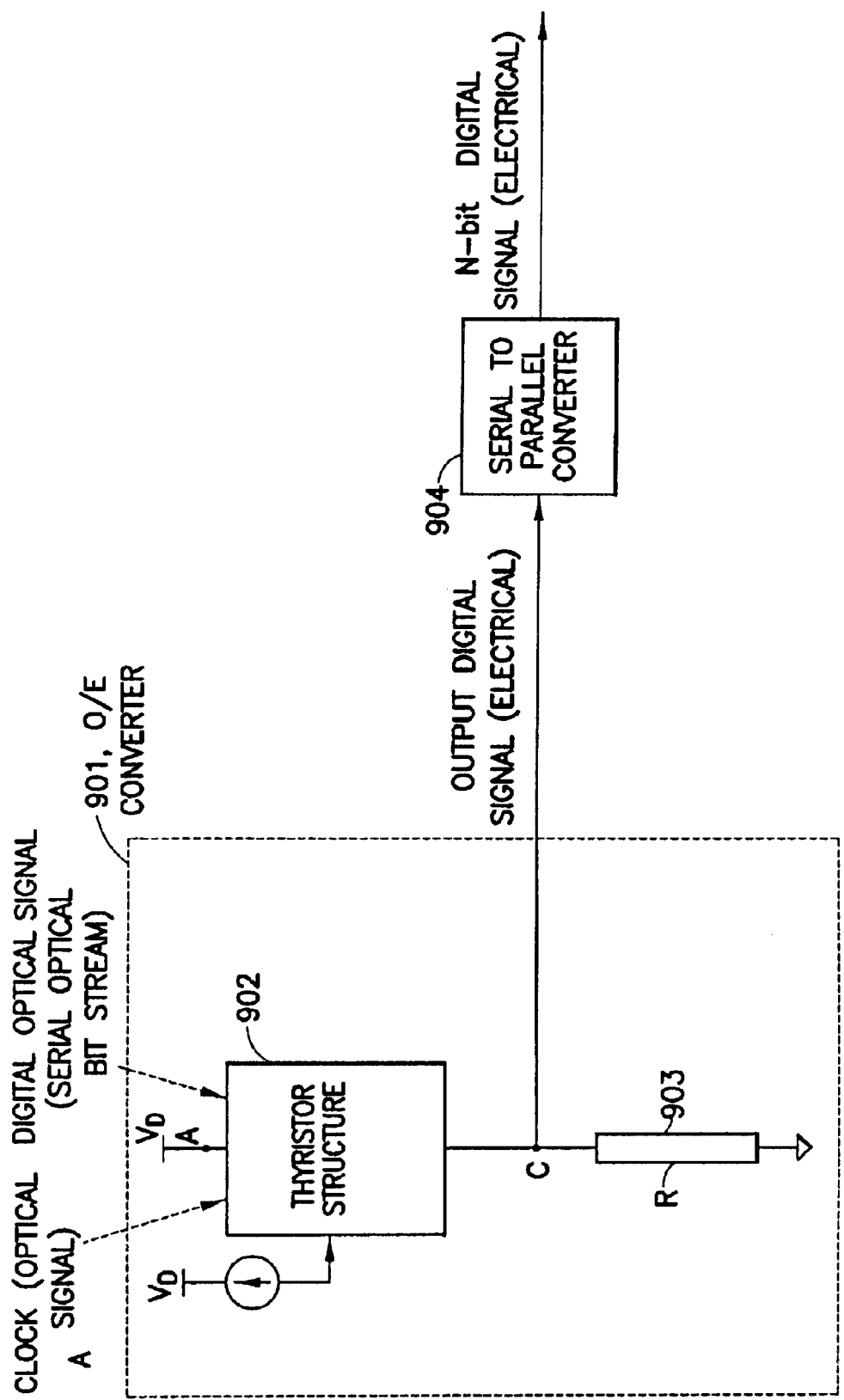
FIG. 9C is a functional block diagram illustrating an optical-to-electrical converter that converts a digital optical signal (e.g., serial optical bit stream) to a digital electrical signal; in this configuration, optical clock signals are used to perform the conversion operations.

In the configuration of FIG. 9C, the heterojunction thyristor device 901 is supplied with a serial optical bit stream as shown in FIG. 9D(i). During sampling periods defined by sampling clock pulses in the optical clock signal A as shown in FIG. 9D(ii), the heterojunction thyristor device 902 converts the serial optical bit stream (input digital optical signal) supplied thereto to a corresponding digital electrical bit stream (output digital electrical signal) as described above with respect to FIGS. 2A, 2B2, 2C and 2D2. Optionally, a serial-to-parallel converter 904 may be provided to convert the serial digital bit stream into an n-bit digital word as shown.

Figure 9E:
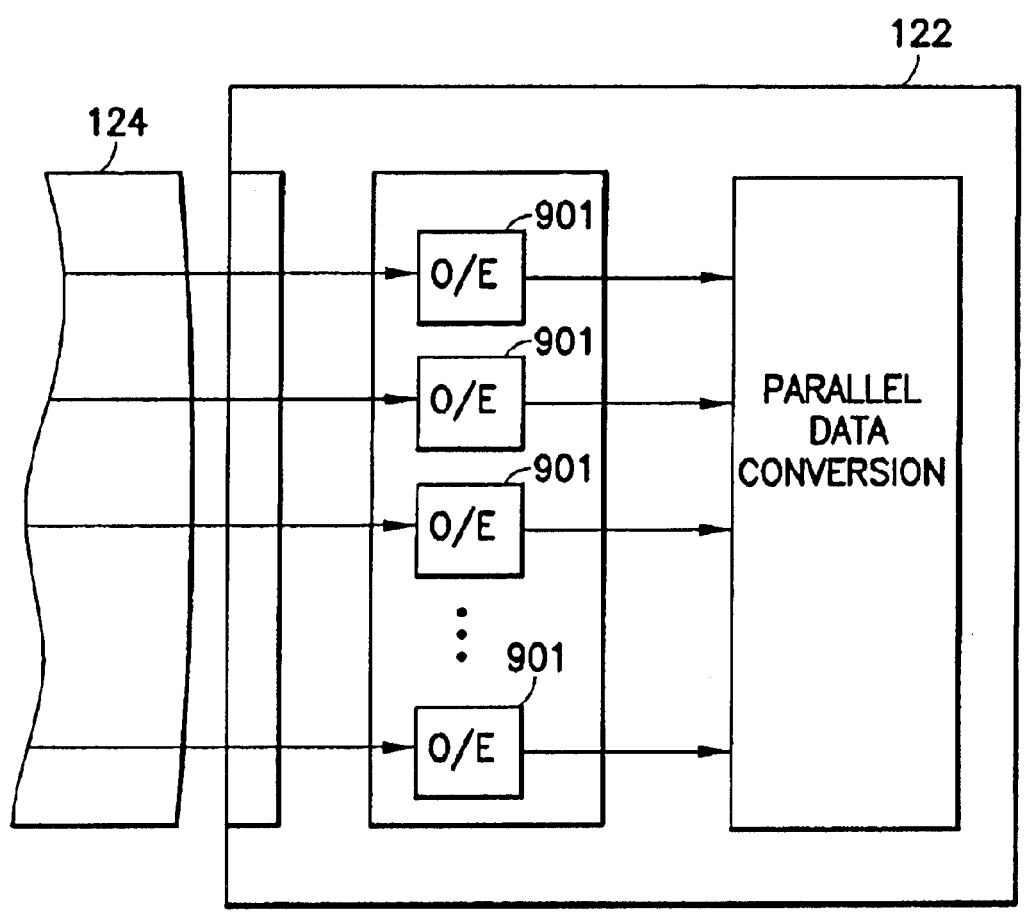
FIG. 9E is a functional block diagram of a receive module of a parallel data link, the receive module employing a plurality of the optical-to-electrical converters of FIG. 9A (or FIG. 9C) to convert a plurality of synchronous optical bit streams to corresponding digital electrical signals.

In another aspect of the present invention, the heterojunction device configured for digital-optical-to-digital-electrical conversion as described above with respect to FIGS. 2A through 2D2 can be used to realize a receive module 122 in a parallel optical data link as shown in FIG. 9E. A parallel optical data link consists of a transmit module 120 coupled to a receive module 122 with a multi-fiber connector 124 as shown in FIG. 1B. The transmit module typically employs an array 126 of vertical-cavity-surface-emitting lasers (VCSELs) and a multi-channel laser driver integrated circuit 128 for driving the array of lasers to produced a plurality of synchronous optical bit streams that are transmitted over the multi-fiber connector 124. According to the present invention, the receive module 122 includes an array of digital-optical-to-digital-electrical converters 901 as described above with respect to FIGS. 9A through 9D(iii). These devices are adapted to receive the synchronous optical bit streams and convert them into electrical form to produce a plurality of electrical bit streams corresponding thereto. The plurality of electrical bit streams are provided to one or more integrated circuits 134 that map parallel bits encoded in the plurality of electrical bit streams into a predetermined data format (such as a SONET frame).

Advantageously, many of the components of the optoelectronic circuits that perform signal conversion and signal sampling as described herein are capable of being formed from the same multilayer structure, which enables monolithic integration and significant cost improvements.

There have been described and illustrated herein several embodiments of optoelectronic circuits that perform signal conversion and signal sampling operations. While particular embodiments of the invention have been described, it is not intended that the invention be limited thereto, as it is intended that the invention be as broad in scope as the art will allow and that the specification be read likewise. Thus, while particular multi-layer structures and devices formed therefrom have been disclosed, it will be appreciated that other multi-layer structures and devices formed therefrom can be used. Moreover, while particular heterojunction-thyristor configurations have been disclosed, it will be appreciated that other configurations could be used as well. It will therefore be appreciated by those skilled in the art that yet other modifications could be made to the provided invention without deviating from its spirit and scope as claimed.

What is claimed is:

1. An optoelectronic circuit comprising:
   a) a substrate;
   b) a resonant cavity that is formed on said substrate and into which is injected an input optical signal; and
   c) a heterojunction thyristor device, formed in said resonant cavity, that includes
      i) an anode terminal and a cathode terminal;
      ii) first and second channel regions disposed between said anode terminal and said cathode terminal, and
      iii) an electrical input terminal and an electrical output terminal coupled to opposite ends of said first channel region,
   wherein, in response to a light intensity level of said input optical signal corresponding to a predetermined ON condition, sufficient charge is generate in said second channel region to cause said heterojunction thyristor device to operate in an ON state whereby current flows between said anode terminal and said cathode terminal and said electrical input terminal is electrically coupled to said electrical output terminal, and
   in response to a light intensity level of said input optical signal corresponding to a predetermined OFF condition, said heterojunction thyristor device operates in an OFF state whereby current does not flow between said anode terminal and said cathode terminal and said electrical input terminal is electrically isolated from said electrical output terminal.

2. An optoelectronic circuit according to claim 1, wherein:
said input optical signal includes an optical clock signal comprising optical clock pulses that define sampling periods corresponding to bits of information.

3. An optoelectronic circuit according to claim 2, further comprising:
a current source operably coupled to said second channel region that draws charge from said second channel region such that, upon termination of each given optical clock pulse, charge in said channel region is decreased below a holding charge such that said heterojunction thyristor device operates in said OFF state.

4. An optoelectronic circuit according to claim 1, wherein:
said input optical signal includes an input digital optical signal that encodes bits of information, each bit representing an OFF logic level or an ON logic level.

5. An optoelectronic circuit according to claim 4, wherein:
said input optical signal further includes an optical clock signal comprising optical clock pulses that define sampling periods corresponding to said bit of information.

6. An optoelectronic circuit according to claim 5, further comprising:
a current source operably coupled to said second channel region that draws charge from said second channel region such that a given optical clock pulse alone induces a charge in said second channel region below a holding charge such that said heterojunction thyristor device operates in said OFF state.

7. An optoelectronic circuit according to claim 4, wherein:
an electrical clock signal is injected into said second channel region, said electrical clock signal comprising electrical clock pulses that define sampling periods corresponding to said bits of information.

8. An optoelectronic circuit according to claim 7, wherein:
said electrical clock signal contributes to said charge generated in said second channel region.

9. An optoelectronic circuit according to claim 7, further comprising:
a current source operably coupled to said second channel region that draws charge from said second channel region such that a given electrical clock pulse alone induces a charge in said second channel region below a holding charge such that said heterojunction thyristor device operates in said OFF state.

10. An optoelectronic circuit according to claim 1, wherein:
said heterojunction thyristor device is formed from a multilayer structure of group III–V materials.

11. An optoelectronic circuit according to claim 1, wherein:
said heterojunction thyristor device is formed from a multilayer structure of strained silicon materials.

12. An optoelectronic circuit according to claim 1, wherein:
said heterojunction thyristor device further comprises a p-channel FET transistor formed on said substrate and an n-channel FET transistor formed atop said p-channel FET transistor.

13. An optoelectronic circuit according to claim 12, wherein:
wherein said p-channel FET transistor comprises a modulation dope p-type quantum well structure, and wherein said n-channel FET transistor comprises a modulation doped n-type quantum well structure.

14. An optoelectronic circuit according to claim 13, wherein:
said first channel region comprises at least one p-type quantum well of said modulation doped p-type quantum well structure, and said second channel region comprises at least one n-type quantum well of said modulation doped n-type quantum well structure.

15. An optoelectronic circuit according to claim 13, wherein:
said first channel region comprises at least one n-type quantum well of said modulation doped n-type quantum well structure, and said second channel region comprises at least one p-type quantum well of said modulation doped p-type quantum well structure.

16. An optoelectronic circuit according to claim 13, wherein:
said p-channel FET transistor includes a bottom active layer operably coupled to said cathode terminal, and
said n-channel FET transistor includes a top active layer operably coupled to said anode terminal.

17. An optoelectronic circuit according to claim 16, wherein:
said heterojunction thyristor device further comprises an ohmic contact layer, a metal layer for said anode terminal that is formed on said ohmic contact layer, and a plurality of p-type layers formed between said ohmic contact layer and said modulation doped n-type quantum well structure.

18. An optoelectronic circuit according to claim 1, further comprising:
output circuitry, operably coupled to said electrical output terminal, that operates to hold an electrical signal derived from output of said electrical output terminal.

19. An optoelectronic circuit according to claim 18, wherein:
said output circuitry outputs said electrical signal upon activation by an optical clock signal that includes optical clock pulses that occur subsequent to optic clock pulses supplied to said heterojunction thyristor device.

20. An optoelectronic circuit according to claim 19, wherein:
said output circuitry is realized with another heterojunction thyristor device.

21. An optoelectronic circuit comprising:
a) a substrate;
b) a resonant cavity that is formed on said substrate;
c) a heterojunction thyristor device, formed in said resonant cavity, that includes
  i) an anode terminal and a cathode terminal;
  ii) first and second channel regions disposed between said anode terminal and said cathode terminal, and
  iii) an electrical input terminal and an electrical output terminal coupled to opposite ends of said first channel region,
d) means for supplying an electrical control signal to said second channel region;
  wherein, in response to said electrical control signal corresponding to a predetermined ON condition, charge is stored in said second channel region to cause said heterojunction thyristor device to operate in an ON state whereby current flows between said anode terminal and said cathode terminal and said electrical input terminal is electrically coupled to said electrical output terminal, and
  in response to said electrical control signal corresponding to a predetermined OFF condition, said heterojunction thyristor device operates in an OFF state whereby current does not flow between said anode terminal and said cathode terminal and said electrical input terminal is electrically isolated from said electrical output terminal.

22. An optoelectronic circuit according to claim 21, further comprising:
output circuitry, operably coupled to said electrical output terminal, that operates to hold an electrical signal derived from output of said electrical output terminal.

23. An optoelectronic circuit according to claim 22, wherein:
said output circuitry outputs said electrical signal upon activation by an electrical clock signal that includes electrical clock pulses that occur subsequent to electrical clock pulses supplied to said heterojunction thyristor device.

24. An optoelectronic circuit according to claim 23, wherein:
said output circuitry is realized with another heterojunction thyristor device.

* * * * *